US012604623B2

(12) United States Patent
Wang et al.

(10) Patent No.: US 12,604,623 B2
(45) Date of Patent: Apr. 14, 2026

(54) DISPLAY PANEL AND DISPLAY DEVICE

(71) Applicants:Chengdu BOE Optoelectronics Technology Co., Ltd., Sichuan (CN); BOE Technology Group Co., Ltd., Beijing (CN)

(72) Inventors: Rong Wang, Beijing (CN); Fan He, Beijing (CN); Hongwei Ma, Beijing (CN); Xiangdan Dong, Beijing (CN); Cong Fan, Beijing (CN); Zhenhua Zhang, Beijing (CN)

(73) Assignees: CHENGDU BOE OPTOELECTRONICS TECHNOLOGY CO., LTD, Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 301 days.

(21) Appl. No.: 18/032,580

(22) PCT Filed: Jun. 8, 2022

(86) PCT No.: PCT/CN2022/097588
§ 371 (c)(1),
(2) Date: Apr. 19, 2023

(87) PCT Pub. No.: WO2023/236095
PCT Pub. Date: Dec. 14, 2023

(65) Prior Publication Data
US 2024/0381707 A1 Nov. 14, 2024

(51) Int. Cl.
*H10K 59/131* (2023.01)

(52) U.S. Cl.
CPC ................................. *H10K 59/131* (2023.02)

(58) Field of Classification Search
CPC ............................ H10K 59/131; H10D 86/00
See application file for complete search history.

(56) References Cited

U.S. PATENT DOCUMENTS

| | | | |
|---|---|---|---|
| 12,283,245 B2 * | 4/2025 | Shang | H10K 59/82 |
| 2021/0296424 A1 * | 9/2021 | Cho | H10K 59/131 |
| 2024/0215374 A1 * | 6/2024 | Lee | H10K 59/124 |

FOREIGN PATENT DOCUMENTS

| | | |
|---|---|---|
| CN | 112310125 A | 2/2021 |
| CN | 112420790 A | 2/2021 |
| CN | 112567528 A | 3/2021 |
| CN | 109949711 B | 8/2021 |
| CN | 113539108 A | 10/2021 |
| CN | 113964138 A | 1/2022 |
| CN | 113964142 A | 1/2022 |
| CN | 112310125 B | 8/2022 |

(Continued)

OTHER PUBLICATIONS

Written Opinion mailed on Nov. 30, 2022, in corresponding PCT/CN2022/097588, 4 pages.

*Primary Examiner* — Mohammed Shamsuzzaman
(74) *Attorney, Agent, or Firm* — XSENSUS LLP

(57) ABSTRACT
The present disclosure provides a display panel and a display device. First interconnect lines of the display panel are connected to second data lines corresponding to first sub-pixels and third sub-pixels, and second interconnect sections of all the first interconnect lines are arranged in the same layer as a first source-drain metal layer or a second source-drain metal layer.

19 Claims, 25 Drawing Sheets

(56) References Cited

FOREIGN PATENT DOCUMENTS

| | | | | | |
|----|----|----|----|----|----|
| EP | 3832728 | A1 | | 6/2021 | |
| IN | 114497151 | A | | 5/2022 | |
| KR | 20160090971 | A | * | 8/2016 | ............. G01R 31/50 |
| KR | 101932993 | B1 | * | 12/2018 | ........... H10H 20/813 |
| WO | 2022/089071 | A1 | | 5/2022 | |

* cited by examiner

DISPLAY PANEL AND DISPLAY DEVICE

CROSS-REFERENCE TO RELATED APPLICATION

The present application is based on PCT filing PCT/CN2022/097588, filed Jun. 8, 2022, the entire contents of which are incorporated herein by reference.

TECHNICAL FIELD

The present disclosure relates to the display technical field, and in particular, to a display panel and a display device.

BACKGROUND

Organic Light-emitting Diode (OLED) display panels have advantages of self-illumination, wide color gamut, high contrast, flexibility, high response and flexibility, etc., and thus have broad application prospects.

Currently, OLED display panels have increasingly high requirements for ultra-narrow lower bezel. In order to reduce the width of the lower bezel, it is considered to introduce data lines located in a peripheral area into a display area to reduce the width of the lower bezel, but this will lead to poor display uniformity of the display panels.

It should be noted that the information disclosed in the background section above is only used to enhance the understanding of the background of the present disclosure, and therefore may include information that does not constitute the prior art known to those skilled in the art.

SUMMARY

The present disclosure provides a display panel and a display device.

According to an aspect of the present disclosure, there is provided a display panel. The display panel includes a display area and a peripheral area at least partially surrounding the display area. Along a first direction, the display area of the display panel includes a first display area and second display areas on both sides of the first display area. The display panel includes: a base substrate, a driving circuit layer, a pixel layer, a plurality of pads, a plurality of data lines and a plurality of interconnect lines. The driving circuit layer includes a first source-drain metal layer and a second source-drain metal layer. The first source-drain metal layer is arranged on a side of the base substrate, and the second source-drain metal layer is arranged on a side of the first source-drain metal layer away from the base substrate. The pixel layer includes a plurality of pixel groups. The pixel groups include first sub-pixels, second sub-pixels and third sub-pixels with different colors. The plurality of pads are located in the peripheral area. The plurality of data lines are respectively electrically connected to a plurality of the first sub-pixels, a plurality of the second sub-pixels and a plurality of the third sub-pixels. The plurality of data lines are located in the display area and extend along a second direction, the plurality of data lines includes a plurality of first data lines located in the first display area and a plurality of second data lines located in the second display areas, and the plurality of first data line are electrically connected to the plurality of pads. The plurality of interconnect lines are located in the display area and electrically connected to the plurality of second data lines and the plurality of pads. The plurality of interconnect lines includes a plurality of first interconnect lines and a plurality of second interconnect lines, the first interconnect lines are connected to second data lines corresponding to the first sub-pixels and the third sub-pixels, and the second interconnect lines are connected to second data lines corresponding to the second sub-pixels. Each of the interconnect lines includes a first interconnect section extending along a first direction and a second interconnect section extending along the second direction and, the first direction and the second direction intersect. At least one second interconnect section is arranged between two adjacent first data lines, second interconnect sections of all the first interconnect lines are arranged in a same layer as the first source-drain metal layer or the second source-drain metal layer, and at least a part of second interconnect sections of the second interconnect lines are arranged in a same layer as the first source-drain layer or the second source-drain layer.

According to an implementation of the present disclosure, the second interconnect sections of all the first interconnect lines are arranged in the same layer as the first source-drain metal layer, and the second interconnect sections of all the second interconnect lines are arranged in the same layer as the first source-drain metal layer.

According to an implementation of the present disclosure, the second interconnect sections of all the first interconnect lines are arranged in the same layer as the second source-drain metal layer, and the second interconnect sections of all the second interconnect lines are arranged in the same layer as the second source-drain metal layer.

According to an implementation of the present disclosure, the second interconnect sections of all the first interconnect lines are arranged in the same layer as the second source-drain metal layer, and the second interconnect sections of all the second interconnect lines are arranged in the same layer as the first source-drain metal layer.

According to an implementation of the present disclosure, the second interconnect sections of all the first interconnect lines are arranged in the same layer as the second source-drain metal layer, a part of second interconnect sections of the second interconnect lines are arranged in the same layer as the first source-drain metal layer, and another part of second interconnect sections of the second interconnect lines are arranged in the same layer as the second source-drain metal layer.

According to an implementation of the present disclosure, the second interconnect sections of the second interconnect lines are alternately distributed in the first source-drain metal layer and the second source-drain metal layer.

According to an implementation of the present disclosure, second interconnect sections of two second interconnect lines arranged symmetrically with respect to a central axis extending along the second direction are arranged in the same layer.

According to an implementation of the present disclosure, a plurality of adjacent first data lines are arranged as a plurality of first data line groups, a plurality of adjacent interconnect lines are arranged as a plurality of interconnect line groups, second interconnect sections of a plurality of adjacent interconnect lines form second interconnect section groups, and in at least part of the first display area, the first data line groups and the second interconnect section groups are alternately arranged one by one.

According to an implementation of the present disclosure, each of the second interconnect section groups includes a second interconnect section of at least one first interconnect line and a second interconnect section of at least one second interconnect line, and the second interconnect section of the first interconnect line and the second interconnect section of the second interconnect line are arranged alternately.

According to an implementation of the present disclosure, each of the second interconnect section groups includes a second interconnect section of at least one first interconnect line and second interconnect sections of at least two second interconnect lines, second interconnect sections of all the first interconnect lines are arranged in the same layer as the second source-drain metal layer, and a second interconnect section of at least one second interconnect line is arranged in the same layer as the first source-drain metal layer, a second interconnect section of at least one second interconnect line is arranged in the same layer as the second source-drain metal layer, the first sub-pixels are red sub-pixel pixels, the second sub-pixels are green sub-pixels, and the third sub-pixels are blue sub-pixels.

According to an implementation of the present disclosure, the display area is arranged symmetrically with respect to a central axis extending along the second direction; in two adjacent second data lines, a second interconnect section corresponding to one of the two adjacent second data lines which is away from the central axis is arranged as farther away from the central axis as compared with a second interconnect section corresponding to the other one of the two adjacent second data lines which is close to the central axis.

According to an implementation of the present disclosure, the display area is arranged symmetrically with respect to a central axis extending along the second direction; in two adjacent second data lines, a first interconnect section corresponding to one of the two adjacent second data lines which is away from the central axis is arranged as closer to a corresponding pad as compared with a first interconnect section corresponding to the other one of the two adjacent second data lines which is close to the central axis.

According to an implementation of the present disclosure, a plurality of first data lines located in the first display area are arranged in the first source-drain metal layer or the second source-drain metal layer.

According to an implementation of the present disclosure, the driving circuit layer further includes a transistor layer, the transistor layer is arranged between the base substrate and the first source-drain metal layer, the transistor layer is provided with driving circuits, and the driving circuits include thin film transistors, and the interconnect lines do not overlap with the thin film transistors.

According to an implementation of the present disclosure, the driving circuit layer includes driving circuit islands distributed in an array, and any one of the driving circuit islands includes one or more driving circuit areas corresponding to the driving circuits one to one, at least part of thin film transistors of a driving circuits are arranged in a corresponding driving circuit area, and each of the interconnect lines is arranged in a gap between the driving circuit islands.

According to an implementation of the present disclosure, the second interconnect sections are arranged as a plurality of second interconnect section groups; in any one of the second interconnect section groups, the second interconnect sections are arranged adjacently in sequence and are located between two adjacent driving circuit island columns; and any two adjacent second interconnect section groups are isolated by a driving circuit island column.

According to an implementation of the present disclosure, the transistor layer has a gate layer, the driving circuit layer further includes an electrode initialization voltage line extending along the first direction, and the electrode initialization voltage line extends along the first direction, the electrode initialization voltage lines includes a first initialization line and a second initialization line alternately connected, the first initialization line is arranged in the gate layer, and the second initialization line is arranged in the first source-drain metal layer, a part of the second interconnect sections are arranged in the first source-drain metal layer, and second interconnect sections located in the first source-drain metal layer overlap with the first initialization line.

According to an implementation of the present disclosure, all of the first interconnect sections are arranged in the same layer as the first source-drain metal layer or the gate layer, at least part of the second interconnect sections are arranged in the same layer as the second source-drain metal layer, the second interconnect sections located in the second source-drain metal layer are connected to corresponding first interconnect sections through interconnectors, and a portion of one of the first data lines adjacent to a corresponding interconnector is bent away from the interconnector to form an avoidance section, and the avoidance section overlaps a corresponding first interconnect section.

According to another aspect of the present disclosure, there is provided a display device, including the display panel according to any one of the above aspects.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the specification, illustrate embodiments consistent with the disclosure and together with the description serve to explain the principles of the disclosure. Apparently, the drawings in the following description are only some embodiments of the present disclosure, and those skilled in the art can obtain other drawings according to these drawings without creative efforts.

DETAILED DESCRIPTION

Figure 1:
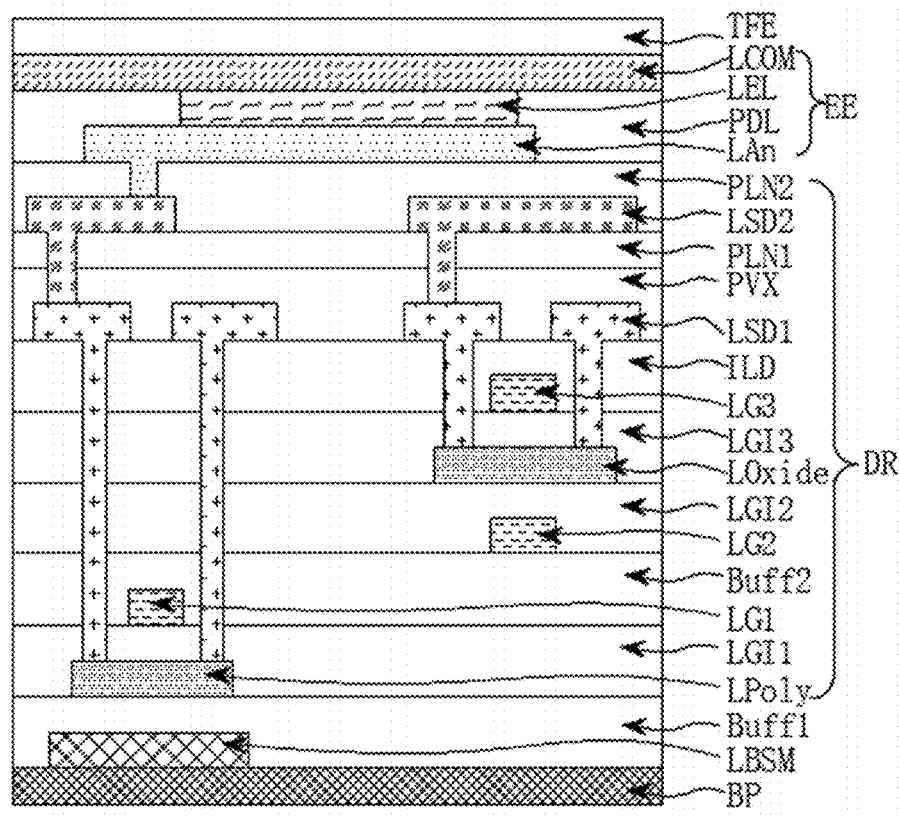
FIG. 1 is a schematic diagram of a film layer structure of a display panel in an implementation of the present disclosure.

Example implementations will now be described more fully with reference to the accompanying drawings. However, the example implementations can be implemented in various forms and should not be construed as limited to the implementations set forth herein; rather, providing these implementations makes the present disclosure more comprehensive and complete, and conveys the concepts of the example implementations comprehensively to those skilled in the art. The same reference numerals in the drawings denote the same or similar structures, and thus their repeated descriptions will be omitted. Furthermore, the drawings are merely schematic illustrations of the present disclosure and are not necessarily drawn to scale.

Although relative terms such as "upper" and "lower" are used in the specification to describe a relative relationship of one component shown in the drawings to another component, these terms are used in the specification only for convenience, and are for example based on the direction(s) as illustrated in the drawings. It will be appreciated that if the illustrated device is turned over so that it is upside down, then a component described as being "upper" will become a component that is "lower". When a structure is "on" another structure, it may mean that the structure is integrally formed on another structure, or that the structure is "directly" arranged on another structure, or that the structure is "indirectly" arranged on another structure through other structure(s).

The terms "a", "an", "the", "said" and "at least one" are used to indicate the presence of one or more elements/components/etc. The terms "includes/include" and "have/has" are used to indicate open-ended inclusion and to mean that additional elements/components/etc. may exist in addition to the listed elements/components/etc. The terms "first", "second" and "third" are used as markers only and are not quantitative restrictions on their associated objects.

With rapid developments of AMOLED, display devices have entered the era of full screen and narrow bezel. At present, data lines in a fanout area are placed in a peripheral area outside a display area. Data for driving pixel circuits in the display area is provided from the peripheral area. Placing the data lines in the peripheral area will undoubtedly increase the size of the corner of the lower bezel and the size of the lower bezel. Thus, it is considered to introduce the data lines in the fanout area into the display area. When the data lines are all placed in the display area, the lower bezel and the corner of the lower bezel can be greatly reduced, which is of great significance for the realization of a full screen and a narrow bezel.

In view of the above, the present disclosure provides a display panel. The display panel includes a display area and a peripheral area at least partially surrounding the display area. Along a first direction, the display area AA of the display panel includes a first display area AA1 and second display areas AA2 located on both sides of the first display area AA1.

The display panel includes a base substrate, a driving circuit layer, a pixel layer, a plurality of pads, a plurality of data lines DL and a plurality of interconnect lines TR. The driving circuit layer includes a first source-drain metal layer LSD1 and a second source-drain metal layer LSD2. The first source-drain metal layer LSD1 is arranged on a side of the base substrate BP, and the second source-drain metal layer LSD2 is arranged on a side of the first source-drain metal layer LSD1 away from the base substrate BP.

The pixel layer EE includes a plurality of pixel groups P. A pixel group P includes a first sub-pixel P1, at least one second sub-pixel P2 and third sub-pixel P3. The colors of the first sub-pixel P1, the second sub-pixel P2 and the third sub-pixel P3 are different from each other. The plurality of pads are located in the peripheral area. The plurality of data lines DL are respectively electrically connected to a plurality of first sub-pixels P1, a plurality of second sub-pixels P2, and a plurality of third sub-pixels P3. The plurality of data lines DL are located in the display area AA and extend along a second direction. The plurality of data lines DL include a plurality of first data lines DL1 located in the first display area AA1 and a plurality of second data lines DL located in the second display areas AA2. The plurality of first data lines DL1 are electrically connected to the plurality of pads.

A plurality of interconnect lines TR are located in the display area AA and are electrically connected to the plurality of second data lines DL2 and the plurality of pads. The plurality of interconnect lines include a plurality of first interconnect lines and a plurality of second interconnect lines. The first interconnect lines are connected to second data lines DL2 corresponding to the first sub-pixels P1 and the third sub-pixels P3, and the second interconnect lines are connected to second data lines DL2 corresponding to the second sub-pixels P2.

An interconnect line includes a first interconnect section TR1 extending along the first direction H1 and a second interconnect section TR2 extending along the second direction H. The first direction and the second direction intersect. At least one second interconnect section TR2 is arranged between two adjacent first data lines DL1. The second interconnect sections TR2 of all the first interconnect lines are arranged in the same layer as the first source-drain metal layer LSD1 or the second source-drain metal layer LSD2.

The second interconnect sections TR2 of at least a part of the second interconnect lines are arranged in the same layer as the first source-drain layer LSD1 or the second source-drain layer LSD1.

The first interconnect lines of the display panel are connected to the second data lines DL2 corresponding to the first sub-pixels P1 and the third sub-pixels P3, and the second interconnect sections TR2 of all the first interconnect lines are arranged in the same layer as the first source-drain metal layer LSD1 or the second source-drain metal layer LSD2, and the distances between the second interconnect sections TR2 of the first interconnect lines and the scan lines at the bottom which extend perpendicularly are the same, and thus the generated parasitic capacitance is the same. At different positions in the display area of the display panel, the waveform jumps of the second data lines corresponding to the first sub-pixels P1 and the third sub-pixels P3 have the same influence on the parasitic capacitance, so that the brightness changes at different positions in the display area of the display panel are the same, and accordingly the display uniformity of the display panel is relatively good.

Referring to FIG. 1, in the thickness direction of the display panel, the display panel includes a base substrate BP, a driving circuit layer DR and a pixel layer EE stacked in sequence. The pixel layer EE is provided with a plurality of pixel groups distributed in an array. The pixel groups include first sub-pixels, second sub-pixels and third sub-pixels with different colors. The driving circuit layer DR is provided with driving circuits corresponding to the sub-pixels one by one. Each sub-pixels realizes display under the driving of a corresponding driving circuit.

In the driving circuit layer, the display panel may be provided with scan lines extending along the first direction (generally as the row direction) and data lines DL extending along the second direction (generally as the column direction). The display panel may realize progressive scanning to display images. Correspondingly, respective driving circuits may be arranged into driving circuit rows extending along the first direction and driving circuit columns extending along the second direction. The first direction intersects with the second direction, for example the first direction is perpendicular to the second direction.

The base substrate may be a base substrate of inorganic material, or a base substrate of organic material. For example, in one implementation of the present disclosure, the material of the base substrate may be a glass material such as soda-lime glass, quartz glass, sapphire glass, or a metal material such as stainless steel, aluminum, nickel, etc. In another implementation of the present disclosure, the material of the base substrate may be Polymethyl methacrylate (PMMA), Polyvinyl alcohol (PVA), Polyvinyl phenol (PVP), Polyether sulfone (PES), polyimide, polyamide, polyacetal, Polycarbonate (PC), Polyethylene terephthalate (PET), Polyethylene naphthalate (PEN) or a combination thereof. In another implementation of the present disclosure, the base substrate may also be a flexible base substrate, for example, the material of the base substrate may be polyimide (PI). The base substrate may also be a composite of multiple layers of materials. For example, in one implementation of the present disclosure, the base substrate can include a bottom film, a pressure-sensitive adhesive layer, a first a polyimide layer and a second polyimide layer which are stacked in sequence.

In implementations of the present disclosure, the driving circuit layer is provided with driving circuits for driving sub-pixels. In the driving circuit layer, any driving circuit may include a transistor and a storage capacitor. Further, the transistor may be a thin film transistor. The thin film transistor may be selected from a top gate thin film transistor, a bottom gate thin film transistor or a double gate thin film transistor. The material of the active layer of the thin film transistor may be amorphous silicon semiconductor material, low-temperature polysilicon semiconductor material, metal oxide semiconductor material, organic semiconductor material or other types of semiconductor materials. The thin film transistors may be a N-type thin film transistor or a P-type thin film transistor.

It can be understood that among the respective transistors in the driving circuits, the types of any two transistors may be the same or different. Exemplarily, in an implementation, in a driving circuit, some transistors may be N-type transistors and some transistors may be P-type transistors. As another example, in another implementation of the present disclosure, in a driving circuit, the material of the active layers of some transistors may be low-temperature polysilicon semiconductor material, and the material of the active layers of some transistors may be metal oxide semiconductor material.

A transistor may have a first terminal, a second terminal and a control terminal. One of the first terminal and the second terminal may be a source of the transistor, the other one of the first terminal and the second terminal may be a drain of the transistor. The control terminal may be a gate of the transistor. It can be understood that the source and the drain of a transistor are two opposite concepts that can be interchanged; when the working state of the transistor changes, for example, the direction of the current changes, the source and the drain of the transistor can be interchanged.

In implementations of the present disclosure, the driving circuit layer may include a transistor layer, an interlayer dielectric layer ILD, and a source-drain metal layer which are sequentially stacked on the base substrate. The transistor layer is provided with an active layer and a gate of a transistor, and the source-drain metal layer is electrically connected with the source and drain of the transistor. Optionally, the transistor layer may include a semiconductor layer, a gate insulating layer, and a gate layer stacked between the base substrate BP and the interlayer dielectric layer. The positional relationship of respective film layers may be determined according to the film layer structure of the thin film transistor.

In some implementations, the semiconductor layer may be used to form the active layer of the transistor. The active layer of the semiconductor includes a channel area and source and drain electrodes on both sides of the channel area. The channel area may maintain a semiconductor characteristic, the semiconductor material of the source and drain electrodes is partially or completely conductorization. The gate layer may be used to form gate layer lines such as scan lines, may also be used to form gate electrodes of transistors, and may also be used to form part or all of electrode plates of storage capacitors. The source-drain metal layer may be used to form source-drain metal layer lines such as data lines and power lines.

For example, in some implementations of the present disclosure, the driving circuit layer may include a semiconductor layer, a gate insulating layer, a gate layer, an interlayer dielectric layer, and a source-drain metal layer which are sequentially stacked, and a thin film transistor thus formed is a top-gate thin film transistor.

As another example, in some implementations of the present disclosure, the driving circuit layer may include a gate layer, a gate insulating layer, a semiconductor layer, an interlayer dielectric layer, and a source-drain metal layer that are sequentially stacked, and a thin film transistor thus formed is a bottom-gate thin film transistor.

The gate layer may be one gate layer, or two or three gate layers. Exemplarily, in an implementation, referring to FIG. 1, the gate layer may include a first gate layer LG1, a second gate layer LG2 and a third gate layer LG3. The semiconductor layer may be one semiconductor layer, or two semiconductor layers. Exemplarily, in an implementation, referring to FIG. 1, the semiconductor layer may include a low-temperature polysilicon semiconductor layer LPoly and a metal oxide semiconductor layer LOxide. It can be understood that when the gate layer or the semiconductor layer has a multi-layer structure, the insulating layers in the transistor layer may be increased or decreased adaptively. Exemplarily, in an implementation of the present disclosure, referring to FIG. 1, the transistor layer may include a low-temperature polysilicon semiconductor layer LPoly, a first gate insulating layer LGI1, a first gate layer LG1, a second insulating buffer layer Buff2 (such as silicon nitride, silicon oxide or other inorganic layers), a second gate layer LG2, a second gate insulating layer LGI2, a metal oxide semiconductor layer LOxide, a third gate insulating layer LGI3, a third gate layer LG3 and the like which are sequentially stacked on the base substrate BP.

The source-drain metal layer may be one source-drain metal layer, or two source-drain metal layers. Exemplarily, in an implementation of the present disclosure, referring to FIG. 1, the source-drain metal layer may include a first source-drain metal layer LSD1 and a second source-drain metal layer LSD2. A passivation layer PVX and a first planarization layer PLN1 may be arranged between the first source-drain metal layer LSD1 and the second source-drain metal layer LSD2, and a second planarization layer PLN2 may be arranged between the LSD2 and the pixel layer.

Optionally, the driving circuit layer may further include a first insulating buffer layer Buff1 arranged between the base substrate BP and the semiconductor layer, and the semiconductor layer, the gate layer, and so on are located on a side of the first insulating buffer layer Buff1 away from the base substrate. The material of the first insulating buffer layer Buff1 may be an inorganic insulating material such as silicon oxide or silicon nitride. The buffer material layer may be one layer of inorganic material, or multiple layers of inorganic materials which are stacked.

Optionally, referring to FIG. 1, a light-shielding layer LBSM may also be provided between the first insulating buffer layer Buff1 and the base substrate BP. The light-shielding layer LBSM may overlap at least part of the channel area of the transistor to shield the light directed at the transistor, thereby stabilizing the electrical characteristic of the transistor.

The pixel layer is provided with light-emitting elements distributed in an array (as sub-pixels), and the light-emitting elements emit light under the control of the driving circuits. In implementations of the present disclosure, a light-emitting element may be an Organic Light-Emitting Diode (organic electroluminescent diode, OLED), a micro Light-Emitting Diode (Micro LED), a quantum dot-Organic Light-Emitting Diode (QD-OLED), a quantum dot Light-Emitting Diode (QLED) or other types of light-emitting element. Exemplarily, in one implementation of the present disclosure, the light-emitting element is an Organic Light-Emitting Diode (OLED), and the display panel is an OLED display panel. A possible structure of the pixel layer is exemplarily introduced as follows, taking the light-emitting element being an organic light-emitting diode as an example.

Optionally, referring to FIG. 1, the pixel layer may be arranged on a side of the driving circuit layer away from the base substrate, and may include a pixel electrode layer LAn, a pixel definition layer PDL, a support pillar layer (not shown in FIG. 1), an organic light-emitting functional layer LEL and a common electrode layer LCOM which are stacked sequentially. The pixel electrode layer LAn has a plurality of pixel electrodes in the display area of the display panel. The pixel definition layer has a plurality of through pixel openings corresponding to the plurality of pixel electrodes in the display area, and any one of the pixel openings exposes at least a partial area of a corresponding pixel electrode. The supporting pillar layer includes a plurality of supporting pillars in the display area, and the supporting pillars are located on a surface of the pixel definition layer away from the base substrate, so as to support a Fine Metal Mask (FMM) during the evaporation process. The organic light-emitting functional layer at least covers the pixel electrodes exposed by the pixel definition layer. The organic light-emitting functional layer may include an organic electroluminescent material layer, and may include one or more of a hole injection layer, a hole transport layer, an electron blocking layer, a hole blocking layer, an electron transport layer, and an electron injection layer. Film layers of the organic light-emitting functional layer may be prepared by an evaporation process, and a fine metal mask or an open mask may be used to define the pattern of each film layer during evaporation. The common electrode layer may cover the organic light-emitting functional layer in the display area. In this way, the pixel electrodes, the common electrode layer and the organic light-emitting functional layer located between the pixel electrodes and the common electrode layer form organic light-emitting diodes, and any one of the organic light-emitting diodes may be used as a sub-pixel of the display panel.

In some implementations, the pixel layer may further include a light extraction layer located on a side of the common electrode layer away from the base substrate, so as to enhance the light extraction efficiency of the organic light-emitting diode.

In some implementations, referring to FIG. 1, the display panel may further include a thin film encapsulation layer TFE. The thin film encapsulation layer is arranged on a surface of the pixel layer away from the base substrate, and may include alternately stacked inorganic encapsulation layer and organic encapsulation layer. The inorganic encapsulation layer may effectively block moisture and oxygen from the outside, and prevent material degradation caused by water and oxygen intrusion into the organic light-emitting functional layer. Optionally, the edge of the inorganic encapsulation layer may be located in the peripheral area. The organic encapsulation layer is located between two adjacent inorganic encapsulation layers, so as to realize planarization and weaken the stress between the inorganic encapsulation layers. The edge of the organic encapsulation layer may be located between the edge of the display area and the edge of the inorganic encapsulation layers. Exemplarily, the thin film encapsulation layer includes a first inorganic encapsulation layer, an organic encapsulation layer and a second inorganic encapsulation layer stacked in sequence on a side of the pixel layer away from the base substrate.

In some implementations, the display panel may further include a touch function layer, which is arranged on a side of the thin film encapsulation layer away from the base substrate, and is used to realize touch operation of the display panel.

In some implementations, the display panel may further include an anti-reflection layer, which may be arranged on a side of the thin-film encapsulation layer away from the pixel layer to reduce the reflection of the display panel on ambient light, thereby reducing the influence of ambient light on the display effect. In one implementation of the present disclosure, the anti-reflection layer may include a color filter layer and a black matrix layer that are stacked, so as to reduce the interference of ambient light while avoiding reducing the light transmittance of the display panel. In another implementation of the present disclosure, the anti-reflection layer may be a polarizer, such as a patterned coated circular polarizer. Further, the anti-reflection layer may be arranged on a side of the touch function layer away from the base substrate.

Figure 2:
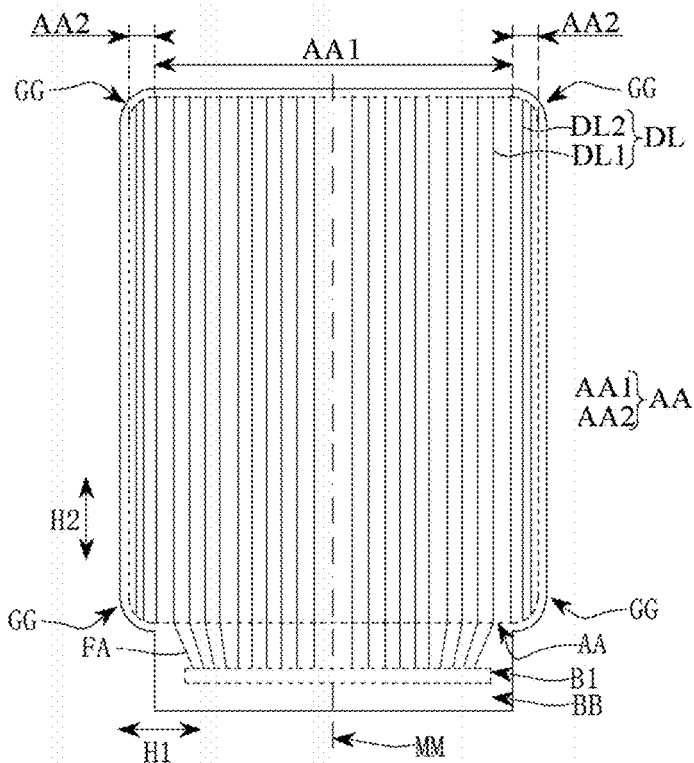
FIG. 2 is a schematic structural diagram of a display panel in an implementation of the present disclosure.

Referring to FIG. 2, viewed from a front view, the display panel may include a display area AA and a peripheral area BB at least partially surrounding the display area AA. The sub-pixels may be arranged in the display area AA. The display panel also has a bonding area B1 in the peripheral area BB, and the bonding area is provided with a plurality of pads for bonding a driving chip or a circuit board, so as to realize driving of the display panel.

In implementations of the present disclosure, an end of the display area AA close to the bonding area B1 may be defined as a lower end. The lower end of the display area AA is its end in the second direction H2. The data lines DL are arranged in sequence along the first direction H1, and all data lines DL need to be electrically connected to the pads in the bonding area B1, so as to receive driving data signals from the bonding area. Referring to FIG. 2, the display panel may be provided with pad connection lines FA corresponding to data lines DL (only part of the pad connection lines FA are illustrated in FIG. 2) one to one, and one end of a pad connection line FA extends into the bonding area to be electrically connected to a pad, and the other end of the pad connection line FA is electrically connected to a corresponding data line DL. In this way, the data line DL is electrically connected to the pad in the bonding area B1 through the corresponding pad connection line FA.

In implementations of the present disclosure, referring to FIG. 2, along the first direction H1, the display area AA may include a first display area AA1 and two second display areas AA2 respectively located on both sides of the first display area AA1. The data lines DL include first data lines DL1 located in the first display area AA1 and second data lines DL2 located in the second display area AA2.

Figure 3:
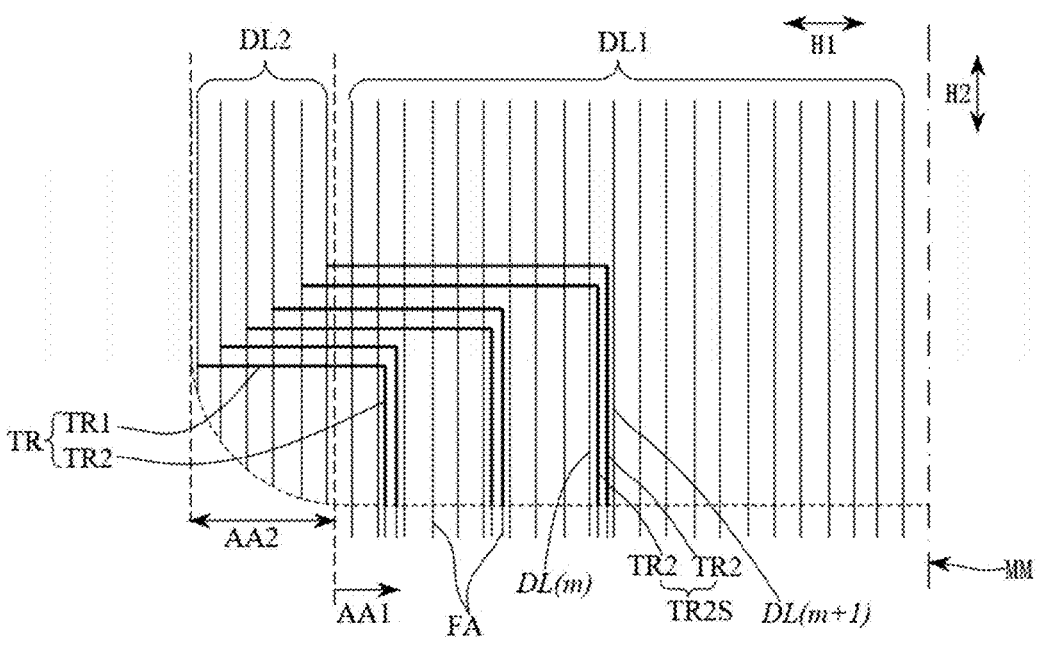
FIG. 3 is a schematic diagram of a local structure of a display panel in an implementation of the present disclosure.
Figure 4:
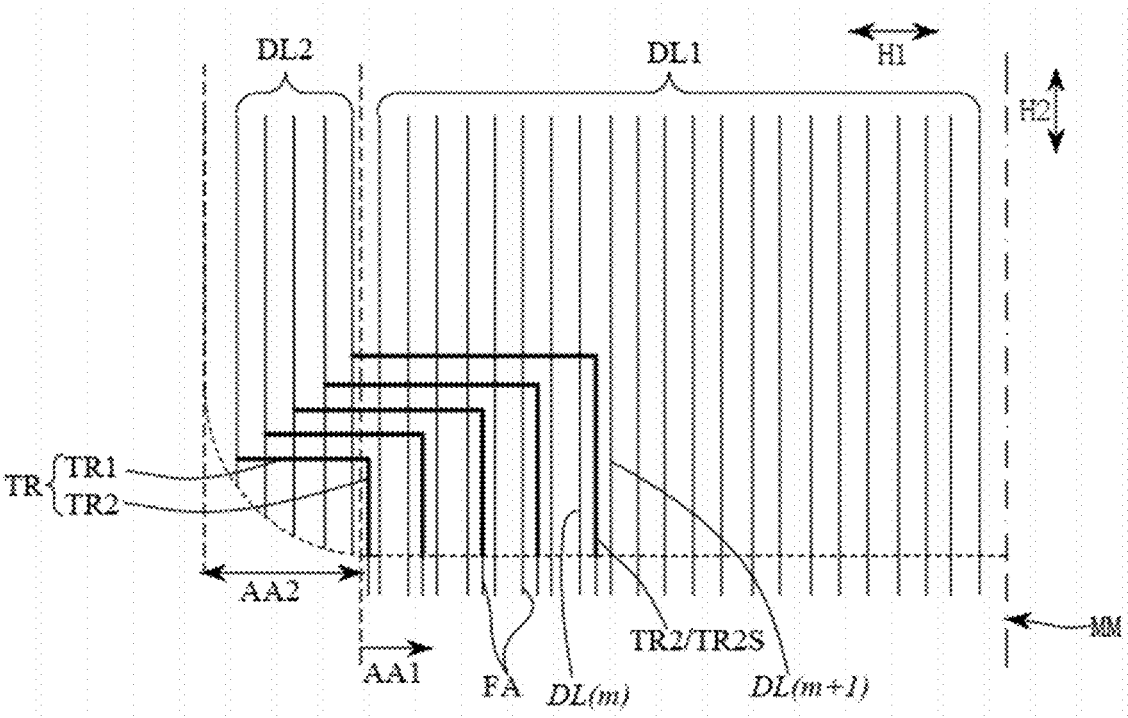
FIG. 4 is a schematic diagram of a local structure of a display panel in an implementation of the present disclosure.
Figure 5:
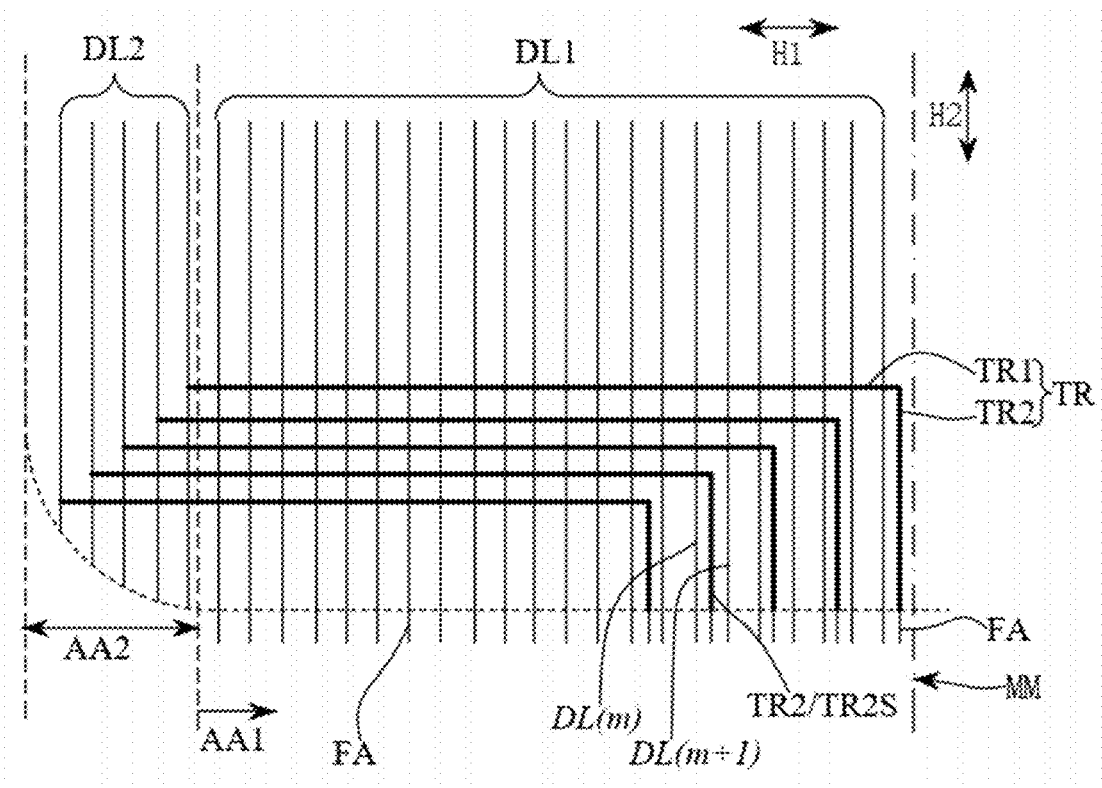
FIG. 5 is a schematic diagram of a local structure of a display panel in an implementation of the present disclosure.

Referring to FIG. 3 to FIG. 5, the display panel further includes interconnect lines TR arranged as corresponding to the second data lines DL2 one to one. One end of an interconnect line TR is connected to a corresponding second data line DL2, and the other end of the interconnect line TR extends from the first display area AA1 and is electrically connected to a pad connection line FA. In other words, the second data lines DL2 are connected with interconnect lines TR, and these interconnect lines TR extend out of the display area AA from the first display area AA1, and are electrically connected to the bonding area through the pad connection lines FA.

In this way, the second data lines DL2 do not need to extend out of the display area AA from the second display area AA2 to the bonding area, which saves the wiring space at the lower end of the peripheral area BB, thereby reducing the bezel of the display panel. In this way, the present disclosure can transfer data lines DL away from the central axis MM of the display area AA (that is, data lines located at the outer side of the display area AA) to an area close to the inner side of the display area AA, and the data lines DL can be electronically connected to the bonding area at the area close to the central axis MM of the display area AA, thereby reducing the wiring space of the pad connection lines FA to make the display panel has an ultra-narrow lower bezel.

Exemplarily, the second interconnect lines are electrically connected to the pads through corresponding pad connection lines; the first data lines are electrically connected to the pads through corresponding pad connection lines.

In implementations of the present disclosure, the central axis MM of the display area AA extends along the second direction H2, the number of columns of sub-pixels on both sides of the central axis MM may be the same, and the width of the display area is basically the same. In this case, it can be considered that the display area AA is arranged symmetrically along the central axis MM. For the convenience of description, in the first direction H1, a direction close to the central axis MM of the display area AA may be defined as the inner side, and a direction away from the central axis MM of the display area AA may be defined as the outer side. In other words, among two adjacent data lines DL, the outer data line DL is farther away from the central axis MM of the display area AA.

In some implementations, the interconnect lines TR are arranged symmetrically with respect to the central axis MM. Such arrangement is beneficial to the design, manufacture and driving of the display panel.

In some implementations, referring to FIG. 3, a corner (a lower corner) of the display panel near the bonding area may be a non-right angle, such as an arc-shaped corner, especially a rounded corner. In this implementation, each column of pixel driving circuits corresponding to the arc-shaped corner may be located in the second display area AA2. In other words, in the first direction H1, the distribution range of the arc-shaped corner is within the distribution range of the second display area AA2. In this way, the display panel of the present disclosure has lower rounded corners and an ultra-narrow lower bezel, which can realize the large-angle bending function of four sides, and can improve the wrinkle problem of module bonding. Further, the arc-shaped corner can be an ultra-narrow rounded corner.

Exemplarily, in the first direction H1, the distribution range of the arc-shaped corner coincides with the distribution range of the second display area AA2. In this way, the data lines DL connected to the columns of driving circuits corresponding to the arc-shaped corner can be transferred to the first display area AA1 through the interconnect lines TR.

In one implementation of the present disclosure, the display panel can be a flexible display panel. In this way, the flexible display panel can be bent at a large angle at the corners, this can reduce or eliminate wrinkles that occur when the display panel is attached, and further improve the yield rate of the display device based on the display panel. In this implementation, by transferring the corresponding data lines DL at the corners to the first display area AA1, the display panel can realize ultra-narrow lower rounded corners and ultra-narrow lower bezel, thereby further improving the screen-to-body ratio of the display device.

In an implementation of the present disclosure, a corner (upper corner) of the display panel away from the bonding area may also be a non-right angle, such as an arc-shaped corner, especially a rounded corner. Exemplarily, in an implementation of the present disclosure, referring to FIG. 2, the four corners GG of the display panel are all rounded.

In some implementations, referring to FIGS. 3 to 5, each of the interconnect lines TR may include a first interconnect section TR1 extending along the first direction H1 and a second interconnect section TR2 extending along the second direction H2. At least one second interconnect section TR2 is located between two adjacent first data lines DL1. The first data line DL1 may directly extend out of the display area AA and be electrically connected to a pad connection line FA corresponding to the first data line DL1.

In this way, the present disclosure is equivalent to interspersing the pad connection lines of a part of the second data line DL2 among the pad connection lines of the first data lines DL1, and the driver of the display device can adaptively adjust driving data signals according to the first data lines DL1 and the second interconnect lines TR2 in the display panel, so as to drive the display panel.

In some implementations, in two adjacent second data lines DL2, a second interconnect line TR2 of an interconnect line TR corresponding to the outer second data line DL2, is located at the outside of a second interconnect line TR2 of an interconnect line TR corresponding to the inner second data line DL2. In other words, the outer a second data line DL2 is, the outer a second interconnect line TR2 of the second data line DL2 will be. In this way, the difference in lengths of the interconnect lines TR connected to respective second data lines DL2 is small, and the difference in influence on the impedance of the second data lines DL2 is small, which is beneficial to the compensation of the driving data signals on respective second data lines DL2.

Correspondingly, in two adjacent second data lines DL2, a first interconnect section TR1 of an interconnect line TR corresponding to the outer second data line DL2, is located at a side (i.e., a side close to the pad connection lines) of a first interconnect section TR1 of an interconnect line TR corresponding to the inner second data line DL2. That is, the outer a second data line DL2 is, the closer a first interconnect section TR1 connected to the second data line DL2 is to the bonding end.

Certainly, in other implementations of the present disclosure, the interconnect lines may also be arranged in other ways. Exemplarily, in two adjacent second data lines, a second interconnect line of an interconnect line corresponding to the outer second data line, is located at the inner side of a second interconnect line of an interconnect line TR corresponding to the inner second data line. In two adjacent second data lines, a first interconnect section of an interconnect line corresponding to the inner second data line, is located at a lower side of a first interconnect section of an interconnect line TR corresponding to the outer second data line.

In some implementations, the lengths of respective interconnect lines TR may be substantially the same. For example, the length of the longest interconnect line TR is between 1.0 and 1.2 times the length of the shortest interconnect line TR. In this way, the difference in the lengths of respective interconnect lines TR is small, and the difference in the influence on the driving data signal loaded on the second data lines DL2 is small, which is beneficial to the compensation of the driving data signals on the second data lines DL2. In implementations of the present disclosure, the lengths of the first interconnect sections TR1 and the second interconnect lines TR2 may be adjusted by adjusting the positions of the first interconnect sections TR1 and the positions of the second interconnect lines TR2, and thus the lengths of the interconnect lines TR may be adjusted.

As shown in FIG. 6 to FIG. 10, the pixel layer EE includes a plurality of pixel groups P. A pixel group includes a first sub-pixel P1, a second sub-pixel P2 and a third sub-pixel P3. The colors of the first sub-pixel P1, the second sub-pixel. The colors of P2 and the third sub-pixels P3 are different from each other. A plurality of first sub-pixels P1 and a plurality of third sub-pixels P3 are arranged alternately along the second direction H2 to form a first pixel column, and a plurality of second sub-pixels P2 are arranged along the second direction H2 as a second pixel column. The first pixel column and the second pixel column are arranged alternately along the first direction H1. The second sub-pixel P2 is located between the first sub-pixel P1 and the third sub-pixel P3 in the second direction H2. The first sub-pixel P1 may be a red sub-pixel, the second sub-pixel P2 may be a green sub-pixel, and the third sub-pixel P3 may be a blue sub-pixel.

The first sub-pixels P1 and the third sub-pixels P3 in the first pixel column are connected through a data line DL, and the plurality of second sub-pixels P2 in the second pixel column are connected through another data line DL. A plurality of data lines DL respectively connected to a plurality of first pixel columns and a plurality of second pixel columns are located in the display area and extend along the second direction H2. The plurality of data lines DL include a plurality of first data lines DL1 located in the first display area and a plurality of second data lines DL2 located in the second display areas, and the plurality of first data lines DL1 are electrically connected with a plurality of pads.

The display panel further includes interconnect lines TR arranged as corresponding to respective second data lines DL2 one to one. Ends of the plurality of interconnect lines TR are connected to corresponding second data lines DL2, and the other ends of the plurality of interconnect lines TR extend from the first display area AA1 and are electrically connected to the pad connection lines FA. The plurality of interconnect lines TR include a plurality of first interconnect lines and a plurality of second interconnect lines. One end of a first interconnect line is connected to a second data line DL2 corresponding to a first sub-pixel P1 and a third sub-pixel P3, and the other end extends from the first display area AA1 and is electrically connected to a pad connection line FA. One end of a second interconnect line is connected to a second data line DL2 corresponding to a second sub-pixel P2, and the other end extends from the first display area and is electrically connected to a pad connection line FA.

In implementations of the present disclosure, the driving circuit layer includes different conductive layers. Generally, data lines DL are arranged in a same conductive layer, and first interconnect sections TR1 of the interconnect lines TR are arranged in a same conductive layer. The second interconnect sections TR2 may include two different types, i.e., a first sub-interconnect section and a second sub-interconnect section. The first sub-interconnect section and the second sub-interconnect section may be arranged in the same conductive layer, or may be in different conductive layers. It should be noted that the first sub-interconnect section refers to the second interconnect section TR2 of a first interconnect line, and the second sub-interconnect section specifically refers to the second interconnect section TR2 of a second interconnect line.

Specifically, the driving circuit layer includes a gate layer, a first source-drain metal layer LSD1 and a second source-drain metal layer LSD2. The gate layer is arranged on a side of the base substrate BP. The gate layer includes a first gate layer LG1, a second gate layer LG2 and a second gate layer LG3 which are sequentially arranged in a direction away from the base substrate BP. The first source-drain metal layer LSD1 is arranged on a side of the gate layer away from the base substrate BP. The second source-drain metal layer LSD2 is arranged on a side of the first source-drain metal layer LSD1 away from the base substrate BP. In some implementations of the present disclosure, the data lines DL may be arranged in the first source-drain metal layer LSD1, or may be arranged in the second source-drain metal layer LSD2. The first interconnect sections TR1 may be arranged in the gate layer, or may be arranged in the same layer as the first source-drain metal layer LSD1.

The first interconnect lines are represented by thick lines, and the second interconnect lines are represented by thin lines. The interconnect lines arranged on the side of the second source-drain metal layer LSD2 away from the base substrate BP are represented by solid lines, and the interconnect lines in the conductive layer between the second source-drain metal layer LSD2 and the base substrate BP are represented by dotted lines. Because the first interconnect sections are located in the conductive layer below the second source-drain metal layer LSD2, dotted lines are used in FIGS. 6 to 10 to represent the first interconnect sections TR1 of the first interconnect lines and the first interconnect sections TR1 of the second interconnect lines. The first interconnect sections TR1 of the first interconnect lines and the first interconnect sections TR of the second interconnect lines will be described below in detail.

Figure 6:
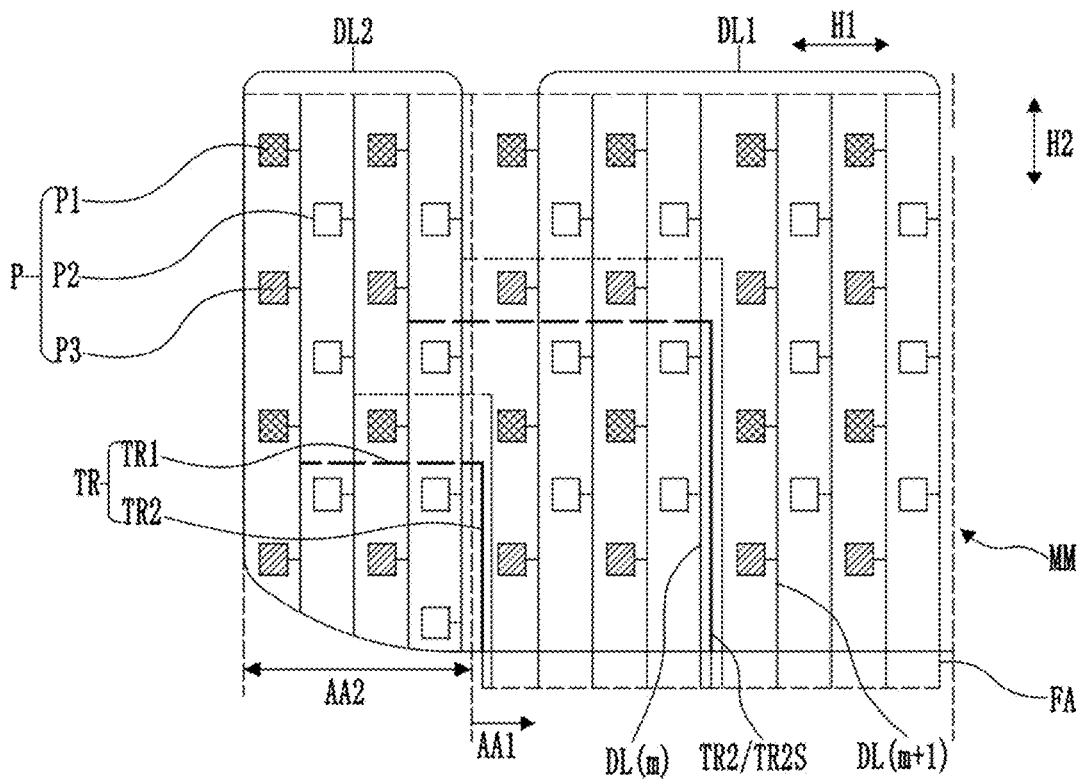
FIG. 6 is a schematic diagram showing distribution of second interconnect sections corresponding to different sub-pixels of a display panel in an implementation of the present disclosure.
Figure 7:
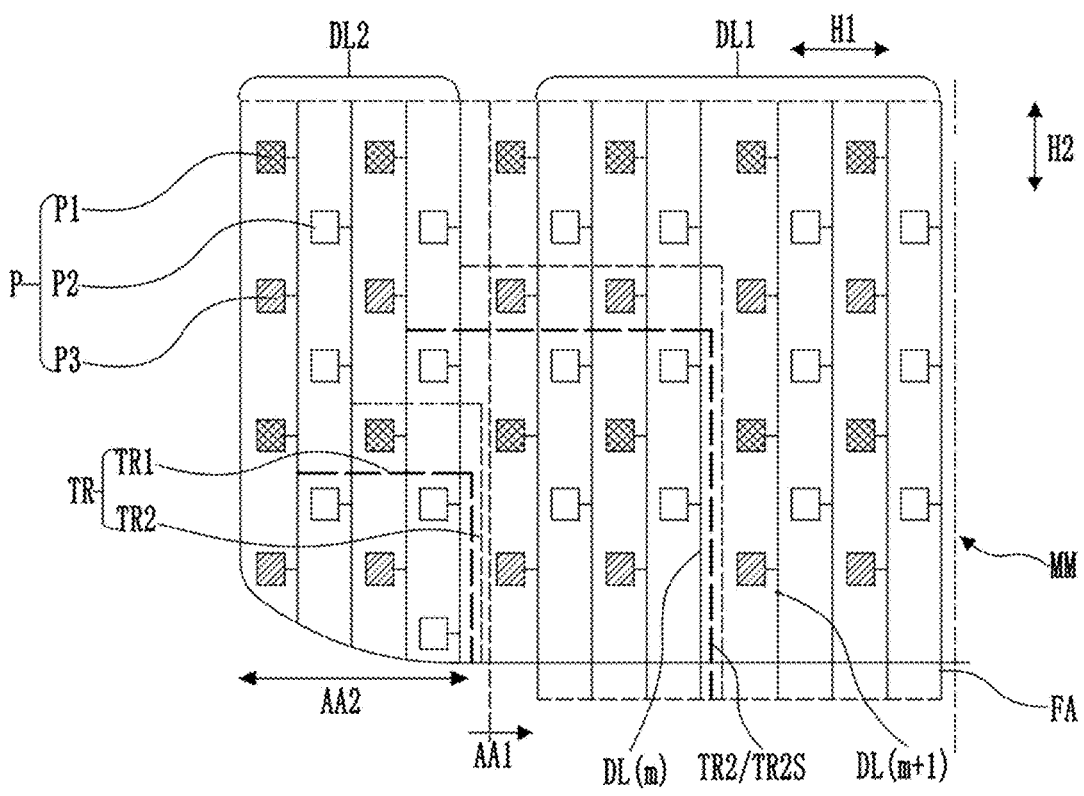
FIG. 7 is a schematic diagram showing another distribution of second interconnect sections corresponding to different sub-pixels of a display panel in an implementation of the present disclosure.

As shown in FIG. 6 and FIG. 7, when the first sub-interconnect sections and the second sub-interconnect sections are arranged in the same conductive layer, the first sub-interconnect sections and the first source-drain metal layer LSD1 may be arranged in the same layer, and the second sub-interconnect sections and the first source-drain metal layer LSD1 may be arranged in the same layer. It is also possible that the first sub-interconnect sections and the second source-drain metal layer LSD2 may be arranged in the same layer, and the second sub-interconnect sections and the second source-drain metal layer LSD2 may be arranged in the same layer.

In order to reduce the cost without adding a new film layer, the wiring space between two adjacent first data lines DL1 is a gap obtained by sub-pixel compression, and the interconnect lines are placed in the gaps obtained by the sub-pixel compression. Due to the limitation of original pixel density (PPI) of the pixels, the space that can be obtained by compression is limited. In order to place as many interconnect lines as possible in the gaps, it is usually also possible to set the first sub-interconnect sections and the second sub-interconnect sections at different conductive layers. For example, the first sub-interconnect sections are arranged in the same layer as the second source-drain metal layer LSD2, and the second sub-interconnect sections are arranged in the same layer as the first source-drain metal layer LSD1. It is also possible that the first sub-interconnect sections are arranged in the same layer as the second source-drain metal layer LSD2, and the second sub-interconnect sections are arranged in the same layer as the first source-drain metal layer LSD1.

As shown in FIG. 1, scan lines extend along the first direction and are arranged between the base substrate and the first source-drain metal layer. It can be understood that, although the resistance R of the first source-drain metal layer LSD1 and the second source-drain metal layer LSD2 is the same, the distances of the first source-drain metal layer LSD1 and the second source-drain metal layer LSD2 from the scan lines are different. Therefore, the parasitic capacitance between the first source-drain metal layer LSD1 and the scan lines is different from that between the second source-drain metal layer LSD2 and the scan lines.

Figure 8:
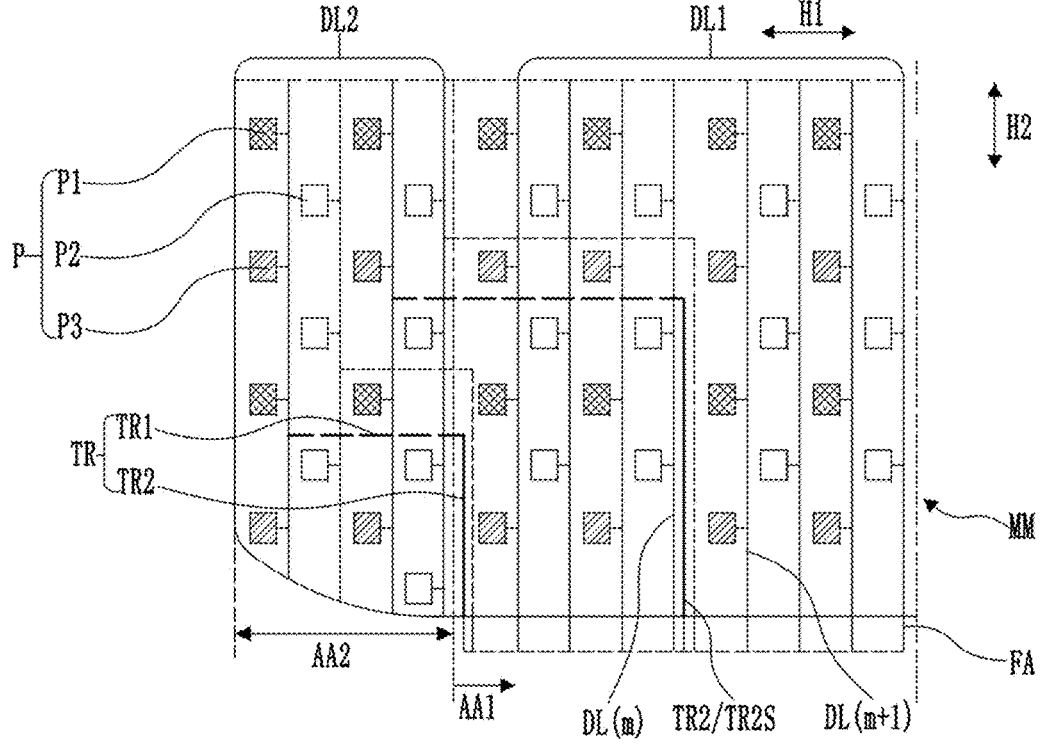
FIG. 8 is a schematic diagram showing another distribution of second interconnect sections corresponding to different sub-pixels of a display panel in an implementation of the present disclosure.
Figure 11:
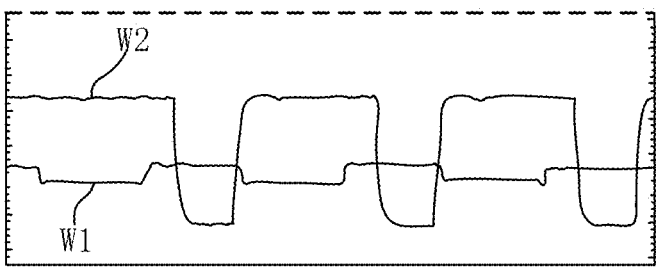
FIG. 11 is a waveform diagram of data lines corresponding to different sub-pixels of a display panel in an implementation of the present disclosure.

When lines are alternately routed in the first source-drain metal layer LSD1 and the second source-drain metal layer LSD2, the influence of the overall internal resistance voltage drop (RC Loading) on the display effect need to be considered. As shown in FIG. 11, there are jumps in the waveform W1 of a second data line DL2 connected to a first pixel column; the waveform W2 of a second data line DL2 connected to a second pixel column is a straight line. As shown in FIG. 8, in order to avoid further increase of parasitic capacitance influence with the scan lines due to the waveform jump of the second data lines DL2 connected to the first pixel columns, the first sub-interconnect sections may be arranged in the second source-drain metal layer, and the second sub-interconnect sections may be arranged in the first source-drain metal layer.

Because the distance between the first sub-interconnect sections and the scan lines is relatively large, the parasitic capacitance between the first sub-interconnect sections and the scan lines is small, and the waveform jump of the second data lines DL2 connected to the first pixel columns have small influence on parasitic capacitance, and fluctuation in internal resistance voltage drop (RC Loading) is relative small, and less influence will be imposed on the display effect of the display panel. The distance between the second sub-interconnect sections and the scan lines is small, although the generated parasitic capacitance is relatively large, the waveform of the second data lines DL2 connected to the second pixel columns is a straight line, the parasitic capacitance and internal resistance voltage drop do not fluctuate, and no influence will be imposed on the display effect of the display panel.

When the number of second data lines DL2 to be transferred or the number of second interconnect sections that can be inserted between two columns of first data lines DL1 cannot be divisible by 2 or 4, depending on the size of the gaps, it can be considered to distribute the first sub-interconnect sections in different conductive layers, or distribute the second sub-interconnect sections in different conductive layers.

Figure 9:
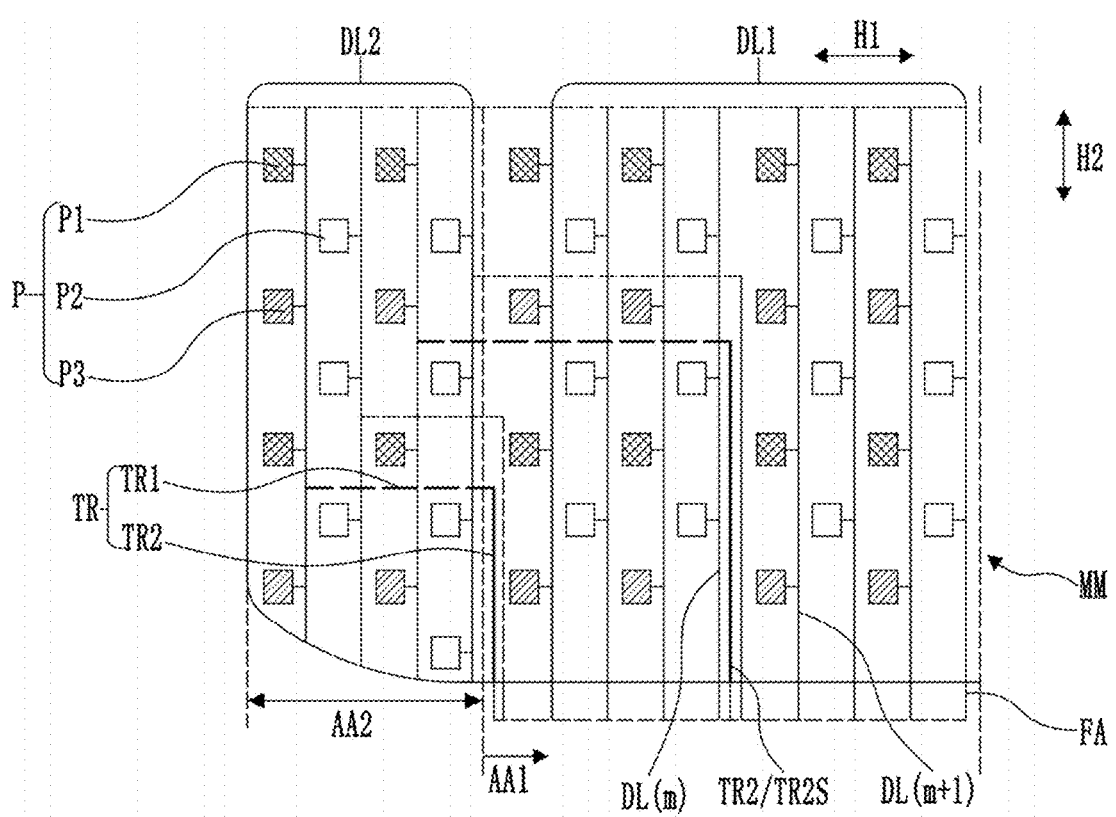
FIG. 9 is a schematic diagram showing another distribution of second interconnect sections corresponding to different sub-pixels of a display panel in an implementation of the present disclosure.

As mentioned above, the parasitic capacitance and internal resistance voltage drop of the second data lines connected to the second pixel columns do not fluctuate. Then, as shown in FIG. 9, the first sub-interconnect sections and the second source-drain metal layer LSD2 may be arranged in the same layer, and a part of the second sub-interconnect sections and the first source-drain metal layer LSD1 may be arranged in the same layer, and another part of the second sub-interconnect sections and the second source-drain metal layer may be arranged in the same layer. It is further possible that the second sub-junction sections are alternately distributed in the first source-drain metal layer LSD1 and the second source-drain metal layer LSD2.

A second interconnect section group TR2S includes a second interconnect section TR2 of at least one first interconnect line and second interconnect sections TR2 of at least two second interconnect lines. The second interconnect sections TR2 of all the first interconnect lines are arranged in the same layer as the second source-drain metal layer LSD2. A second interconnect section TR2 of at least one second interconnect line is arranged in the same layer as the first source-drain metal layer LSD1. A second interconnect section TR2 of at least one second interconnect line is arranged in the same layer as the second source-drain metal layer LSD2.

In an embodiment of the present disclosure, the first sub-pixels P1 are red sub-pixels, the second sub-pixels P2 are green sub-pixels, and the third sub-pixels P3 are blue sub-pixels. Therefore, the first interconnect lines are connected to the second data lines DL2 corresponding to the red sub-pixels and the blue sub-pixels, and the second interconnect lines are connected to the second data lines DL2 corresponding to the green sub-pixels.

Figure 10:
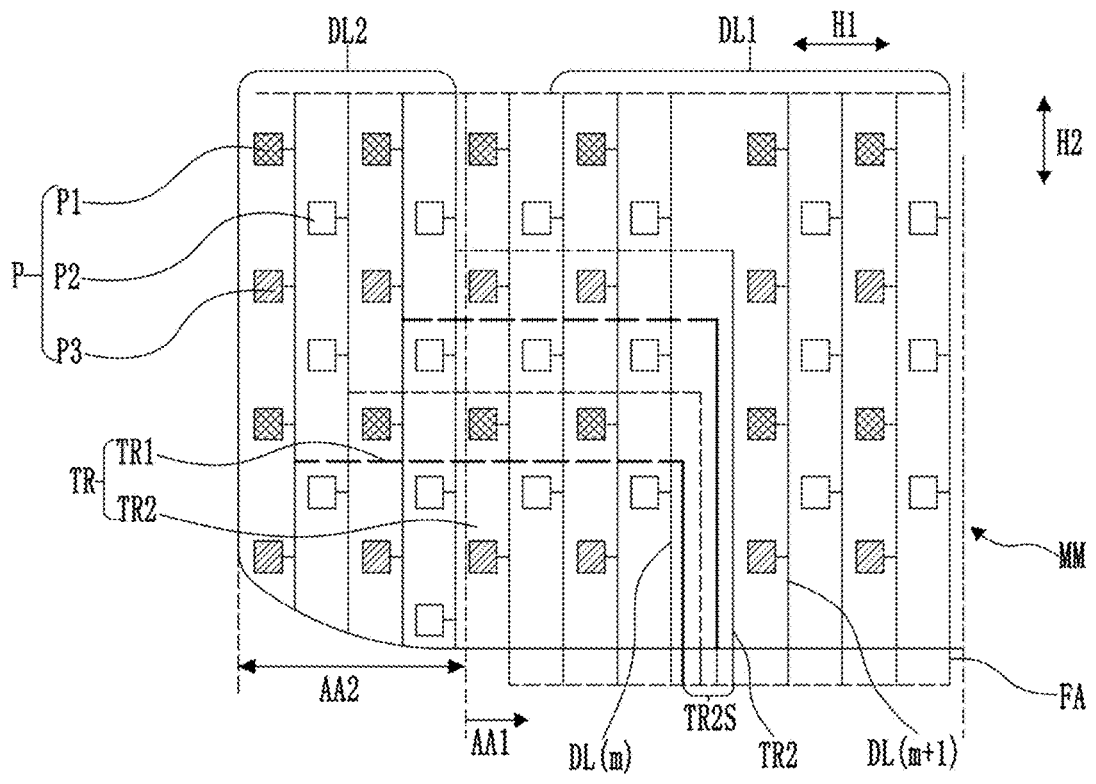
FIG. 10 is a schematic diagram showing a distribution in which four second interconnect sections are provided between two adjacent first data lines in a display panel in an implementation of the present disclosure.

Specifically as shown in FIG. 10, a pixel group includes one first sub-pixel P1, two second sub-pixels P2 and one third sub-pixel P3. A second interconnect section group TR2S includes second interconnect sections TR2 of two first interconnect lines corresponding to the first sub-pixel P1 and the third sub-pixel P3, and second interconnect sections TR2 of two second interconnect lines corresponding to the two second sub-pixels P2. The second interconnect sections TR2 of the two first interconnect lines are arranged in the same layer as the second source-drain metal layer LSD2, the second interconnect section TR2 of one second interconnect line is arranged in the same layer as the first source-drain metal layer LSD1, and the second interconnect section TR2 of the other second interconnect line is arranged in the same layer as the second source-drain metal layer LSD2.

In an embodiment of the present disclosure, when the number of interconnect lines is small or the gap obtained by compressing the sub-pixels is relatively large, the second interconnect sections TR2 of the second data lines corresponding to the first sub-pixel P1, the second sub-pixels P2 and the third sub-pixel P3 are generally arranged in the same conductive layer as far as possible in the display panel, and further, the second interconnect sections TR2 are arranged in the same layer as the second source-drain metal layer LSD2. This arrangement can reduce the crosstalk between the data lines DL and the lower backplane signal lines (such as scan lines). When the crosstalk between the data line signals is acceptable, the first source-drain metal layer LSD1 may also be used to arrange the second interconnect sections TR2.

In an embodiment of the present disclosure, when the number of interconnect lines is large or the gap obtained by compressing the sub-pixels is small, the number of second interconnect sections TR2 that can be inserted between two adjacent first data lines DL1 is limited. If all the second interconnect sections TR2 are arranged using the first source-drain metal layer LSD1 or the second source-drain metal layer LSD2, it may not be possible to insert the second interconnect sections TR2 connected to all the second data lines. In this case, the second interconnect sections TR2 of the first interconnect lines corresponding to the first sub-pixels P1 and the third sub-pixels P3 are arranged in the second source-drain metal layer LSD2, and the second interconnect sections TR2 of the second interconnect lines corresponding to the second sub-pixels P2 are arranged in the first source-drain metal layer LSD1. Specifically, the second interconnect sections TR2 of the first interconnect lines and the second interconnect sections of the second interconnect lines TR2 are alternately distributed in the first source-drain metal layer LSD1 and the second source-drain metal layer LSD2.

When the number of second interconnect sections TR2 that can be inserted between two adjacent first data lines DL1 cannot be divisible by 2 or 4, the second interconnect sections TR2 of the first interconnect lines corresponding to the first sub-pixels and the third sub-pixels are arranged in the second source-drain metal layer LSD2, and the second interconnect sections TR2 of the second interconnect lines corresponding to the second sub-pixels P2 are arranged in the first source-drain metal layer LSD1 or the second source-drain metal layer LSD2.

It can be understood that the second interconnect sections TR2 of the first interconnect lines corresponding to the red sub-pixels and blue sub-pixels sensitive to human eyes adopts the second source-drain metal layer LSD2, and the second interconnect sections TR2 of the second interconnect lines corresponding to the green sub-pixels cannot use the position of the second source-drain metal layer LSD2, and the first source-drain metal layer LSD1 is used, so as to achieve uniform display of the overall screen.

It should be emphasized that two second sub-interconnect sections arranged symmetrically with respect to the central axis extending along the second direction are arranged in the same layer, so that the display brightness of the display panel at positions symmetrical with respect to the central axis extending along the second direction H2 tends to be the same. For example, when a first second sub-interconnect section distributed on one side of the central axis MM is arranged in the first source-drain metal layer LSD1, a second sub-interconnect section symmetrical to the second sub-interconnect on the other side of the central axis MM is also arranged in the first source-drain metal layer LSD1. When a third second sub-interconnect section distributed on one side of the central axis MM is arranged in the second source-drain metal layer LSD2, a second sub-interconnect section symmetrical to the fourth second sub-interconnect on the other side of the central axis MM is also arranged in the first source-drain metal layer LSD2.

In implementations of the present disclosure, the driving circuit layer is provided with thin film transistors of the driving circuits, and the interconnect lines TR do not overlap with the thin film transistors. Further, the positions and gaps of respective thin film transistors can be adjusted according to needs, so as to reserve space for laying the interconnect lines TR.

In implementations of the present disclosure, when it is described that two structures overlap, it means that the two structures are in different film layers, and the orthographic projections of the two structures on the base substrate are at least partially overlapped. When it is described that two structures do not overlap, it means that the two structures are in different film layers, and the orthographic projections the two structures on the substrate have no overlapping area.

Figure 12:
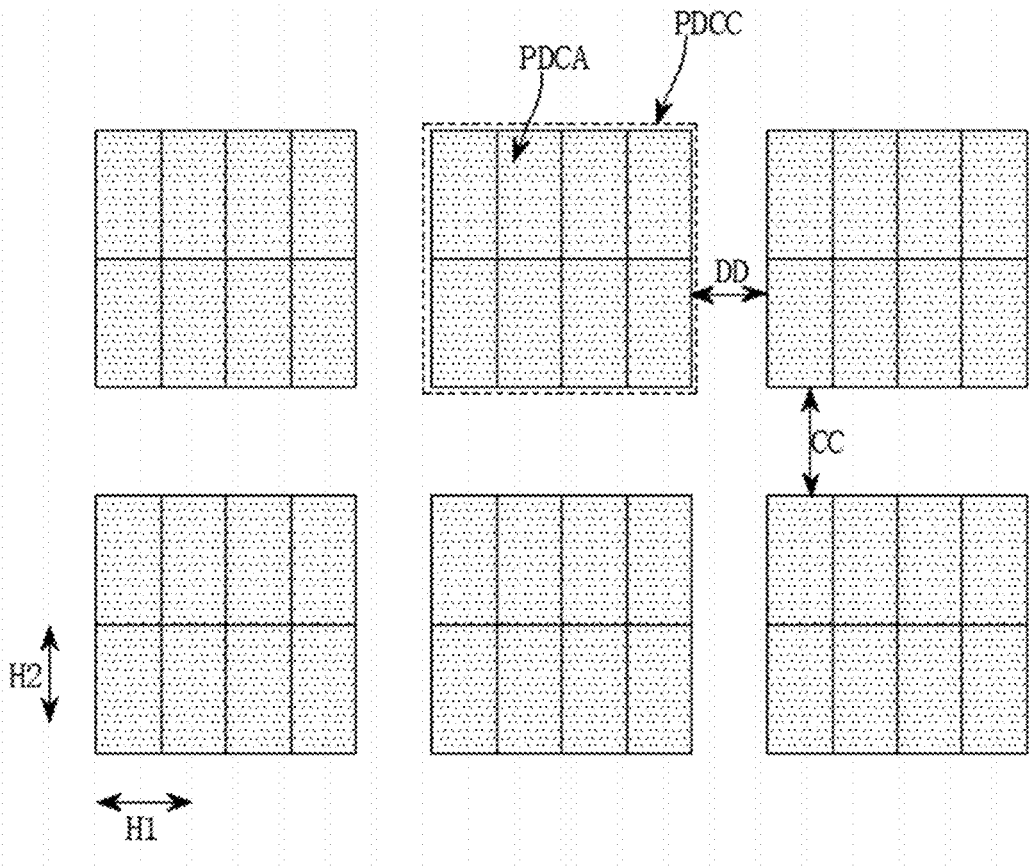
FIG. 12 is a schematic diagram show a distribution of driving circuit islands in an implementation of the present disclosure.

In implementations of the present disclosure, referring to FIG. 12, the driving circuit layer is provided with driving circuits corresponding to respective sub-pixels one to one, and the display panel may include driving circuit areas PDCA provided in a one-to-one correspondence to respective driving circuits. Most or all transistors of a driving circuit may be located in a corresponding driving circuit area PDCA of the driving circuit, and a small number of transistors of the driving circuit may be located in an adjacent driving circuit area PDCA to facilitate layout and reusing of signal lines. The interconnect lines TR do not overlap with the driving circuit areas PDCA.

In some implementations, the driving circuit layer may further include a transistor layer in addition to the first source-drain metal layer and the second source-drain metal layer. The transistor layer may include a semiconductor layer and a gate layer. The source-drain metal layer is provided with lines and conductive structures, and the conductive structures are used to electrically connect the transistors and the lines.

A driving circuit area PDCA corresponding to a driving circuit may be defined according to the distribution range of the conductive structures of the driving circuit. In one implementation of the present disclosure, the driving circuit area PDCA is a rectangular area, the long side of the rectangular area extends along the column direction, and the short side extends along the first direction. The conductive structures of a driving circuit are located in the driving circuit area PDCA corresponding to the driving circuit.

In some implementations, a driving circuit has a storage capacitor, a driving transistor, and a data writing transistor connected to a data line DL. The storage capacitor, the driving transistor, and the data writing transistor of the driving circuit are all located in the driving circuit area PDCA corresponding to the driving circuit.

In some implementations, in two driving circuits adjacent in the second direction H2, at least one thin film transistor of the driving circuit of the upper row is located in the driving circuit area PDCA corresponding to the driving circuit of the lower row; the remaining thin film transistors of the driving circuit of the upper row are located in the driving circuit area PDCA corresponding to the driving circuit.

As an example, a driving circuit is provided with an electrode reset transistor for resetting a pixel electrode. The electrode reset transistor of the driving circuit may be located in a driving circuit area PDCA corresponding to a driving circuit in a next row. Correspondingly, an electrode reset transistor of a driving circuit in a previous row is also arranged inside a driving circuit area PDCA not located at the edge of the display area AA.

In some implementations, referring to FIG. 12, the driving circuit layer includes driving circuit islands PDCC distributed in an array. Any driving circuit island PDCC includes one or more driving circuit areas PDCA corresponding to respective driving circuits one to one; at least a part of transistors of a driving circuit are arranged in a corresponding driving circuit area PDCA.

As mentioned above, the wiring space between two adjacent first data lines is a gap obtained by sub-pixel compression, and the interconnect lines are placed in the gap obtained by sub-pixel compression. Specifically, the driving circuits of sub-pixels are compressed. Referring to FIG. 12, respective driving circuit areas PDCA in one driving circuit island PDCC are arranged adjacent to each other in sequence, and there is a gap between driving circuit islands PDCC. The interconnect lines TR are arranged in the gaps between the driving circuit islands PDCC.

In an implementation of the present disclosure, the driving circuit islands PDCC may be arranged as a plurality of driving circuit island PDCC rows, each driving circuit island PDCC row includes a plurality of driving circuit islands PDCC arranged along the first direction H1, and respective driving circuit island PDCC rows are sequentially arranged along the second direction H2. A row gap CC is provided between two adjacent driving circuit island PDCC rows. The driving circuit islands PDCC may be arranged as a plurality of driving circuit island PDCC columns, each driving circuit island PDCC column includes a plurality of driving circuit islands PDCC arranged along the second direction H2, and respective driving circuit island PDCC columns are sequentially arranged along the first direction. A column gap DD is provided between two adjacent driving circuit island PDCC columns. Referring to FIG. 13 to FIG. 19, the interconnect lines TR are arranged in the gaps between the driving circuit islands PDCC, and the gaps may be the row gap CC or the column gap DD as shown in FIG. 12.

Referring to FIG. 12, there may be no gap or a small gap between adjacent driving circuit areas PDCA in a driving circuit island PDCC. In this way, the driving circuit areas PDCA in the driving circuit island PDCC can be arranged compactly, so as to facilitate the formation of larger gaps between driving circuit islands PDCC, and further facilitate the layout of the interconnect lines TR. It can be understood that when a part of thin film transistors of a driving circuit are not located in a driving circuit area PDCA corresponding to the driving circuit, these thin film transistors may be located in another driving circuit area PDCA in the same driving circuit island PDCC, or may be located in a driving circuit area PDCA in an adjacent driving circuit island PDCC, and embodiments of the present disclosure do not impose specific limitations on this.

In some implementations, the driving circuits are arranged as a plurality of driving circuit groups, and each driving circuit group includes two driving circuits that are adjacent and mirrored along the first direction H1. The two driving circuit areas PDCA respectively corresponding to the two driving circuits of the driving circuit group are adjacently arranged and located in the same driving circuit island PDCC. Of course, in other implementations of the present disclosure, adjacent driving circuits may not adopt the mirror design, and the patterns of two adjacent driving circuits in the same row may be basically the same.

In some implementations, the driving circuit areas PDCA in the driving circuit islands PDCC are arranged in multiple rows and multiple columns, so that the driving circuit islands PDCC have a larger area, thereby making the gaps between the driving circuit islands PDCC larger, which is beneficial to placing interconnect lines TR in the gaps between the driving circuit islands PDCC. In one implementation of the present disclosure, the driving circuit areas PDCA in a driving circuit island PDCC are arranged in two rows and four columns.

The number of interconnect lines TR arranged in the gaps between the driving circuit islands PDCC may be adjusted according to the actual wiring requirements on the one hand, and on the other hand, it is limited by the size of the gaps, the width of each interconnect line TR, the spacing of the interconnect lines TR, and the film layers where the interconnect lines TR are arranged. In implementations of the present disclosure, the smaller a gap between driving circuit islands PDCC is, the smaller the number of interconnect lines TR that can be placed in the gap will be.

Referring to FIGS. 13 to 19, the number of the second interconnect lines TR2 between the driving circuit island PDCC columns may be determined according to the process requirements, for example, it may be any number from 1 to 6. The lines in the first source-drain metal layer LSD1 are represented by dotted lines, and the lines in the second source-drain metal layer LSD2 are represented by solid lines. The data lines DL are arranged in the second source-drain metal layer LSD2. An interconnect line TR includes a first interconnect section TR1 extending along the first direction H1 and a second interconnect section TR2 extending along the second direction H2. The first interconnect section TR1 is arranged in the first source-drain metal layer, and the second interconnect section is arranged in the first source-drain metal layer or the second source-drain metal layer.

As shown in FIG. 13 to 17, when the gaps between the driving circuit islands PDCC are sufficient to arrange the interconnect lines TR, all the first sub-interconnect sections and second sub-interconnect sections may be directly arranged in the second source-drain metal Layer LSD1. Or, all the first sub-interconnect sections and the second sub-interconnect sections may be directly arranged in the second source-drain metal layer LSD2.

Figure 18:
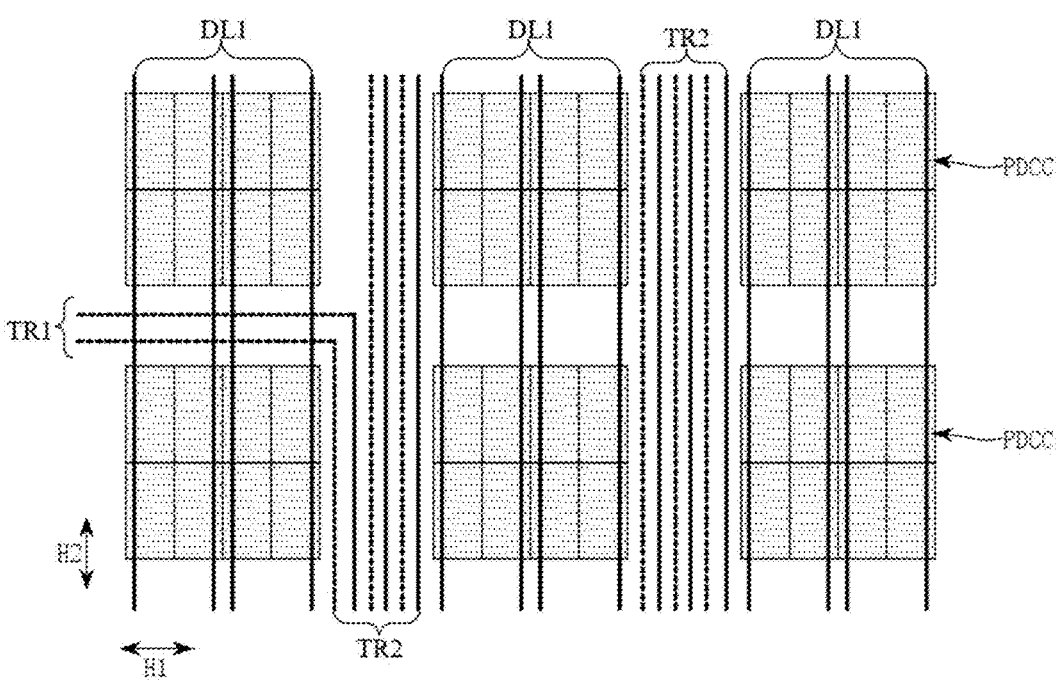
FIG. 18 is a schematic diagram showing a distribution of driving circuit islands and second interconnect lines in an implementation of the present disclosure.
Figure 19:
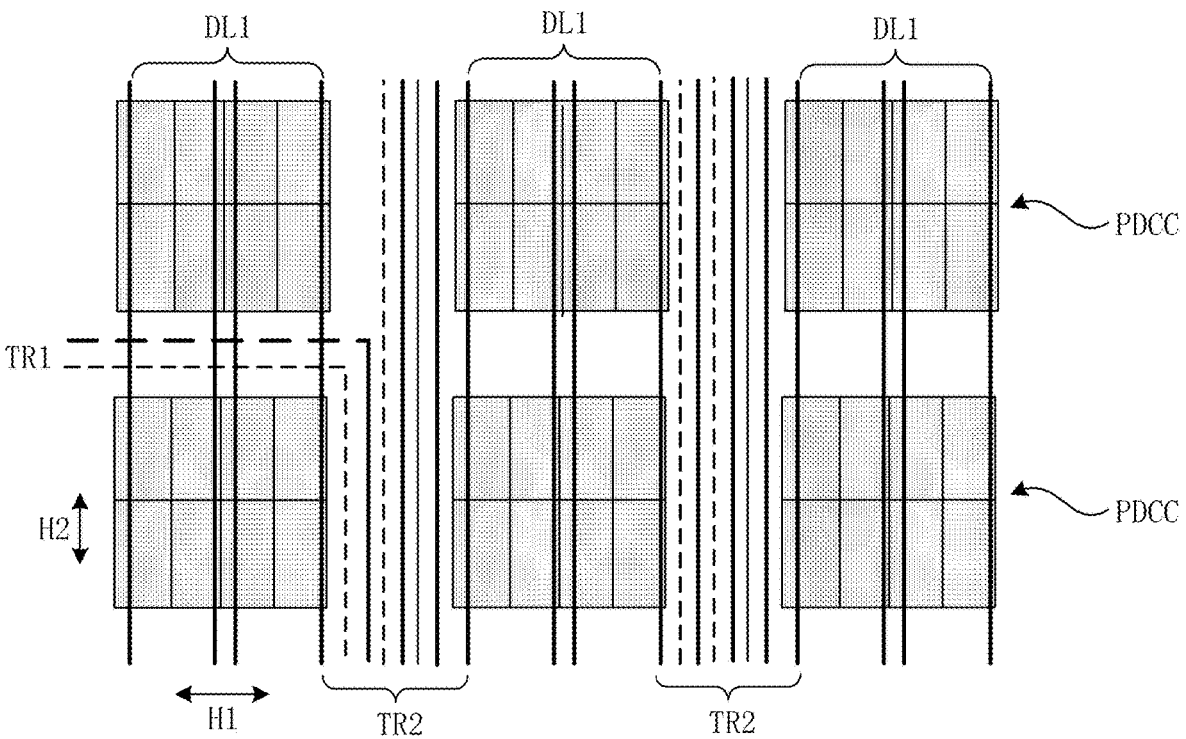
FIG. 19 is a schematic diagram showing a distribution of driving circuit islands and second interconnect lines in an implementation of the present disclosure.

As shown in FIG. 18, the first sub-interconnect sections TR2 may be entirely arranged in the second source-drain metal layer LSD2, and the second sub-interconnect sections TR2 may be entirely arranged in the first source-drain metal layer LSD1. As shown in FIG. 19, the first sub-interconnect sections TR2 may also be entirely arranged in the second source-drain metal layer LSD2, and the second interconnect lines TR2 are alternately arranged in the first source-drain metal layer LSD1 and the second source-drain metal layer LSD2.

In some implementations of the present disclosure, ends of first data lines DL1 close to the bonding area are directly connected to corresponding pad connection lines FA. Second data lines DL2 are connected to pad connection lines FA through interconnect lines TR. In this way, too many interconnect lines TR can be avoided on the display panel, which facilitates the layout of the interconnect lines TR, and is especially suitable for high-resolution display panels and display panels with large rounded corners.

In some other implementations of the present disclosure, at least part of the first data lines DL1 may also be transferred to pad connection lines FA corresponding to the first data lines DL1 through interconnect lines TR. In other words, the display panel further includes interconnect lines TR electrically connected to at least part of the first data lines DL1 in one-to-one correspondence. In this way, the interconnect line TR are electrically connected to the second data lines DL2 and at least part of the first data lines DL1 in a one-to-one correspondence. The interconnect lines TR corresponding to the data lines DL are electrically connected to the pad connection lines FA corresponding to the data lines DL. Of course, if a first data line DL1 does not have a corresponding interconnect line TR, then the first data line DL1 may be directly electrically connected to a pad connection line FA.

When a source-drain metal layer has enough space to lay out enough interconnect lines TR, for example, when the resolution of the display panel is low (for example, PPI is less than 410), it is further possible to adjust the wiring sequence and positions of the pad connection lines FA, which is beneficial to preparation and optimization of the display panel. In one implementation of the present disclosure, the arrangement sequence of the pad connection lines FA corresponding to respective data lines DL is consistent with the arrangement sequence of the data lines DL. In this way, the structure of the external driving circuit can be simplified, for example, the structure of the driving chip can be simplified.

As follows, taking display panels with different pixel densities as examples, the arrangement of the interconnect lines TR provided by the present disclosure will be further explained and illustrated.

In a display panel of an example, driving circuits arranged in a same row may form a plurality of driving circuit groups, with two driving circuits forming one group. The two driving circuits in one driving circuit group may be arranged in a mirrored manner. Four driving circuit groups in two adjacent rows and two columns are used as one driving circuit island PDCC. In the display panel of this example, in order to meet requirements such as process requirements, the minimum size of the driving circuit group in the first direction H1 can reach 49 microns.

Taking half of the first display area AA1 on either side of the central axis MM of the display area AA as a layout area, the first display area AA1 is divided into two layout areas located on both sides of the central axis MM. In this example, only one of the layout areas is taken as an example to explain and illustrate the arrangement of the data lines DL and the interconnect lines TR in one layout area. In the two layout areas, the arrangements of the data lines DL and the interconnect lines TR may be symmetrical with respect to the central axis MM, or may be different. Preferably, in the two layout areas, the arrangements of the data lines DL and the interconnect lines TR may be symmetrical with respect to the central axis MM.

In this example, in one layout area, the number of data lines DL is n. An i-th data line DL is denoted as data line DL(i) in the order from outer side to inner side. In one layout area, the number of second data lines DL2 is x, and the number of first data lines DL1 is n–x. In other words, data lines DL(1)~DL(x) are the second data lines DL2, and data lines DL(x+1)~DL(n) are the first data lines DL1. In one layout area, the second interconnect section TR2 of the interconnect line TR connected to the data line DL(i) may be denoted as the second interconnect section TR(i).

In the display panel of a first example, the pixel density of the display panel is not higher than 410 PPI (Pixels Per Inch). The minimum size of the driving circuit group in the first direction H1 may be compressed to 49 microns. In this way, the width of the column gap DD of the driving circuit islands PDCC in the first direction H1 can reach more than 13 microns.

As shown in FIG. 18 and FIG. 19, the gap between the driving circuit island PDCC columns can accommodate up to six second interconnect sections TR2. Further, six second interconnect sections TR2 in one second interconnect section group TR2S are alternately distributed in the first source-drain metal layer LSD1 and the second source-drain metal layer LSD2 in sequence. It may be that the second interconnect sections of the first interconnect lines are arranged in the second source-drain metal layer LSD2, and at least part of the second interconnect sections of the second interconnect lines are arranged in the second source-drain metal layer LSD2.

Specifically, when the number of second data lines or the number of second interconnect sections that can be inserted between two columns of first data lines can be divisible by 2 or 4, depending on the size of the gap, referring to FIG. 18, the second interconnect sections of all the second interconnect lines are arranged in the second source-drain metal layer LSD1. Referring to FIG. 19, it may also be considered to arrange the second interconnect sections of the second interconnect lines in the first source-drain metal layer LSD2, and another part of the second interconnect sections are arranged in the second source-drain metal layer LSD2.

When the width of the column gap DD is large enough, both the second interconnect sections of the first interconnect lines and the second interconnect sections of the second interconnect lines may be arranged in the second source-drain metal layer LSD2.

In the display panel of this example, the lower ends of the first data lines DL1 are connected to corresponding pad connection lines FA so as to be connected to the bonding area. The lower ends of the second data lines DL2 are not connected to pad connection lines FA, but are connected to respective interconnect lines TR in one-to-one correspondence; the second interconnect sections TR2 of respective interconnect lines TR are arranged in the first display area AA1, and the ends (lower ends) of the interconnect sections TR2 close to the bonding end are connected to pad connection lines FA to be connected to the bonding area. At least part of the second interconnect sections TR2 are arranged in the gaps between the driving circuit islands PDCC.

As a further example, referring to FIG. 18 and FIG. 19, along a direction from the outer side to the inner side, the second interconnect sections TR2 and the first data lines DL1 in an layout area may be arranged in the following order: one second interconnect section group TR2S, four first data lines DL1, one second interconnect section group TR2S, four first data lines DL1, . . . , the last second interconnect section group TR2S, and the remaining first data line(s) DL1. Among them, except the last second interconnect section group TR2S, the other second interconnect section groups TR2S all have six second interconnect sections TR2; the number of the second interconnect sections TR2 in the last second interconnect section group TR2S does not exceed six.

For example, along the direction from the outer side to the inner side, the interconnect lines TR and the first data lines DL1 in one layout area may be arranged in the following order: second interconnect section TR(1)~second interconnect section TR(6), data line DL(x+1)~data line DL(x+4), second interconnect section TR(7)~second interconnect section TR(12), data line DL(x+5)~data line DL(x+8), . . . , second interconnect section TR(x), and the rest of the first data line(s) DL1.

For example, referring to FIG. 18, in a first case: the second interconnect section TR (1), the second interconnect section TR (3), and the second interconnect section TR (5) are the second interconnect sections of the second interconnect lines, and are arranged in the first source-drain metal layer LSD1; the second interconnect section TR(2), the second interconnect section TR(4), and the second interconnect section TR(6) are the second interconnect sections of the second interconnect lines, and are is arranged in the second source-drain metal layer LSD2. Referring to FIG. 19, a second case can also be used. The difference between the second case and the first case is that the second interconnect section TR(1) and the second interconnect section TR(3) are arranged in the second source-drain metal layer LSD2, and the second interconnect section TR(5) are arranged in the first source-drain metal layer LSD1.

In another implementation of the display panel of the first example, the number of interconnect lines TR may exceed the number of second data lines DL2, so that the interconnect lines TR are electrically connected to respective data lines DL in a one-to-one correspondence. In this way, the ends (lower ends) of the second data lines DL2 and the first data lines DL1 near the bonding end are not electrically connected to pad connection lines FA, but are electrically connected to the pad connection lines through electrically connected interconnect lines TR.

In this example, respective second interconnect sections TR2 may be arranged in the first display area AA1 and arranged in the same order as the respective connected data lines DL in the first direction H1. Specifically, in a layout area, along the direction from the outer side to the inner side, the second interconnect sections TR2 are arranged in the following order: second interconnect section TR(1), second interconnect section TR(2), second interconnect section TR(3), second interconnect section TR(4), . . . second interconnect section TR(n).

In the display panel of a second example, the pixel density of the display panel is between 410~425 PPI (Pixels Per Inch). The minimum size of the driving circuit group in the first direction H1 may be compressed to 49 microns. In this way, the column gap DD between the driving circuit islands PDCC in the first direction H1 can reach 10.8 μm to 12.2 μm. A gap between the driving circuit island PDCC columns can accommodate up to five second interconnect sections TR2.

Figure 17:
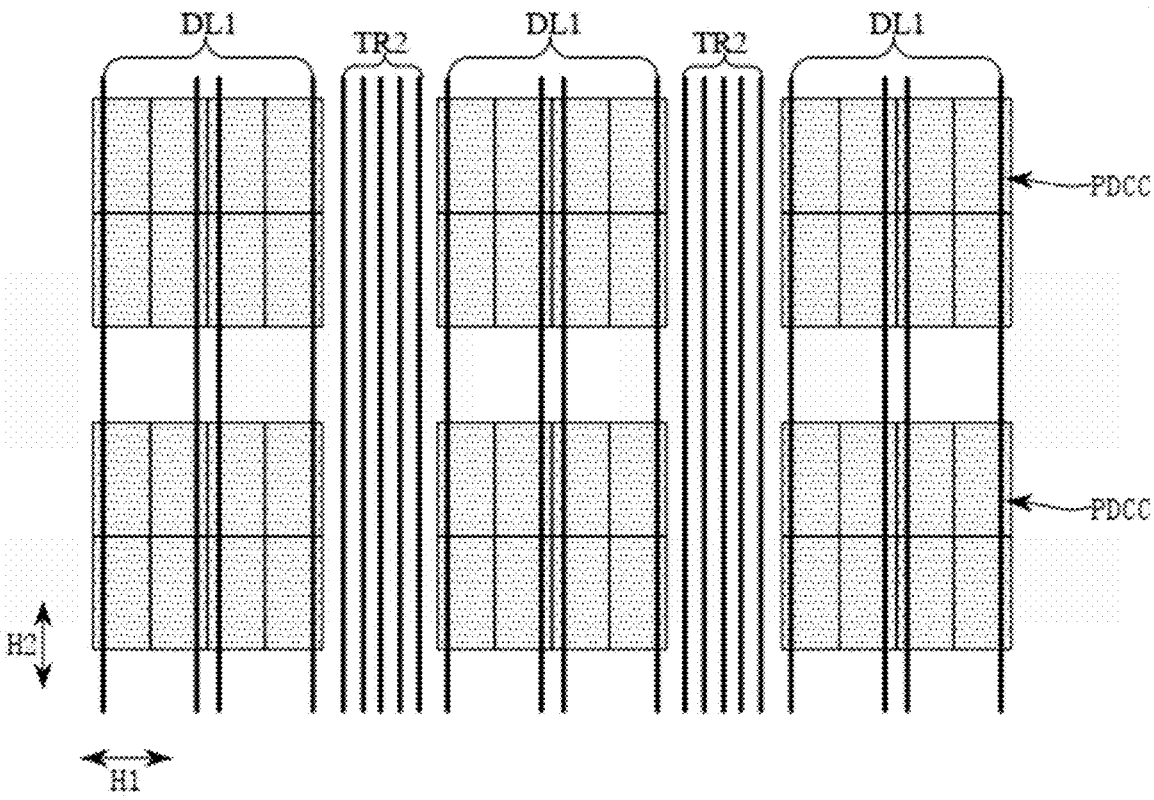
FIG. 17 is a schematic diagram showing a distribution of driving circuit islands and second interconnect lines in an implementation of the present disclosure.

In an optional manner, five second interconnect sections TR2 in one second interconnect section group TR2S may be alternately distributed in the first source-drain metal layer LSD1 and the second source-drain metal layer LSD2 in sequence. For example, two second interconnect sections are in the first source-drain metal layer LSD1 and three second interconnect sections are in the second source-drain metal layer LSD2, or three second interconnect sections are in the first source-drain metal layer LSD1 and two second interconnect sections are in the second source-drain metal layer LSD2. Referring to FIG. 17, the five second interconnect sections TR2 may all be arranged in the second source-drain metal layer LSD2.

In the display panel of this example, ends (lower ends) of the first data lines DL1 close to the bonding end are connected to pad connection lines FA so as to be connected to the bonding area. The ends of the second data lines DL2 close to the bonding area are not connected to pad connection lines FA, but are connected to respective interconnect lines TR in one-to-one correspondence; the second interconnect sections TR2 of respective interconnect lines TR are arranged in the first display area AA1, and the ends of the second interconnect sections TR2 close to the bonding end are connected to pad connection lines FA to be connected to the bonding area. At least part of the second interconnect sections TR2 are arranged in the gap between the driving circuit islands PDCC.

As a further example, along the direction from the outer side to the inner side, the interconnect lines TR and the first data lines DL1 in a layout area may be arranged in the following order: one second interconnect section group TR2S, four first data lines DL1, one second interconnect section group TR2S, four first data lines DL1, . . . , the last second interconnect section group TR2S, and the remaining first data line(s) DL1. Among them, except the last second interconnect section group TR2S, the other second interconnect section groups TR2S all have 5 second interconnect sections TR2; the number of the second interconnect sections TR2 in the last second interconnect section group TR2S does not exceed 5.

Exemplarily, along the direction from the outer side to the inner side, the interconnect lines TR and the first data lines DL1 in a layout area may be arranged in the following order: second interconnect section TR(1)~second interconnect section TR(5), data line DL(x+1)~data line DL(x+4), second interconnect section TR(6)~second interconnect section TR(10), data line DL(x+5)~data line DL(x+8), . . . , second interconnect section TR(x), and the remaining first data line(s) DL1.

Figure 16:
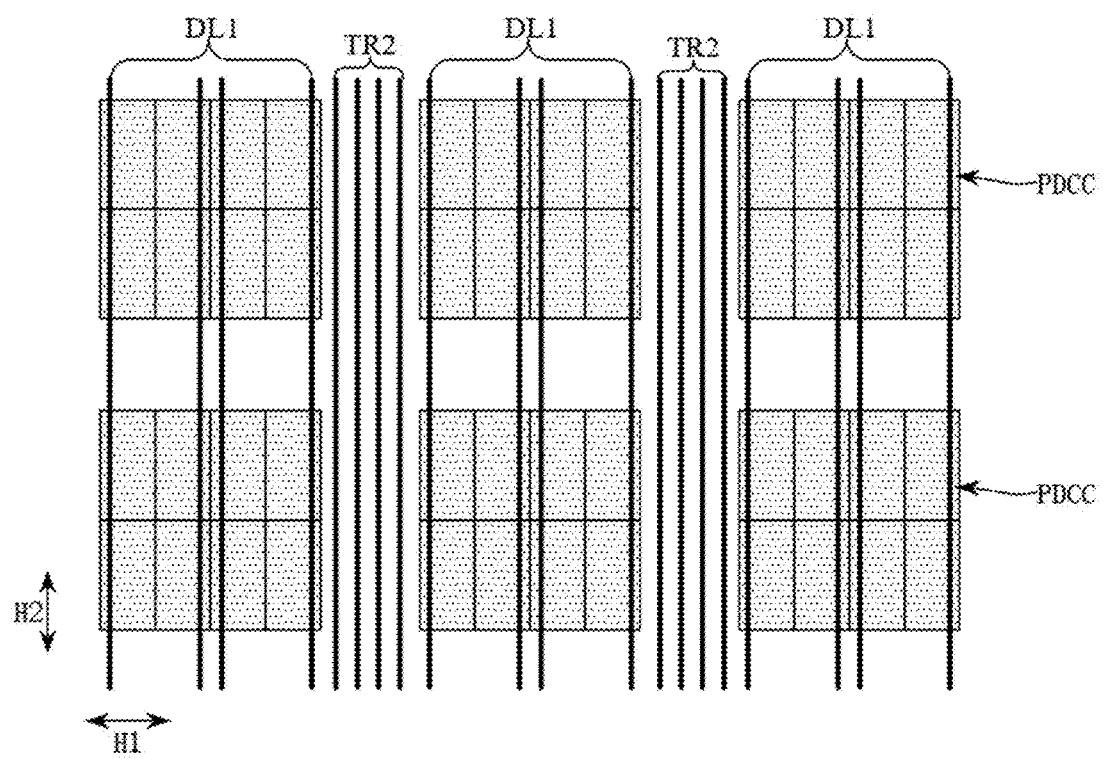
FIG. 16 is a schematic diagram showing a distribution of driving circuit islands and second interconnect lines in an implementation of the present disclosure.

In the display panel of a third example, the pixel density of the display panel is between 425~430 PPI (Pixels Per Inch). The minimum size of the driving circuit group in the first direction H1 may be compressed to 49 microns. In this way, the column gap DD between driving circuit islands PDCC in the first direction H1 can reach 10.1 microns. Referring to FIG. 16, the gap between the driving circuit island PDCC columns can accommodate up to four second interconnect sections TR2. In an optional manner, the four second interconnect sections TR2 may all be arranged in the second source-drain metal layer LSD2.

In the display panel of this example, ends of the first data lines DL1 close to the bonding end are connected to pad connection lines FA so as to be connected to the bonding area. The ends of the second data lines DL2 close to the bonding area are not connected to pad connection lines FA, but are connected to respective interconnect lines TR in one-to-one correspondence. The second interconnect sections TR2 of respective interconnect lines TR are arranged in the first display area AA1, and the ends of the second interconnect sections TR2 close to the bonding end are connected to pad connection lines FA to be connected to the bonding area. At least part of the second interconnect sections TR2 are arranged in the gaps between the driving circuit islands PDCC.

As a further example, along the direction from the outer side to the inner side, the interconnect lines TR and the first data lines DL1 in a layout area may be arranged in the following order: one second interconnect section group TR2S, four first data lines DL1, one second interconnect section group TR2S, four first data lines DL1, . . . , the last second interconnect section group TR2S, and the remaining first data line(s) DL1. Among them, except the last second interconnect section group TR2S, the other second interconnect section groups TR2S all have 4 second interconnect sections TR2; the number of the second interconnect sections TR2 in the last second interconnect section group TR2S does not exceed 4.

Exemplarily, along the direction from the outer side to the inner side, the interconnect lines TR and the first data lines DL1 in a layout area may be arranged in the following order: second interconnect section TR(1)~second interconnect section TR(4), data line DL(x+1)~data line DL(x+4), second interconnect section TR(5)~second interconnect section TR(8), data line DL(x+5)~data line DL(x+8), . . . , second interconnect section TR(x), and the remaining first data line(s) DL1.

Figure 15:
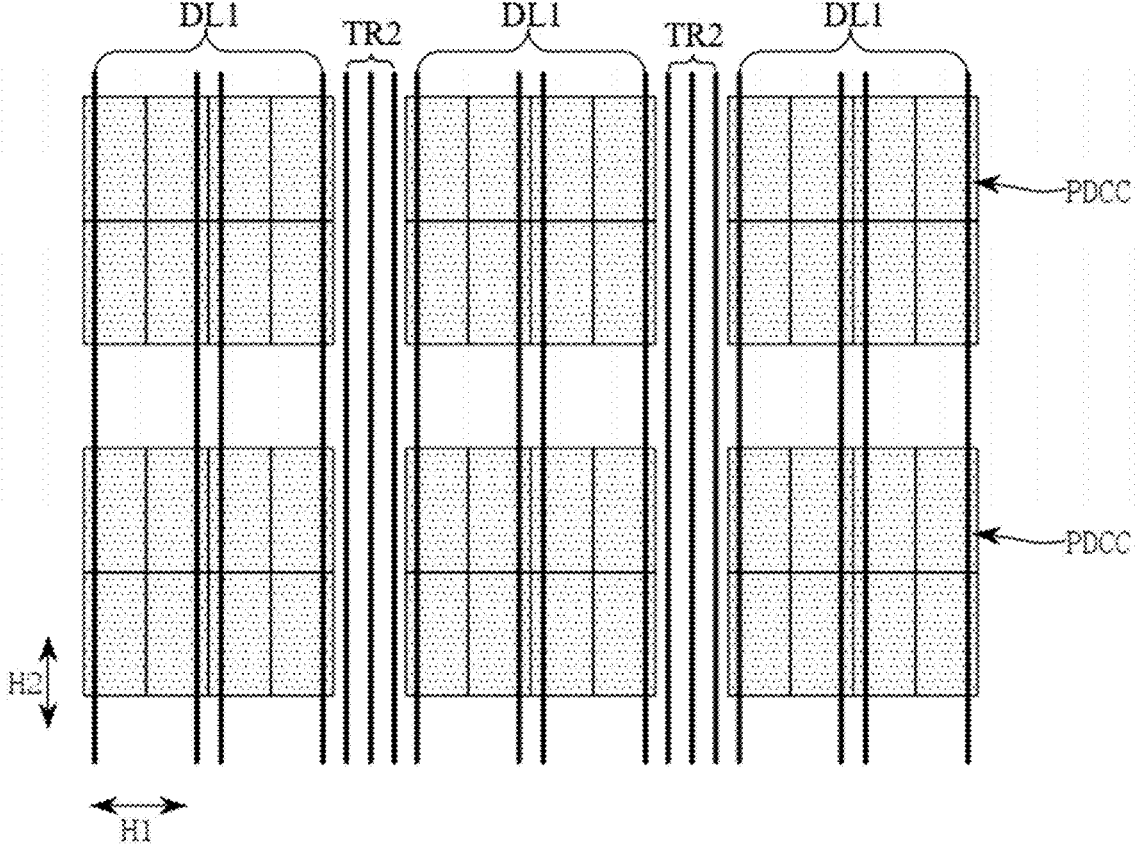
FIG. 15 is a schematic diagram showing a distribution of driving circuit islands and second interconnect lines in an implementation of the present disclosure.

In the display panel of a fourth example, the pixel density of the display panel is between 430-450 PPI (Pixels Per Inch). The minimum size of the driving circuit group in the first direction H1 can be compressed to 49 microns. In this way, the column gap DD between driving circuit islands PDCC in the first direction H1 can reach 7.4 microns. Referring to FIG. 15, the gap between the driving circuit island PDCC columns can accommodate up to three second interconnect sections TR2. In an optional manner, the three second interconnect sections TR2 may all be arranged in the second source-drain metal layer LSD2.

In the display panel of this example, ends of the first data lines DL1 close to the bonding end are connected to pad connection lines FA so as to be connected to the bonding area. The ends of the second data lines DL2 close to the bonding area are not connected to pad connection lines FA, but are connected to respective interconnect lines TR in one-to-one correspondence; the second interconnect sections TR2 of respective interconnect lines TR are arranged in the first display area AA1, and the ends of the second interconnect sections TR2 close to the bonding end are connected to pad connection lines FA to be connected to the bonding area. At least part of the second interconnect sections TR2 are arranged in the gaps between the driving circuit islands PDCC.

As a further example, along the direction from the outer side to the inner side, the interconnect lines TR and the first data lines DL1 in a layout area may be arranged in the following order: one second interconnect section group TR2S, four first data lines DL1, one second interconnect section group TR2S, four first data line lines DL1, . . . , the last second interconnect section group TR2S, and the remaining first data line line(s) DL1. Among them, except the last second interconnect section group TR2S, the other second interconnect section groups TR2S all have 3 second interconnect sections TR2; the number of the second interconnect sections TR2 in the last second interconnect section group TR2S does not exceed 3.

Exemplarily, along the direction from the outer side to the inner side, the interconnect lines TR and the first data lines DL1 in a layout area may be arranged in the following order: second interconnect section TR(1)~second interconnect section TR(3), data line DL(x+1)~data line DL(x+4), second interconnect section TR(4)~second interconnect section TR(6), data line DL(x+5)~data line DL(x+8), . . . , second interconnect section TR(x), and the remaining first data line(s) DL1.

Figure 14:
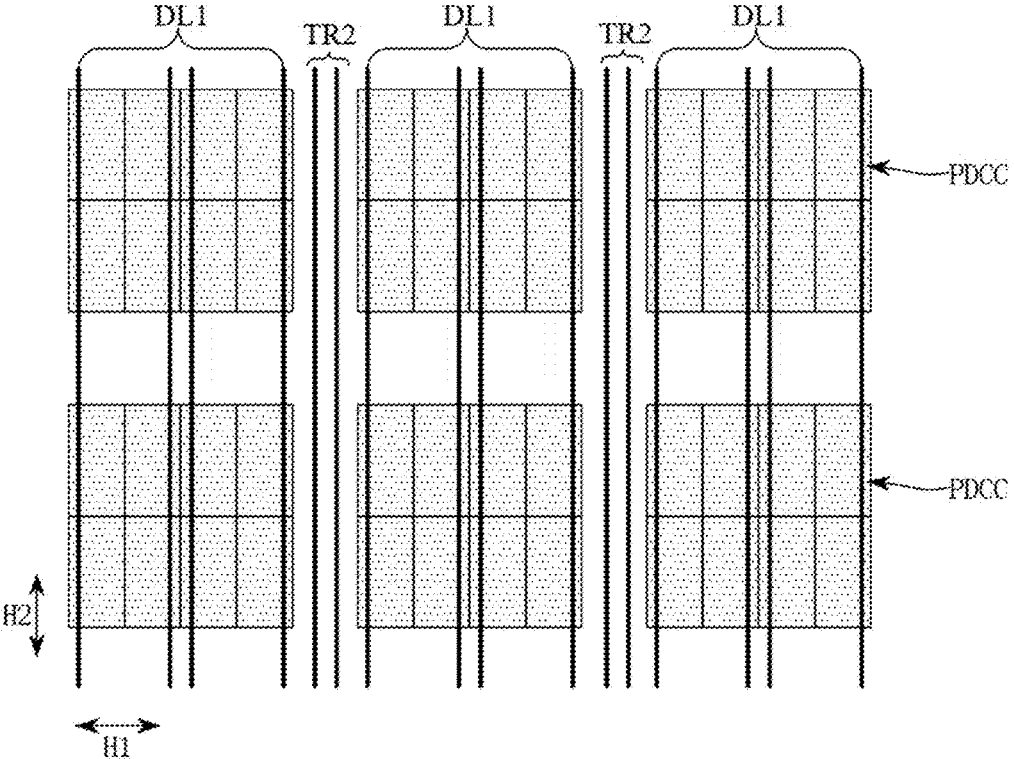
FIG. 14 is a schematic diagram showing a distribution of driving circuit islands and second interconnect lines in an implementation of the present disclosure.

In the display panel of a fifth example, the pixel density of the display panel is between 450-465 PPI (Pixels Per Inch). The minimum size of the driving circuit group in the first direction H1 can be compressed to 49 microns. In this way, the column gap DD between the driving circuit islands PDCC in the first direction H1 can reach 5.6 microns. Referring to FIG. 14, the gap between the driving circuit island PDCC columns can accommodate at most two second interconnect sections TR2. In an optional manner, the two second interconnect sections TR2 may both be arranged in the second source-drain metal layer LSD2.

In the display panel of this example, ends of the first data lines DL1 close to the bonding end are connected to pad connection lines FA so as to be connected to the bonding area. The ends of the second data lines DL2 close to the bonding area are not connected to pad connection lines FA, but are connected to respective interconnect lines TR in one-to-one correspondence; the second interconnect sections TR2 of respective interconnect lines TR are arranged in the first display area AA1, and the ends of the second interconnect sections TR2 close to the bonding end are connected to pad connection lines FA to be connected to the bonding area. At least part of the second interconnect section TR2 are arranged in the gaps between the driving circuit islands PDCC.

As a further example, along the direction from the outer side to the inner side, the interconnect lines TR and the first data lines DL1 in a layout area may be arranged in the following order: one second interconnect section group TR2S, four first data lines DL1, one second interconnect section group TR2S, four first data lines DL1, . . . , the last second interconnect section group TR2S, and the remaining first data line(s) DL1. Among them, except the last second interconnect section group TR2S, the other second interconnect section groups TR2S all have 3 second interconnect sections TR2; the number of the second interconnect sections TR2 in the last second interconnect section group TR2S does not exceed 3.

Exemplarily, along the direction from the outer side to the inner side, the interconnect lines TR and the first data lines DL1 in a layout area may be arranged in the following order: second interconnect section TR(1)~second interconnect section TR(2), data line DL(x+1)~data line DL(x+4), second interconnect section TR(3)~second interconnect section TR(4), data line DL(x+5)~data line DL(x+8), . . . , second interconnect section TR(x), and the remaining first data line(s) DL1.

Figure 13:
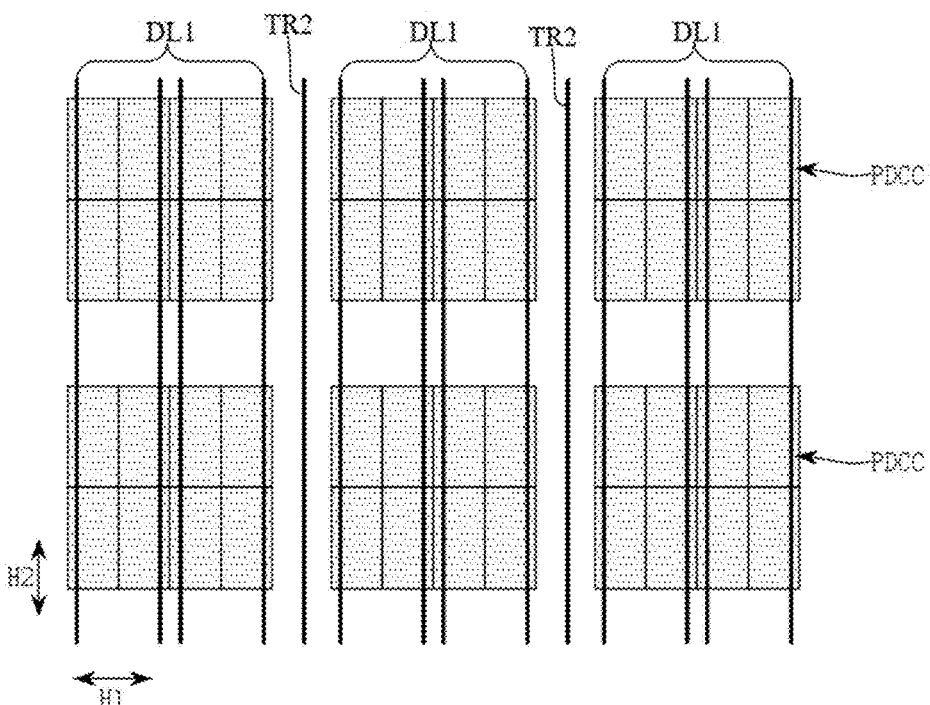
FIG. 13 is a schematic diagram showing a distribution of driving circuit islands and second interconnects line in an implementation of the present disclosure.

In the display panel of a fifth example, the pixel density of the display panel is between 465-490 PPI (Pixels Per Inch). The minimum size of the driving circuit group in the first direction H1 can be compressed to 49 microns. In this way, the gap between the driving circuit islands PDCC in the first direction H1 can reach 2.8 microns. Referring to FIG. 13, the gap between the driving circuit island PDCC columns can accommodate at most one second interconnect section TR2, and the second interconnect section TR2 may be arranged in the second source-drain metal layer LSD2.

In the display panel of this example, ends of the first data lines DL1 close to the bonding end are connected to pad connection lines FA so as to be connected to the bonding area. The ends of the second data lines DL2 close to the bonding area are not connected to pad connection lines FA, but are connected to respective interconnect lines TR in one-to-one correspondence; the second interconnect sections TR2 of respective interconnect lines TR are arranged in the first display area AA1, and the ends of the second interconnect sections TR2 close to the bonding end are connected to pad connection lines FA to be connected to the bonding area. At least part of the second interconnect sections TR2 are arranged in the gaps between the driving circuit islands PDCC.

As a further example, along the direction from the outer side to the inner side, the interconnect lines TR and the first data lines DL1 in a layout area may be arranged in the following order: one second interconnect section group TR2S, four first data lines DL1, one second interconnect section group TR2S, four first data lines DL1, . . . , the last second interconnect section group TR2S, and the remaining first data line(s) DL1. Each second interconnect section group TR2S has only one second interconnect section TR2.

Exemplarily, along the direction from the outer side to the inner side, the interconnect lines TR and the first data lines DL1 in a layout area may be arranged in the following order: second interconnect section TR(1), data line DL(x+1)~data line DL(x+4), second interconnect section TR(2), data line DL(x+5)~data line DL(x+8), . . . , second interconnect section TR(x), and data line DL(5x−3)~data line DL(n).

In another possible implementation of the display panel of this example, the number of the interconnect lines TR exceeds the number of the second data lines DL2, so that the interconnect lines TR are electrically connected to respective data lines DL in a one-to-one correspondence. In this way, the ends of the second data lines DL2 and the first data lines DL1 near the bonding end are not electrically connected to pad connection lines FA, but are electrically connected to the pad connection lines FA through electrically connected interconnect lines TR. In this example, respective second interconnect sections TR2 may be arranged in the first display area AA1 and arranged in the same order as the respective connected data lines DL in the first direction H1. Specifically, in a layout area, along the direction from the outer side to the inner side, the second interconnect sections TR2 are arranged in the following order: second interconnect section TR(1), second interconnect section TR(2), second interconnect section TR(3), second interconnect section TR(4), . . . , second interconnect section TR(n).

In implementations of the present disclosure, the first display area AA1 may include two layout areas respectively located on both sides of the central axis MM; the central axis MM extends along the second direction H2. In one implementation of the present disclosure, the interconnect lines TR and the first data lines DL1 are arranged symmetrically with respect to the central axis MM.

In implementations of the present disclosure, referring to FIG. 3, respective second interconnect sections TR2 may be arranged as a plurality of second interconnect section groups TR2S. Respective second interconnect sections TR2 in any one second interconnect section group TR2S are located between two adjacent driving circuit island PDCC columns (that is, in the same column gap DD). Any two adjacent second interconnect section groups TR2S are isolated by a driving circuit island PDCC column. Any one second interconnect section group TR2S includes one or more second interconnect sections TR2.

Referring to FIGS. 3 to 5, it can be seen that respective second interconnect sections TR2 in a second interconnect section group TR2S are located between two adjacent data lines DL, for example, between the data line DL (m) numbered m and the data line DL(m+1) numbered m+1. In one implementation of the present disclosure, the number of second interconnect sections TR2 in any one second interconnect section group TR2S does not exceed six. In other words, the number of second interconnect sections TR2 between two adjacent driving circuit island PDCC columns does not exceed six.

In one implementation of the present disclosure, a plurality of second interconnect sections are arranged as a plurality of second interconnect section groups. Each second interconnect section group includes at least two adjacent second interconnect sections. A plurality of first data lines are arranged as a plurality of first data line groups. Each first data line group includes a plurality of adjacent first data lines. In at least part of the first display area, the first data line groups and the second interconnect section groups are arranged alternately one by one.

In one implementation of the present disclosure, in at least one layout area, the number of second interconnect sections TR2 of each second interconnect section group TR2S is the same. In another implementation of the present disclosure, in at least one layout area, one of the second interconnect section groups TR2S has a smaller number of second interconnect sections TR2, and the remaining second interconnect section groups TR2S have more and the same number of second interconnect sections TR2.

For example, on the same side of the central axis MM, the outermost or innermost second interconnect section group TR2S has fewer second interconnect sections TR2, and the remaining second interconnect section groups TR2S contain more and the same number of second interconnect sections TR2. Of course, in other implementations of the present disclosure, the number of second interconnect sections TR2 in each second interconnect section group TR2S may be set independently according to needs, and the number of second interconnect sections TR2 in any two second interconnect section groups TR2S may be the same or different.

Figure 20:
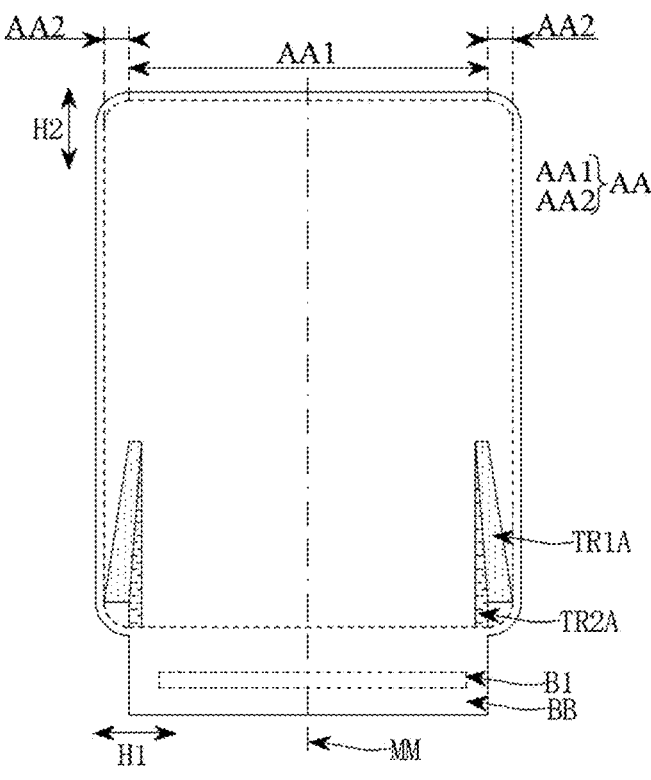
FIG. 20 is a schematic diagram of positions of a wiring area of at least one first interconnect line and a wiring area of at least one second interconnect line in an implementation of the present disclosure.
Figure 21:
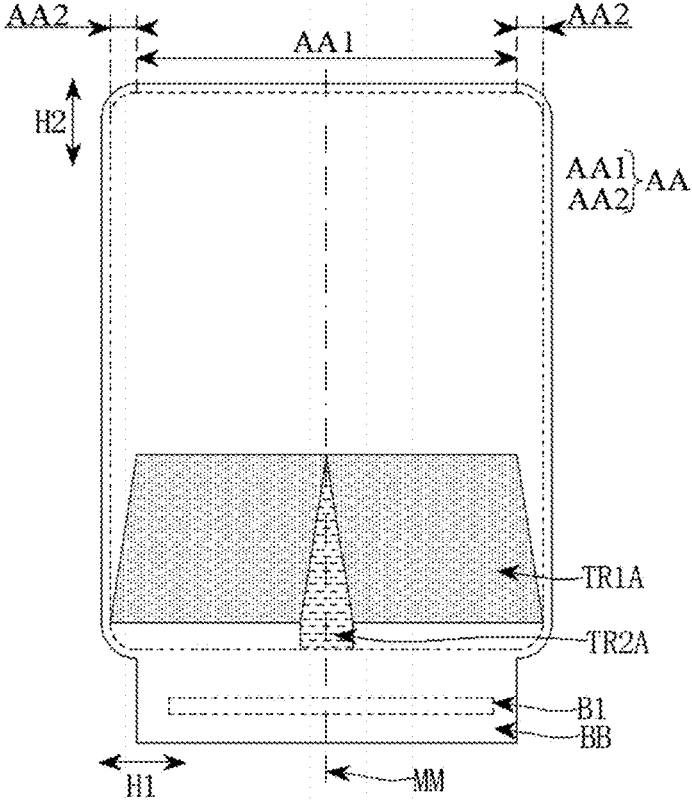
FIG. 21 is a schematic diagram of positions of a wiring area of at least one first interconnect line and a wiring area of at least one second interconnect line in an implementation of the present disclosure.
Figure 22:
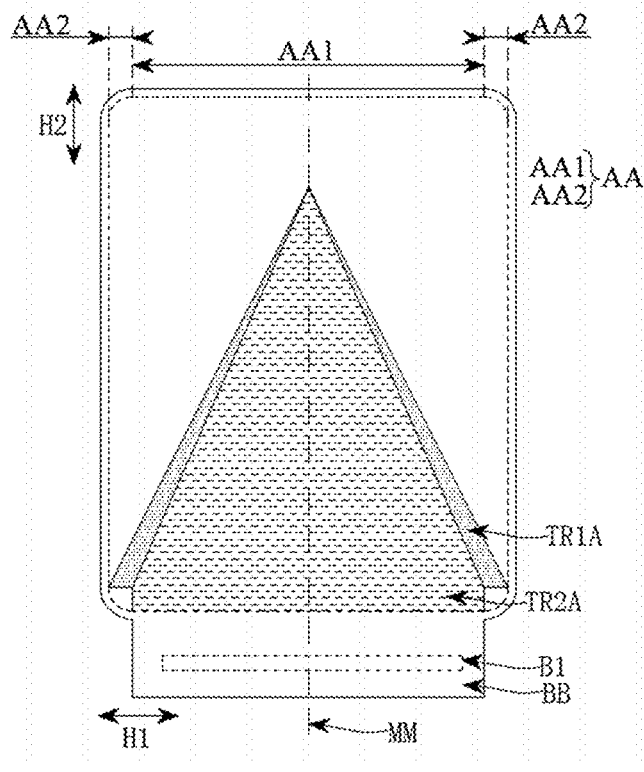
FIG. 22 is a schematic diagram of positions of a wiring area of at least one first interconnect line and a wiring area of at least one second interconnect line in an implementation of the present disclosure.

In implementations of the present disclosure, in at least one layout area, referring to FIG. 20 to FIG. 22, an area where second interconnect section groups TR2S are distributed may be defined as a second interconnect area TR2A.

In some implementations, in a second interconnect area TR2A, along the first direction H1, driving circuit island PDCC columns and second interconnect section groups TR2S are sequentially arranged at intervals. In this way, the size of the second interconnect area TR2A in the first direction H1 can be compressed. The start position or end position of the second interconnect section group TR2S may be adjusted as required.

In one implementation of the present disclosure, referring to FIG. 20, the starting position of a second interconnect area TR2A (that is, the starting position where the second interconnect section groups TR2S are arranged from the outer side to the inner side) may be close to the outer side of the first display area AA1. For example, in at least one layout area, the outermost second interconnect section group TR2S is arranged adjacent to the outermost driving circuit island PDCC column. As an example, the outermost second interconnect section group TR2S is located at outer side of the outermost first data line DL1.

In another implementation of the present disclosure, referring to FIG. 21, the end position of a second interconnect area TR2A (that is, the end position where the second interconnect section groups TR2S are arranged from the outer side to the inner side) may be close to the central axis MM of the first display area AA1. For example, in at least one layout area, the innermost second interconnect section group TR2S is arranged adjacent to the innermost driving circuit island PDCC column.

In another implementation of the present disclosure, referring to FIG. 22, in at least one layout area, the second interconnect area TR2A may be distributed throughout the layout area. In other words, in at least one layout area, the second interconnect section groups TR2S may be uniformly or non-uniformly distributed in the layout area along the first direction H1. As an example, respective second interconnect section groups TR2S are distributed in the first display area AA1 along the first direction H1.

In implementations of the present disclosure, respective first interconnect sections TR1 may be arranged as a plurality of first interconnect section groups TR1S. Respective first interconnect sections TR1 in any first interconnect section group TR1S are located in between two adjacent driving circuit island PDCC rows (that is, in the same row gap CC) and are in the same layout area. Any two adjacent first interconnect section groups TR1S are isolated by a driving circuit island PDCC row. Any one first interconnect section group TR1S includes one or more first interconnect sections TR1.

In one implementation of the present disclosure, the number of first interconnect sections TR1 in any first interconnect section group TR1S is no more than three. In other words, the number of the first interconnect sections TR1 between two adjacent driving circuit island PDCC rows is no more than three.

In one implementation of the present disclosure, in at least one layout area, the number of first interconnect sections TR1 of each first interconnect section group TR1S is the same. In another implementation of the present disclosure, in at least one layout area, one of the first interconnect section groups TR1S has a smaller number of first interconnect sections TR1, and the remaining first interconnect section groups TR1S have more and the same number of first interconnect sections TR1. Exemplarily, on the same side of the central axis MM, a first interconnect section group TR1S closest to the pad connection lines FA or farthest from the pad connection lines FA has fewer first interconnect sections TR1, and the rest first interconnect section groups TR1S include more and the same number of first interconnect sections TR1. Of course, in other implementations of the present disclosure, the number of first interconnect sections TR1 in each first interconnect section group TR1S may be independently set as required, and number of first interconnect sections TR1 in any two first interconnect section groups TR1S may be the same or different.

In implementations of the present disclosure, in at least one layout area, referring to FIG. 20 to FIG. 22, an area in which respective first interconnect section groups TR1S are distributed may be defined as a first interconnect area TR1A. In some implementations, in a first interconnect area TR1A, along the second direction H2, driving circuit island PDCC rows and first interconnect section groups TR1S are sequentially arranged at intervals. In this way, the size of the first interconnect area in the second direction H2 can be compressed.

A specific structure of a display panel is taken as an example to further explain and illustrate below the structure and principle of the display panel of the present disclosure. It can be understood that, in the display panel of the present disclosure, the structure of the driving circuit may be other than this example, as long as the sub-pixels can be driven.

Figure 23:
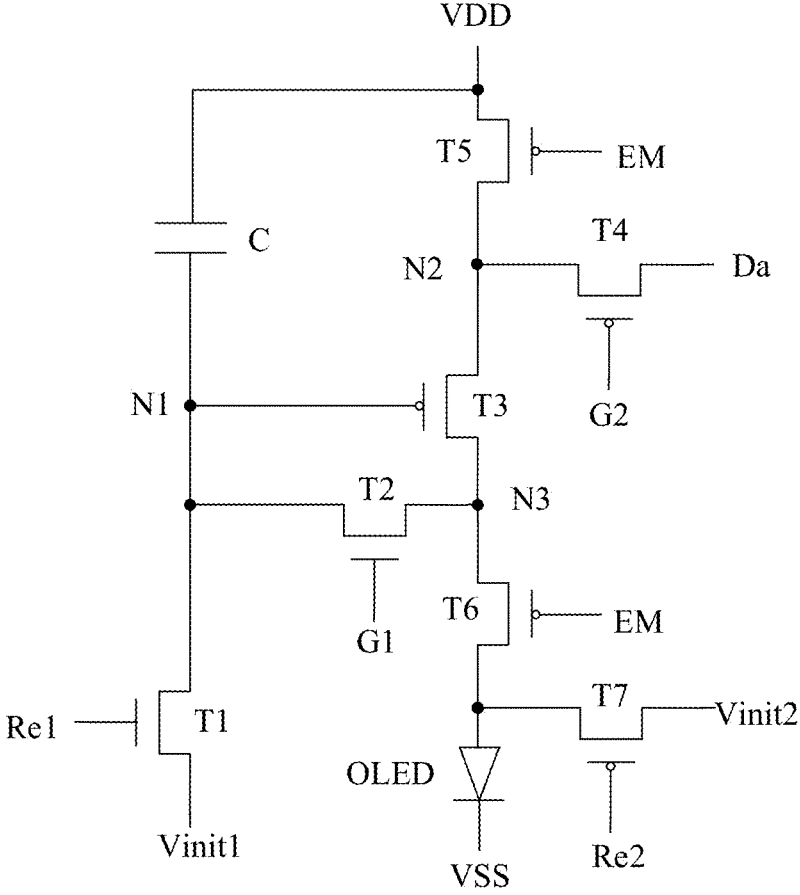
FIG. 23 is an equivalent circuit diagram of a driving circuit in an implementation of the present disclosure.

In the display panel of this example, referring to FIG. 23, a driving circuit may include a capacitor reset transistor T1, a threshold compensation transistor T2, a driving transistor T3, a data writing transistor T4, a first light-emitting control transistor T5, a second light-emitting control transistor T6 and an electrode reset transistor T7, and further include a storage capacitor C.

Among them, the capacitor reset transistor T1 and the threshold compensation transistor T2 are N-type thin film transistors, such as metal oxide thin film transistors; the other transistors TFT are P-type thin film transistors, such as low-temperature polysilicon thin film transistors.

Referring to FIG. 23, a source of the capacitor reset transistor T1 is used to load a capacitor reset voltage Vinit1, a gate of the capacitor reset transistor T1 is used to load a capacitor reset control signal Re1, and a drain of the capacitor reset transistor T1 is connected to the first node N1. The capacitor reset transistor T1 is used to load the capacitor reset voltage Vinit1 to the first node N1 in response to the capacitor reset control signal Re1. A source of the threshold compensation transistor T2 is electrically connected to a third node N3, a drain of the threshold compensation transistor T2 is electrically connected to the first node N1, and a gate of the threshold compensation transistor T2 is used to load a first scan signal G1. The threshold compensation transistor T2 is used to be turned on in response to the first scan signal G1 to write a threshold voltage of the driving transistor T3 into the first node N1. A source of the driving transistor T3 is connected to a second node N2, a drain of the driving transistor T3 is connected to a third node N3, and a gate of the driving transistor T3 is connected to the first node N1. A source of the data writing transistor T4 is used to load a driving data signal Da, a drain of the data writing transistor T4 is electrically connected to the second node N2, and a gate of the data writing transistor T4 is used to load a second scan signal G2. The data writing transistor T4 is used to load the driving data signal Da to the second node N2 in response to the second scan signal G2. A source of the first light-emitting control transistor T5 is used to load a power supply voltage VDD, a drain of the first light-emitting control transistor T5 is connected to the second node N2, and a gate of the first light-emitting control transistor T5 is used to load an enable signal EM. A source of the second light-emitting control transistor T6 is connected to the third node N3, a drain of the second light-emitting control transistor T6 is connected to a sub-pixel (the organic electroluminescent diode OLED is taken as an example in FIG. 23), and a gate of the second light-emitting control transistor T6 is used to load the enable signal EM. The first light-emitting control transistor T5 and the second light-emitting control transistor T6 are configured to be turned on in response to the enable signal EM. A source of the electrode reset transistor T7 is used to load an electrode reset voltage Vinit2, a drain of the electrode reset transistor T7 is connected to the light-emitting element, and a gate of the electrode reset transistor T7 is used to load an electrode reset control signal Re2. The electrode reset transistor T7 is used to, in response to the electrode reset control signal Re2, load the electrode reset voltage Vinit2 to the light-emitting unit. The pixel electrodes of the light-emitting element is electrically connected to the driving circuit, and the common electrode is used for loading a common voltage VSS. One end of the storage capacitor C is connected to the first node N1, and the other end is used to load the power supply voltage VDD.

Figure 24:
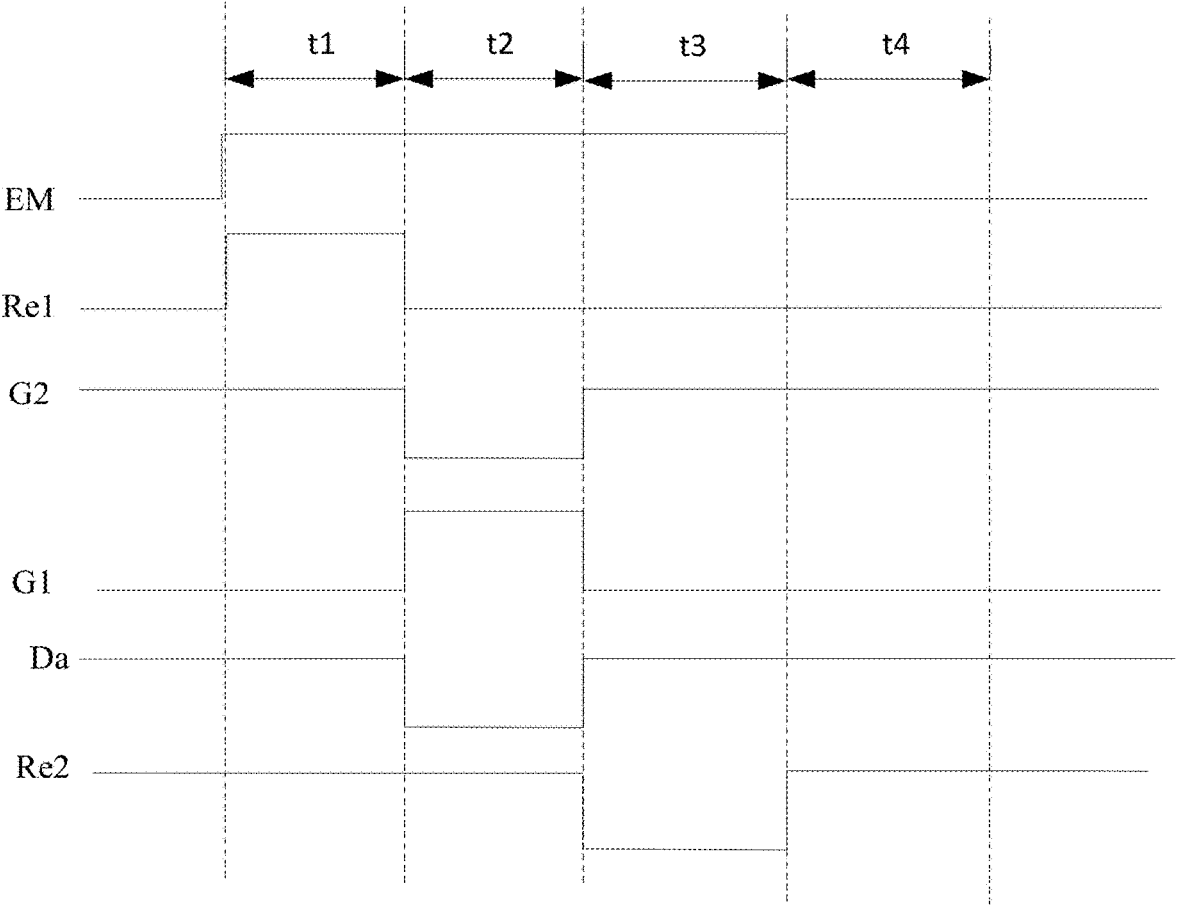
FIG. 24 is a schematic driving timing diagram of a driving circuit in an implementation of the present disclosure.

FIG. 24 is a schematic driving timing diagram of a driving circuit in this example. In FIG. 24, G1 represents the timing of the first scan signal G1, G2 represents the timing of the second scan signal G2, Re1 represents the timing of the capacitor reset control signal Re1, Re2 represents the timing of the electrode reset control signal Re2, EM represents the timing of the enable signal EM, and Da represents the timing of driving data signal Da.

The pixel driving circuit may work in four stages, namely, a capacitor reset stage t1, a threshold compensation stage t2, an electrode reset stage t3, and a light-emitting stage t4.

In the capacitor reset stage t1, the capacitor reset signal Re1 is a high-level signal, the capacitor reset transistor T1 is turned on, and the capacitor reset voltage Vinit1 is loaded to the first node N1. Under the control of the first node N1, the driving transistor T3 is turned on.

In the threshold compensation stage t2, the first scan signal G1 is a high-level signal, the second scan signal G2 is a low-level signal, the data writing transistor T4 and the threshold compensation transistor T2 are turned on, and the data writing transistor T4 writes the voltage Vdata of the driving data signal Da into the second node N2, and finally the first node N1 is charged to a voltage of Vdata+Vth, where Vth is the threshold voltage of the driving transistor T3.

In the electrode reset stage t3, the electrode reset control signal Re2 is a low-level signal, the electrode reset transistor T7 is turned on, and the electrode reset transistor T7 loads the capacitor reset voltage Vinit2 to the pixel electrode of the light-emitting element.

In the light-emitting stage t4, the enable signal EM is a low-level signal, the first light-emitting control transistor T5 and the second light-emitting control transistor T6 are turned on, and the driving transistor T3 outputs a driving current under the control of the first node N1 to drive the light-emitting element to emit light. According to the driving transistor output current formula $I=(\mu WCox/2L)(Vgs-Vth)^2$, where $\mu$ the carrier mobility; Cox is the gate capacitance per unit area, W is the width of the channel of the driving transistor, L is the length of the channel of the driving transistor, Vgs is the gate-source voltage difference of the driving transistor, and Vth is the threshold voltage of the driving transistor, the output current I of the driving transistor in the pixel driving circuit of the present disclosure is $I=(\mu WCox/2L)(Vdata+Vth-Vdd-Vth)^2$. The pixel driving circuit can avoid the influence of the threshold of the driving transistor on its output current.

Referring to FIG. 1, the display panel of an example may include a base substrate BP, a light-shielding layer LBSM, a first insulating buffer layer Buff1, a low-temperature polysilicon semiconductor layer LPoly, a first gate insulating layer LGI1, a first gate layer LG1, a second insulating buffer layer Buff2 (such as silicon nitride, silicon oxide or other inorganic layers), a second gate layer LG2, a second gate insulating layer LGI2, a metal oxide semiconductor layer LOxide, a third gate insulating layer LGI3, a third gate layer LG3, an interlayer dielectric layer ILD, a first source-drain metal layer LSD1, a passivation layer PVX, a first planarization layer PLN1, a second source-drain metal layer LSD2, a second planarization layer PLN2, a pixel electrode layer LA n, a pixel definition layer PDL, an organic light-emitting functional layer LEL, a common electrode layer LCOM and a thin film encapsulation layer TFE.

Referring to FIG. 25 to FIG. 42, a driving circuit island PDCC may include eight driving circuit areas PDCA arranged in two rows and four columns. A wiring space PDCG is formed between driving circuit islands PDCC. The wiring space PDCG includes a row gap CC between two adjacent driving circuit island PDCC rows and a column gap DD between two adjacent driving circuit island PDCC columns. A first interconnect section TR1 is arranged in a row gap CC, and a second interconnect section TR2 is arranged in a column gap DD.

Referring to FIGS. 25 to 42, the driving circuits are arranged as a plurality of driving circuit groups, each driving circuit group includes two driving circuits which are adjacent in the first direction, and the two driving circuits are mirrored.

The film layer structure of one example of the driving circuit is further introduced as follows.

Figure 25:
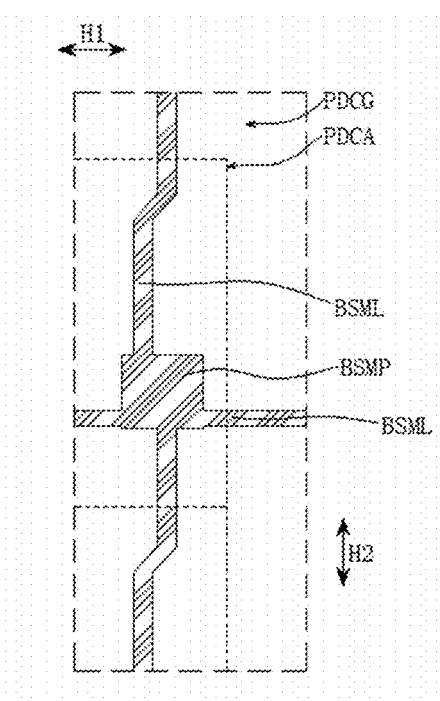
FIG. 25 is a schematic diagram of a local structure of a light-shielding layer in a driving circuit area in an implementation of the present disclosure.
Figure 26:
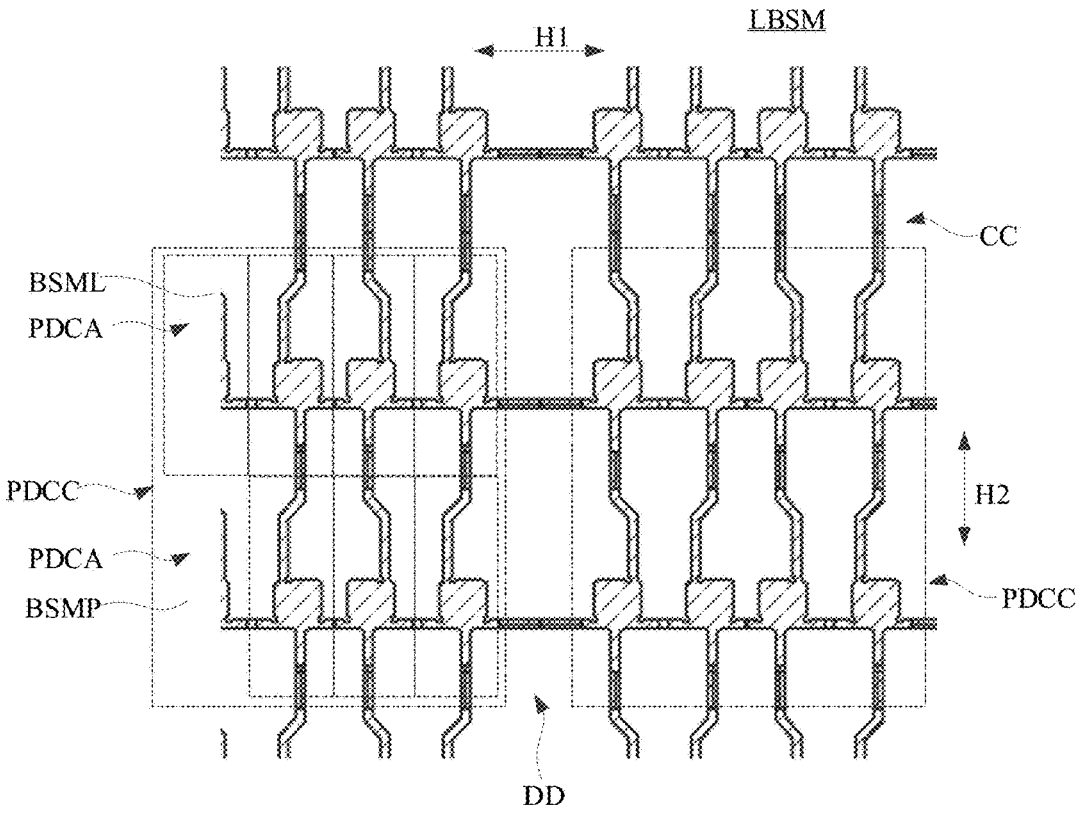
FIG. 26 is a schematic diagram of a local structure of a light-shielding layer in a display area in an implementation of the present disclosure.

Referring to FIGS. 25 and 26, the light-shielding layer LBSM has light-shielding blocks BSMP corresponding to the channel areas T3A of respective driving transistors T3 one to one, and light-shielding lines BSML connecting the respective light-shielding blocks BSMP. A light-shielding block BSMP may overlap with a corresponding channel area T3A of a driving transistor T3 to shield the light irradiated to the channel area T3A of the driving transistor T3, so as to keep the electrical characteristics of T3 stable. The light-shielding lines BSML are arranged along the first and second directions and connect adjacent light-shielding blocks BSMP, so that the light-shielding layer LBSM is meshed as a whole. In one implementation of the present disclosure, the material of the light-shielding layer LBSM is metal, so that the light-shielding layer LBSM can also have an electromagnetic shielding effect.

Figure 27:
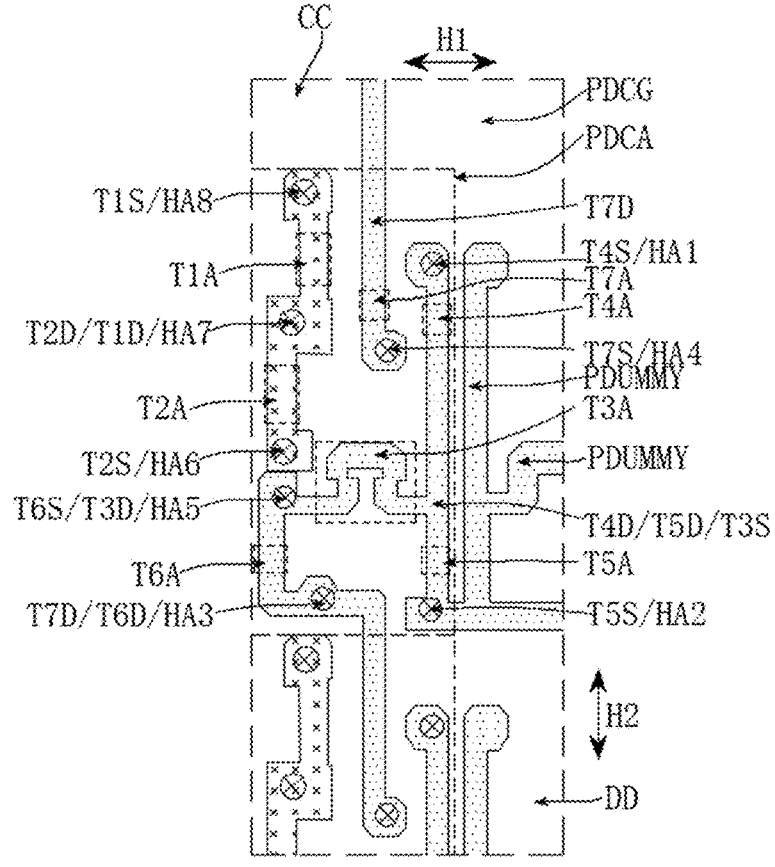
FIG. 27 is a schematic diagram of a local structure of a low-temperature polysilicon semiconductor layer and a metal oxide semiconductor layer in a driving circuit area in an implementation of the present disclosure.
Figure 28:
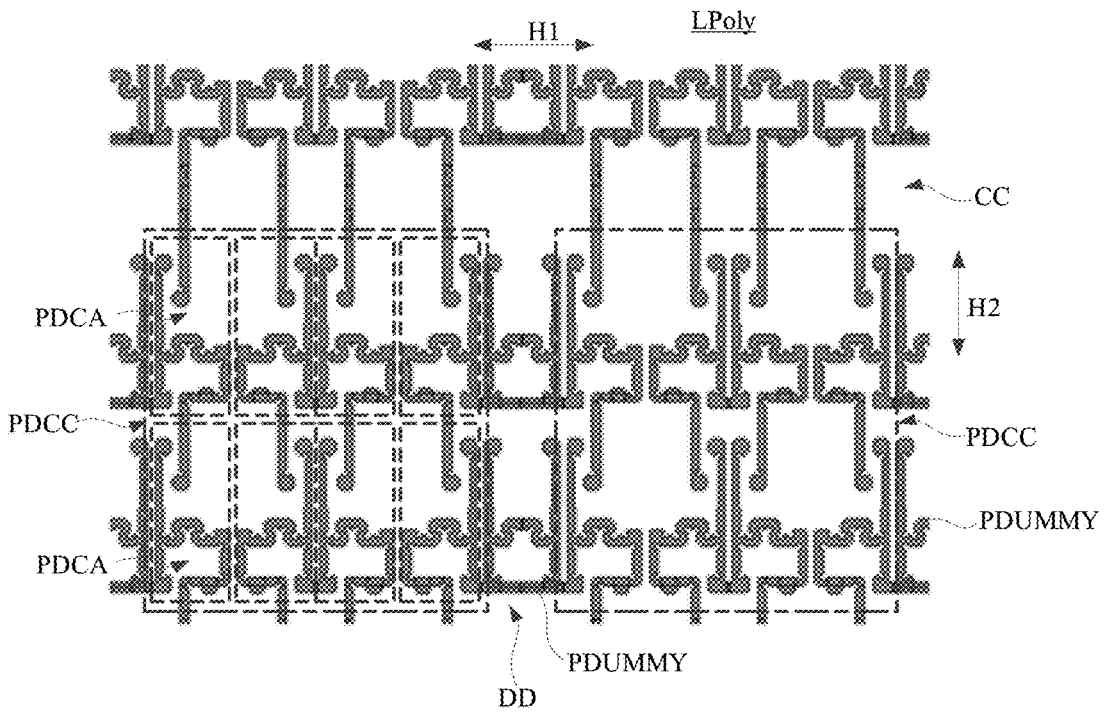
FIG. 28 is a schematic diagram of a local structure of a low-temperature polysilicon semiconductor layer in a display area in an implementation of the present disclosure.
Figure 40:
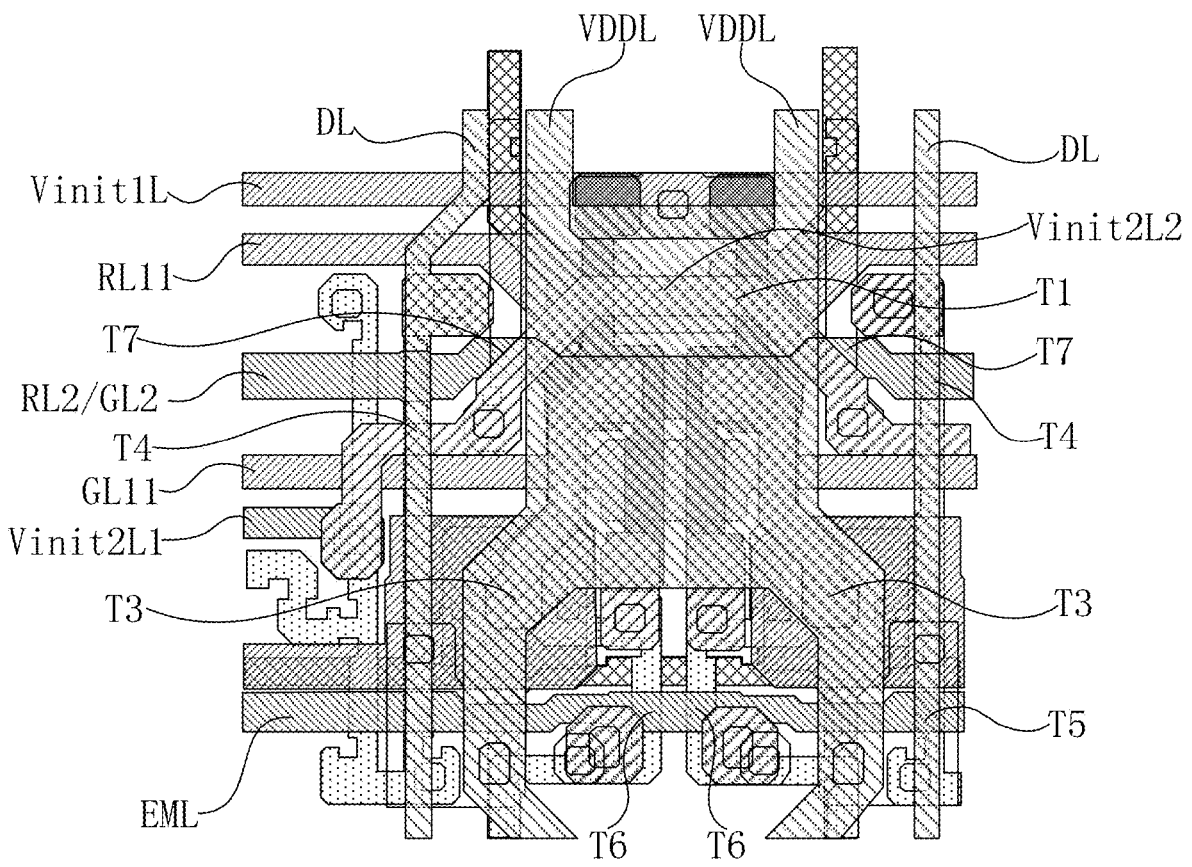
FIG. 40 is a structural layout of an area of a display panel in an implementation of the present disclosure.

Referring to FIG. 27, FIG. 28 and FIG. 40, the low-temperature polysilicon semiconductor layer LPoly is provided with sources, drains and channel areas of transistors such as the driving transistor T3, the data writing transistor T4, the first light-emitting control transistor T5, the second light-emitting control transistor T6, and the electrode reset transistor T7. The channel area T4A of the data writing transistor T4 and the channel area T5A of the first light-emitting control transistor T5 are arranged along the second direction H2, and the channel area T5A of the first light-emitting control transistor T5 and the channel area T6A of the second light-emitting control transistor T6 are arranged along the first direction H1.

Along the first direction H1, the channel area T3A of the driving transistor T3 and the channel area T7A of the electrode reset transistor T7 are located between the channel area T5A of the first light-emitting control transistor T5 and the channel area T6A of the second light-emitting control transistor T6. Along the second direction H2, the channel area T7A of the electrode reset transistor T7 and the channel area T3A of the driving transistor T3 are located on both sides of the channel area T5A of the first light-emitting control transistor T5. Among them, the drain T4D of the data writing transistor T4, the drain T5D of the first light-emitting control transistor T5, and the source T3S of the driving transistor T3 are connected, and the drain T3D of the driving transistor T3 and the drain T6D of the second light-emitting control transistor T6 are electrically connected, and the drain T7D of the electrode reset transistor T7 and the source T6S of the second light-emitting control transistor T6 are electrically connected.

In two adjacent driving circuit rows, a channel area T7A of an electrode reset transistor T7 of a driving circuit in a previous row is adjacent to a channel area T4A of a data writing transistor T4 of a driving circuit in a next row. The low-temperature polysilicon semiconductor layer LPoly is also provided with auxiliary lines PDUMMY, and the auxiliary lines PDUMMY are located in the column gaps DD, so as to ensure the process uniformity of LPoly during preparation.

Figure 30:
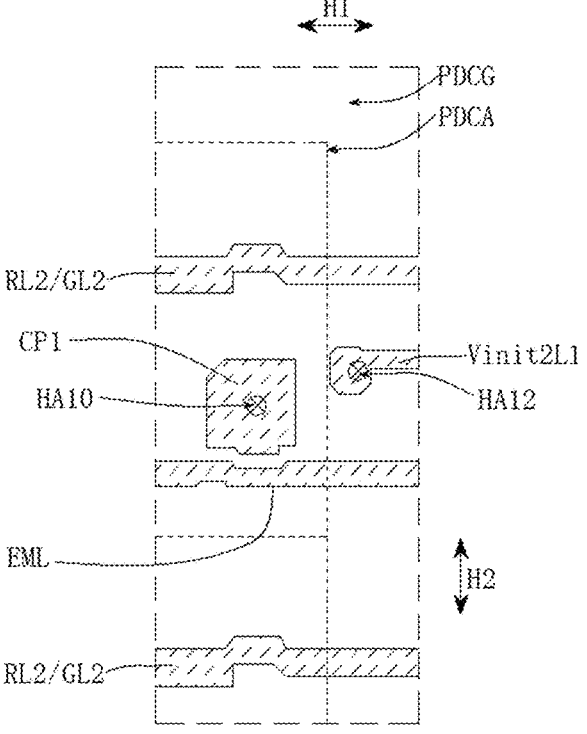
FIG. 30 is a schematic diagram of a local structure of a first gate layer in a driving circuit area in an implementation of the present disclosure.
Figure 31:
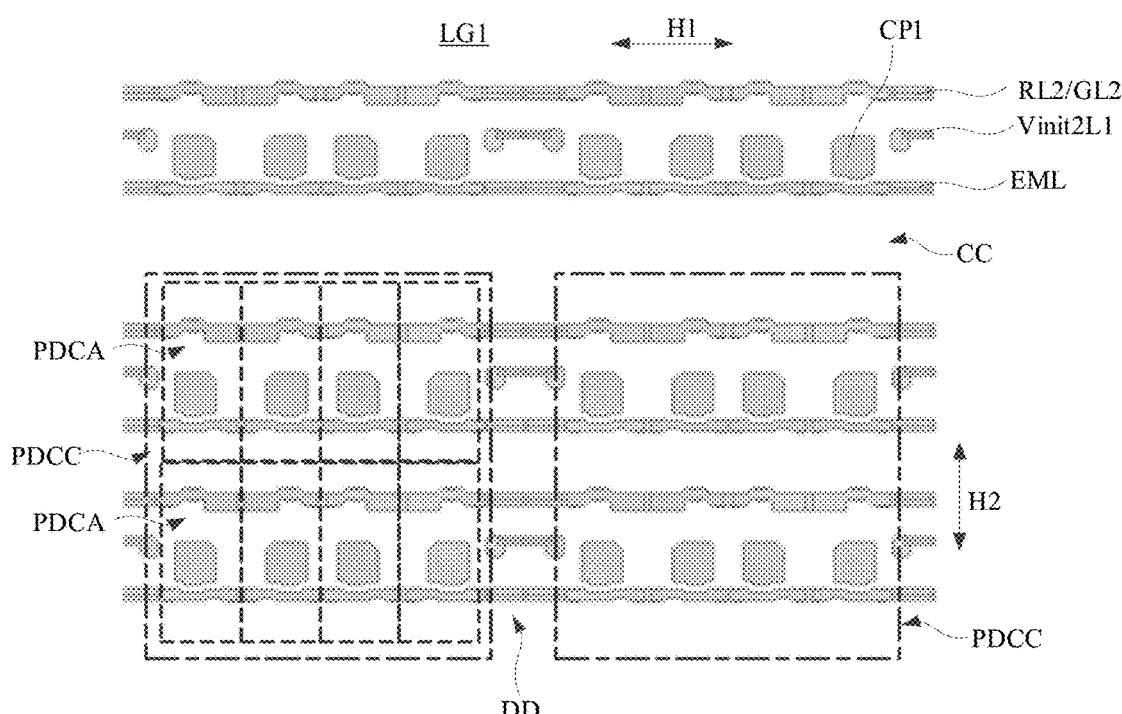
FIG. 31 is a schematic diagram of a local structure of a first gate layer in a display area in an implementation of the present disclosure.

Referring to FIG. 30, FIG. 31 and FIG. 40, the first gate layer LG1 is provided with the second scan line GL2, the enable signal line EML and the first electrode CP1 of the storage capacitor C. The second scan line GL2 extends along the first direction H1 and may be used for loading the second scan signal G2. The second scan line GL2 may overlap with the channel area T4A of the data writing transistor T4, and the overlapping part is reused as the gate of the data writing transistor T4. The second scan line GL2 may also overlap a channel area T7A of an electrode reset transistor T7 of a driving circuit in a previous row, and the overlapping part is reused as a gate of the electrode reset transistor T7 of the driving circuit in the previous row.

In this way, the electrode reset control line RL2 connected to a driving circuit in a previous row and the second scan line GL2 connected to a driving circuit in a next row are the same line. In this way, the electrode reset control signal Re2 for a driving circuit in a previous row and the second scan signal G2 for a driving circuit in a next row may be the same signal. The enable signal line EML extends along the first direction H1 and overlaps sequentially with the channel area T5A of the first light-emitting control transistor T5 and the channel area T6A of the second light-emitting control transistor T6 in order to be reused as the gate of the first light-emitting control transistor T5 and the gate of the second light-emitting control transistor T6. The enable signal line EML may be used to load the enable signal EM. The first electrode CP1 of the storage capacitor C overlaps with the channel area T3A of the driving transistor T3 to be reused as the gate of the driving transistor T3.

Figure 32:
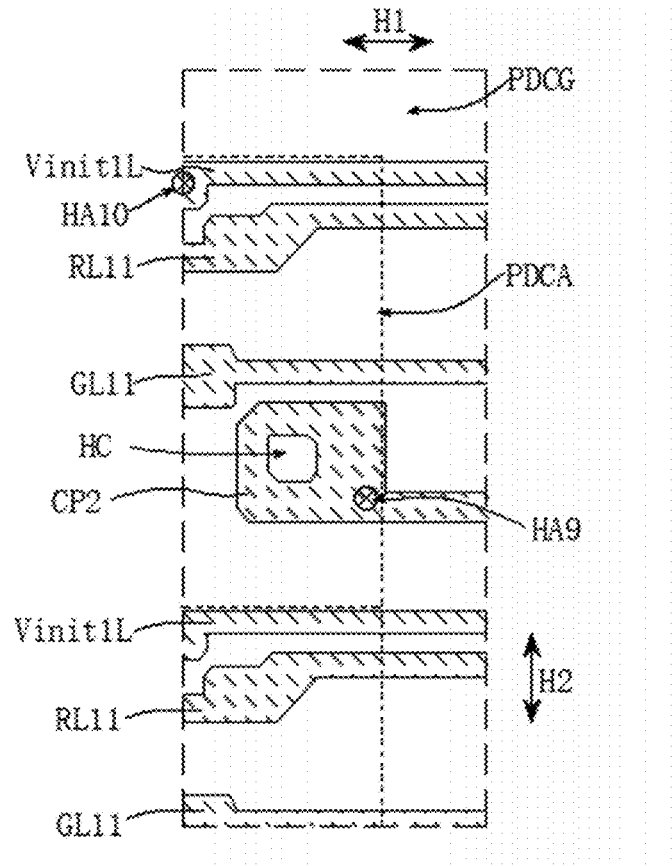
FIG. 32 is a schematic diagram of a local structure of a second gate layer in a driving circuit area in an implementation of the present disclosure.
Figure 33:
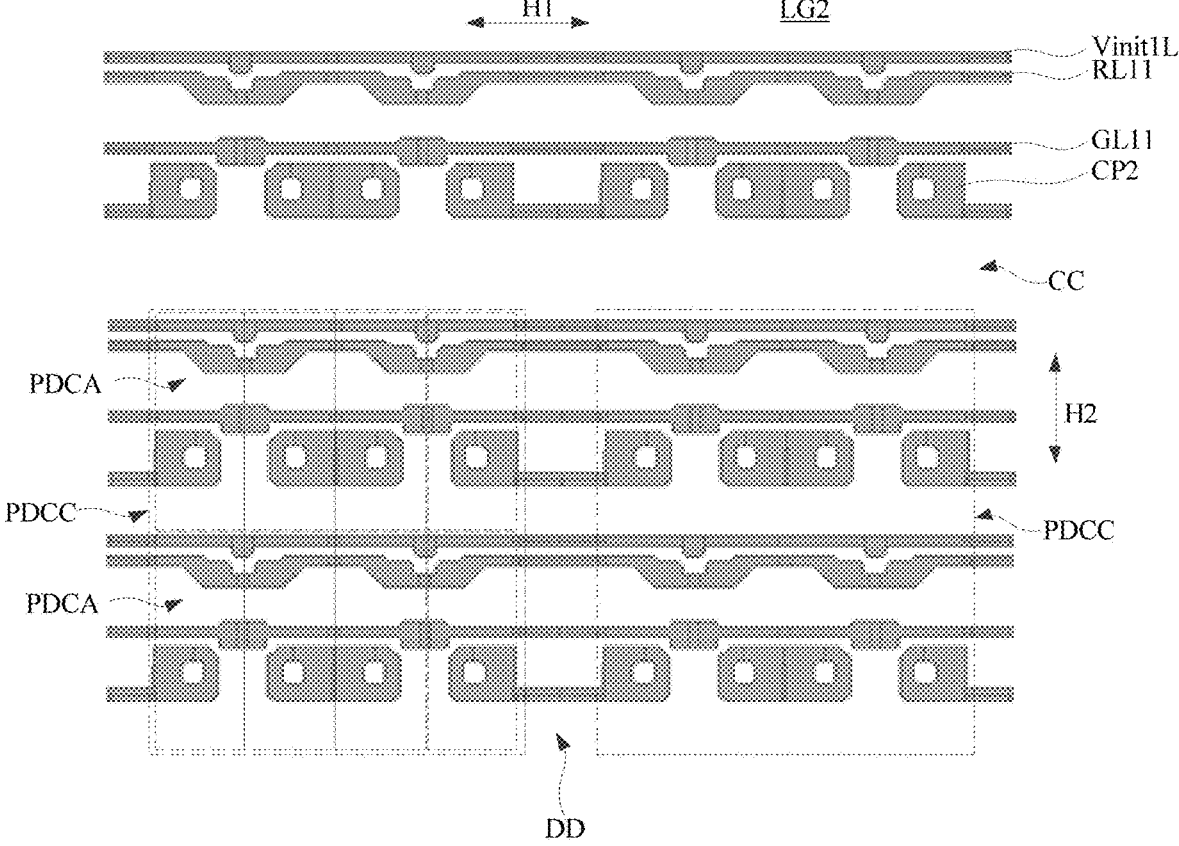
FIG. 33 is a schematic diagram of a local structure of a second gate layer in a display area in an implementation of the present disclosure.

Referring to FIG. 32, FIG. 33 and FIG. 40, the second gate layer LG2 is provided with a capacitor initialization voltage line Vinit1L, a lower capacitor reset control line RL11, a lower first scan line GL11 and a second electrode CP2 of the storage capacitor C. The capacitor initialization voltage line Vinit1L extends along the first direction H1, and may be used for loading the capacitor reset voltage Vinit1. The lower capacitor reset control line RL11 extends along the first direction H1 for loading the capacitor reset control signal Re1. The lower first scan line GL11 extends along the first direction H1 and is used for loading the first scan signal G1. The second electrode CP2 of the storage capacitor C overlaps the first electrode CP1 of the storage capacitor C, and an avoidance hole HC that exposes a part of the first electrode CP1 of the storage capacitor C is provided.

Figure 29:
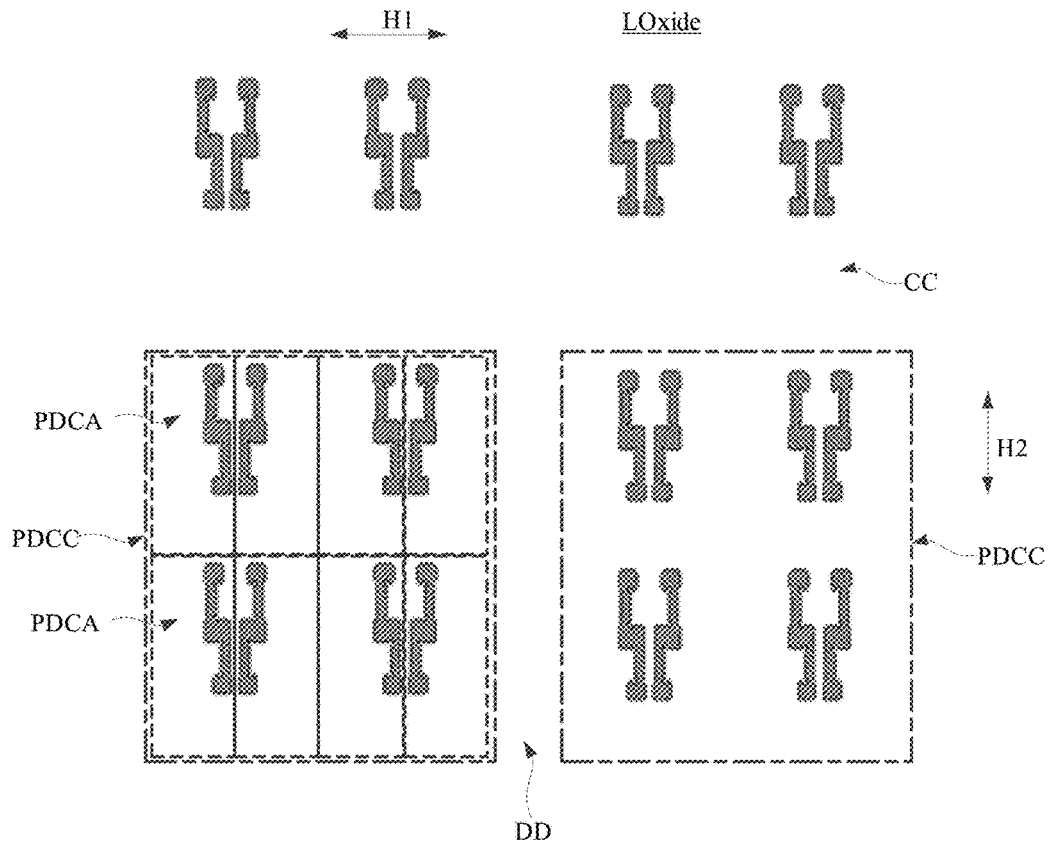
FIG. 29 is a schematic diagram of a local structure of a metal oxide semiconductor layer in a display area in an implementation of the present disclosure.

Referring to FIG. 27, FIG. 29 and FIG. 40, the metal oxide semiconductor layer LOxide is provided with sources, drains and channel areas of the capacitor reset transistor T1 and the threshold compensation transistor T2. Along the second direction H2, the channel area T1A of the capacitor reset transistor T1 is located on a side of the channel area T2A of the threshold compensation transistor T2 away from the channel area T3A of the driving transistor T3, and the channel area T2A of the threshold compensation transistor T2 and the channel area T5A of the first light-emitting control transistor T5 are located on both sides of the channel area T3A of the driving transistor T3. Along the first direction H1, the channel area T4A of a data writing transistor T4 and the channel area T1A of a capacitor reset transistor T1 of a driving circuit in a next row are located on both sides of the channel area T7A of an electrode reset transistor T7 of a driving circuit in a previous row. The drain T1D of the capacitor reset transistor T1 and the drain T2D of the threshold compensation transistor T2 are connected to each other.

The channel area T1A of the capacitor reset transistor T1 overlaps with the lower capacitor reset control line RL11, so that at least part of the overlapping part of the lower capacitor reset control line RL11 and the channel area T1A of the capacitor reset transistor T1 may be reused as the first gate of the capacitor reset transistor T1. The lower first scan line GL11 overlaps the channel area T2A of the threshold compensation transistor T2, so that at least a part of the overlapping part of the lower first scan line GL11 and the channel area T2A of the threshold compensation transistor T2 may be reused is the first gate of the threshold compensation transistor T2. In some implementations, the orthographic projection of the channel area T1A of the capacitor reset transistor T1 on the second gate layer is located within the lower capacitor reset control line RL11, so that the lower capacitor reset control line RL11 sufficiently shield light for the channel area T1A of the capacitor reset transistor T1. In some implementations, the orthographic projection of the channel area T2A of the threshold compensation transistor T2 on the second gate layer is located within the lower first scan line GL11, so that the lower first scan line GL11 sufficiently shield light for the channel area T2A of the threshold compensation transistor T2.

Figure 34:
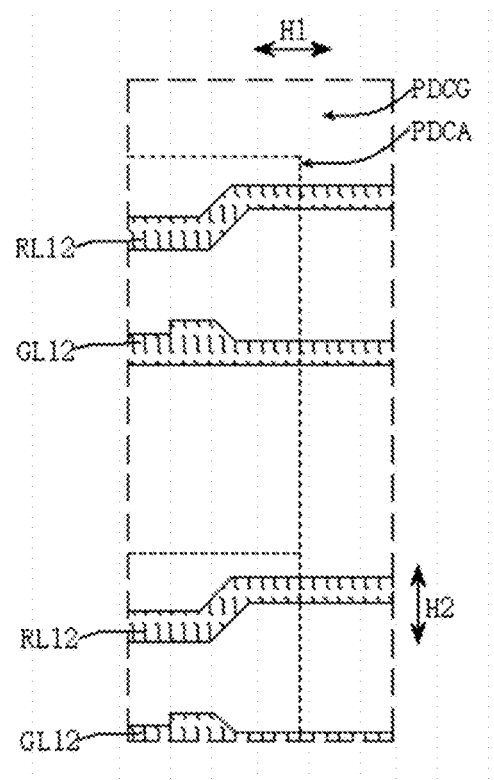
FIG. 34 is a schematic diagram of a local structure of a third gate layer in a driving circuit area in an implementation of the present disclosure.
Figure 35:
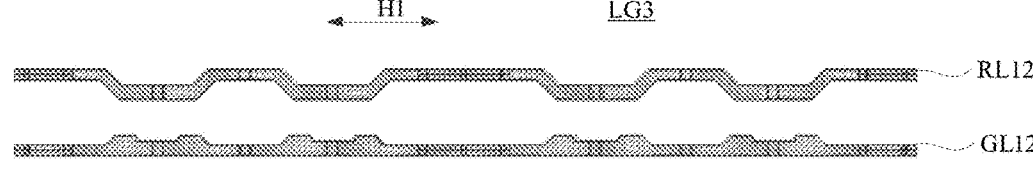
FIG. 35 is a schematic diagram of a local structure of a third gate layer in a display area in an implementation of the present disclosure.
Figure 35:
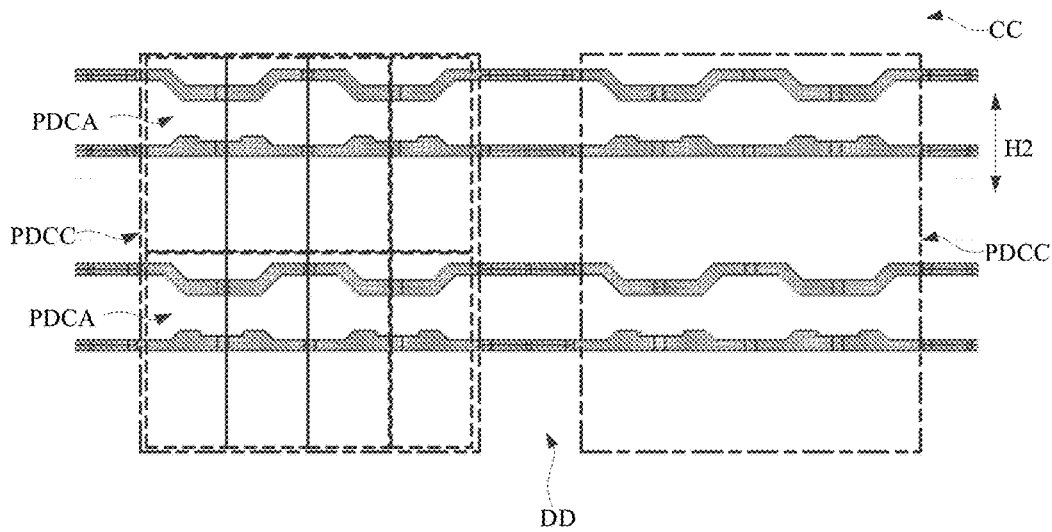

Referring to FIG. 34, FIG. 35 and FIG. 40, the third gate layer LG3 includes an upper capacitor reset control line RL12 and an upper first scan line GL12. The upper capacitor reset control line RL12 extends along the first direction H1 for loading the capacitor reset control signal Re1. The upper first scan line GL12 extends along the first direction H1 for loading the first scan signal G1. The upper capacitor reset control line RL12 overlaps with the channel area T1A of the capacitor reset transistor T1, and the overlapping part is used as the second gate of the capacitor reset transistor T1. The upper first scan line GL12 overlaps with the channel area T2A of the threshold compensation transistor T2, and the overlapping part is used as the second gate of the threshold compensation transistor T2. In this way, the gate of the capacitor reset transistor T1 includes the first gate and the second gate of the capacitor reset transistor T1; the gate of the threshold compensation transistor T2 includes the first gate and the second gate of the threshold compensation transistor T2.

Referring to FIG. 27, FIG. 30, FIG. 32, and FIG. 40, the low-temperature polysilicon semiconductor layer LPoly, the first gate layer LG1, the second gate layer LG2, and the metal oxide semiconductor layer LOxide may be electrically connected with the first source-drain metal layer through via holes. In implementations of the present disclosure, when two conductive film layers are connected by a via hole, the lower conductive film layer (the film layer close to the base substrate BP) has a lower via hole area aligned with the via hole position, and the upper conductive film layer (the film layer away from the base substrate BP) has an upper via hole area aligned with the via hole position. The upper via hole area of the upper conductive film layer is directly electrically connected with the lower via hole area of the lower conductive film layer through the via hole.

Referring to FIG. 27, the low-temperature polysilicon semiconductor layer LPoly may be provided with a first lower via hole area HA1 to a fifth lower via hole area HA5. The first lower via hole area HA1 is located at the source T4S of the data writing transistor T4. The second lower via hole area HA2 is located at the source T5S of the first light-emitting control transistor T5. The third lower via hole area HA3 is located at the drain T6D of the second light-emitting control transistor T6. The fourth lower via hole area HA4 is located at the source T7S of the electrode reset transistor T7. The fifth lower via hole area HA5 is located at the source T6S of the second light-emitting control transistor T6. The metal oxide semiconductor layer LOxide may be provided with a sixth lower via hole area HA6 to an eighth lower via hole area HA8. The sixth lower via hole area HA6 is located at the source T2S of the threshold compensation transistor T2. The seventh lower via hole area HA7 is located at the drain T2D of the threshold compensation transistor T2. The eighth lower via hole area HA8 is located at the source T1S of the capacitor reset transistor T1.

Referring to FIG. 30 and FIG. 32, the second electrode CP2 of the storage capacitor C is provided with a ninth lower via hole area HA9, and the first electrode CP1 of the storage capacitor C is provided with a tenth lower via hole area HA10. The tenth lower via hole area HA10 is located in the avoidance notch HC of the second electrode CP2 of the storage capacitor C. An eleventh lower via hole area HA11 may be provided in the capacitor initialization voltage line Vinit1L. In an implementation of the present disclosure, in a symmetrically arranged driving circuit group, two driving circuits are connected to the capacitance initialization voltage line Vinit1L through the same via hole.

In implementations of the present disclosure, the display panel is further provided with an electrode initialization voltage line, and the electrode initialization voltage line is arranged meandering along the first direction H1 as a whole, so as to load the electrode reset voltage Vinit2. In one implementation of the present disclosure, a part of the electrode initialization voltage line located between driving circuit islands PDCC may be bridged and routed through the first gate layer LG1, and the rest may be routed through the first source-drain metal layer LSD1. In this way, the second interconnect sections TR2 located in the first source-drain metal layer LSD1 may be arranged in a gap between two driving circuits.

In other words, referring to FIG. 30, FIG. 31, FIG. 36 and FIG. 37, the electrode initialization voltage line may include a second initialization line Vinit2L2 located in the first source-drain metal layer LSD1 and a first initialization line Vinit2L1 located in the first gate layer LG1. The first initialization line Vinit2L1 is located in the gap between driving circuit islands PDCC, and the second initialization line electrode Vinit2L2 is basically located in the driving circuit islands PDCC. An end of the first initialization line Vinit2L1 has a twelfth lower via hole area HA12, and an end of the second initialization line Vinit2L2 has a twelfth upper via hole area HB12 overlapping with the twelfth lower via hole area HA12. The twelfth lower via hole area HA12 is connected to the twelfth upper via hole area HB12 through a via hole. The second initialization line Vinit2L2 has a fourth upper via hole area HB4 overlapping with the fourth lower via hole area HA4, and the fourth lower via hole area HA4 and the fourth upper via hole area HB4 are connected through a via hole. Thus, the source T7S of the electrode reset transistor T7 is electrically connected to the electrode initialization voltage line. Certainly, in other implementations of the present disclosure, the entire electrode initialization voltage line may be arranged in the first source-drain metal layer LSD1.

Figure 36:
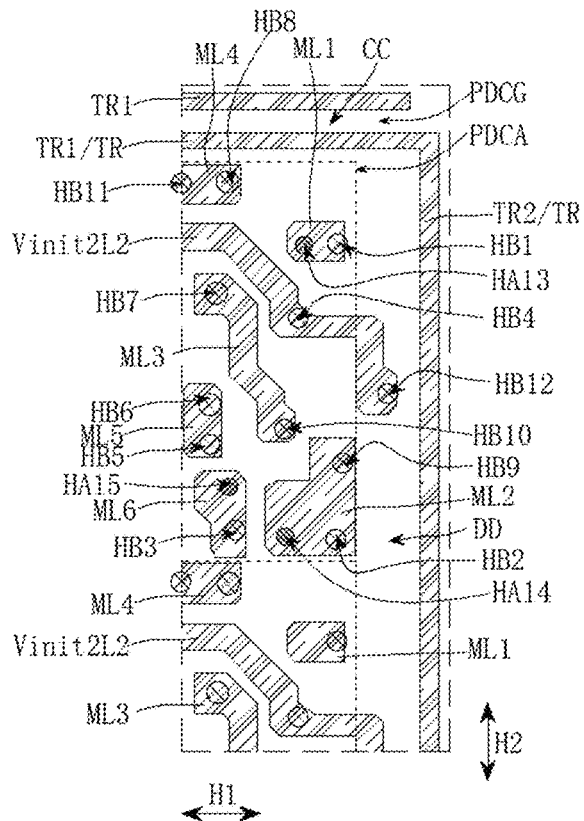
FIG. 36 is a schematic diagram of a local structure of a first source-drain metal layer in a driving circuit area in an implementation of the present disclosure.
Figure 37:
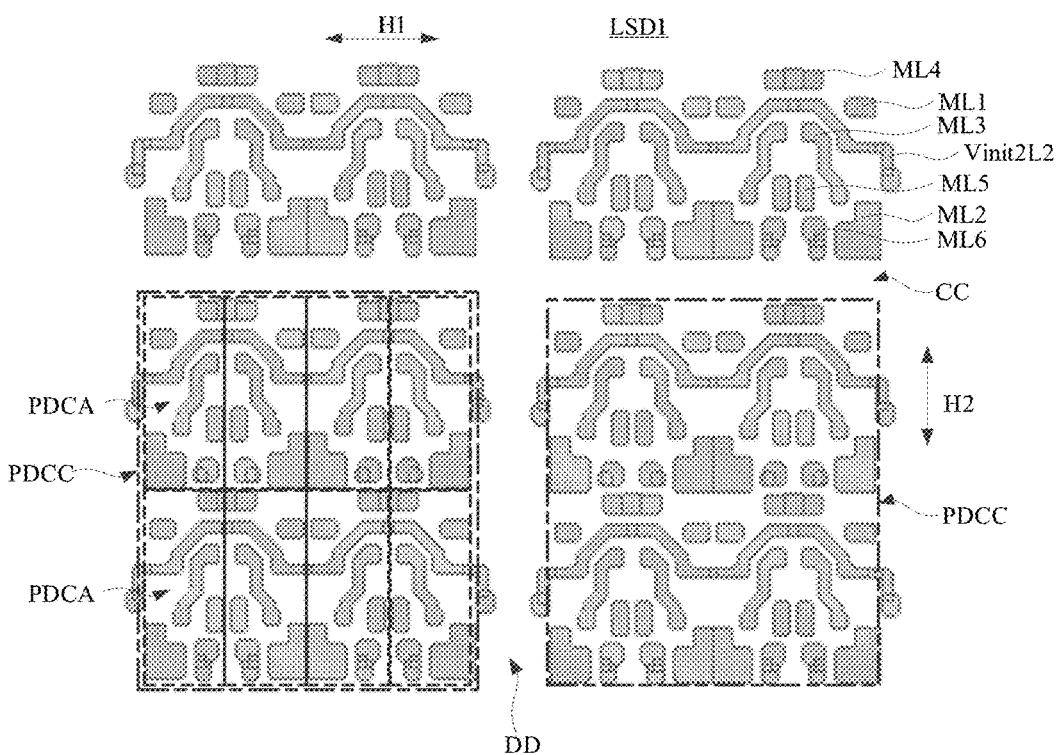
FIG. 37 is a schematic diagram of a local structure of a first source-drain metal layer in a display area in an implementation of the present disclosure.

Referring to FIG. 36 and FIG. 37, the first source-drain metal layer LSD1 is further provided with a first conductive structure ML1 to a sixth conductive structure ML6. The first conductive structure ML1 has a first upper via hole area HB1 and a thirteenth lower via hole area HA13. The first upper via hole area HB1 overlaps with the first lower via hole area HA1 and are connected through a via hole. The second source-drain metal layer LSD2 is provided with a data line DL extending along the second direction H2, and the data line DL is used for loading the driving data signal Da. The data line DL is provided with a thirteenth upper via hole area HB13 overlapping with the thirteenth lower via hole area HA13, and the thirteenth upper via hole area HB13 is connected to the thirteenth lower via hole area HA13 through a via hole. In this way, the source T4S of the data writing transistor T4 is connected to the data line DL through the first conductive structure ML1.

The second conductive structure ML2 has a second upper via hole area HB2, a ninth upper via hole area HB9 and a fourteenth lower via hole area HA14. The second upper via hole area HB2 overlaps with the second lower via hole area HA2 and is connected to the second lower via hole area HA2 through a via hole. The ninth upper via hole area HB9 overlaps with the ninth lower via hole area HA9 and is connected to the ninth lower via hole area HA9 through a via hole. The second source-drain metal layer LSD2 is provided with a power supply line VDDL extending along the second direction H2, and the power supply line VDDL is used for loading the power supply voltage VDD. The power line VDDL has a fourteenth upper via hole area HB14 overlapping with the fourteenth lower via hole area HA14, and the fourteenth upper via hole area HB14 is connected to the fourteenth lower via hole area HA14 through a via hole. In this way, the second electrode CP2 of the storage capacitor C, the power supply line VDDL and the source T5S of the first light-emitting control transistor T5 are electrically connected to each other through the second conductive structure ML2.

The third conductive structure ML3 has a tenth upper via hole area HB10 and a seventh upper via hole area HB7. The tenth upper via hole area HB10 overlaps with the tenth lower via hole area HA10 and is connected to the tenth lower via hole area HA10 through a via hole. The seventh upper via hole area HB7 overlaps with the seventh lower via hole area HA7 and is connected to the seventh lower via hole area HA7 through a via hole. In this way, the drain T1D of the capacitor reset transistor T1 and the drain T2D of the threshold compensation transistor T2 are electrically connected to the first electrode CP1 of the storage capacitor C (reused as the gate of the driving transistor T3) through the third conductive structure ML3.

The fourth conductive structure ML4 is provided with an eighth upper via hole area HB8 and an eleventh upper via hole area HB11. The eighth upper via hole area HB8 overlaps with the eighth lower via hole area HA8 and is connected to the eighth lower via hole area HA8 through a via hole. The eleventh upper via hole area HB11 overlaps with the eleventh lower via hole area HA11 and is connected to the eleventh lower via hole area HA11 through a via hole. In this way, the capacitor initialization voltage line Vinit1L is electrically connected to the source T1S of the capacitor reset transistor T1 through the fourth conductive structure ML4.

The fifth conductive structure ML5 has a fifth upper via hole area HB5 and a sixth upper via hole area HB6. The fifth upper via hole area HB5 overlaps with the fifth lower via hole area HA5 and is connected to the fifth lower via hole area HA5 through a via hole. The sixth upper via hole area HB6 overlaps with the sixth lower via hole area HA6 and is connected to the sixth lower via hole area HA6 through a via hole. In this way, the drain T3D of the driving transistor T3 is electrically connected to the source T2S of the threshold compensation transistor T2 through the fifth conductive structure ML5.

Figure 38:
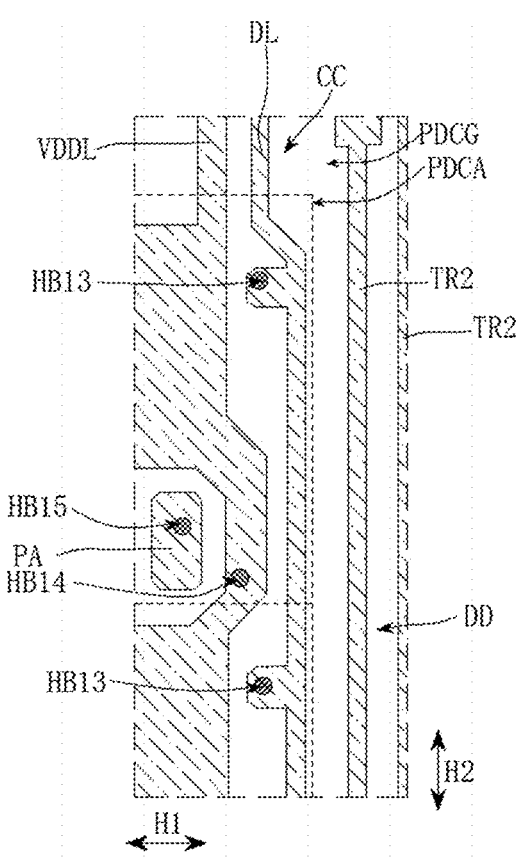
FIG. 38 is a schematic diagram of a local structure of a second source-drain metal layer in a driving circuit area in an implementation of the present disclosure.
Figure 39:
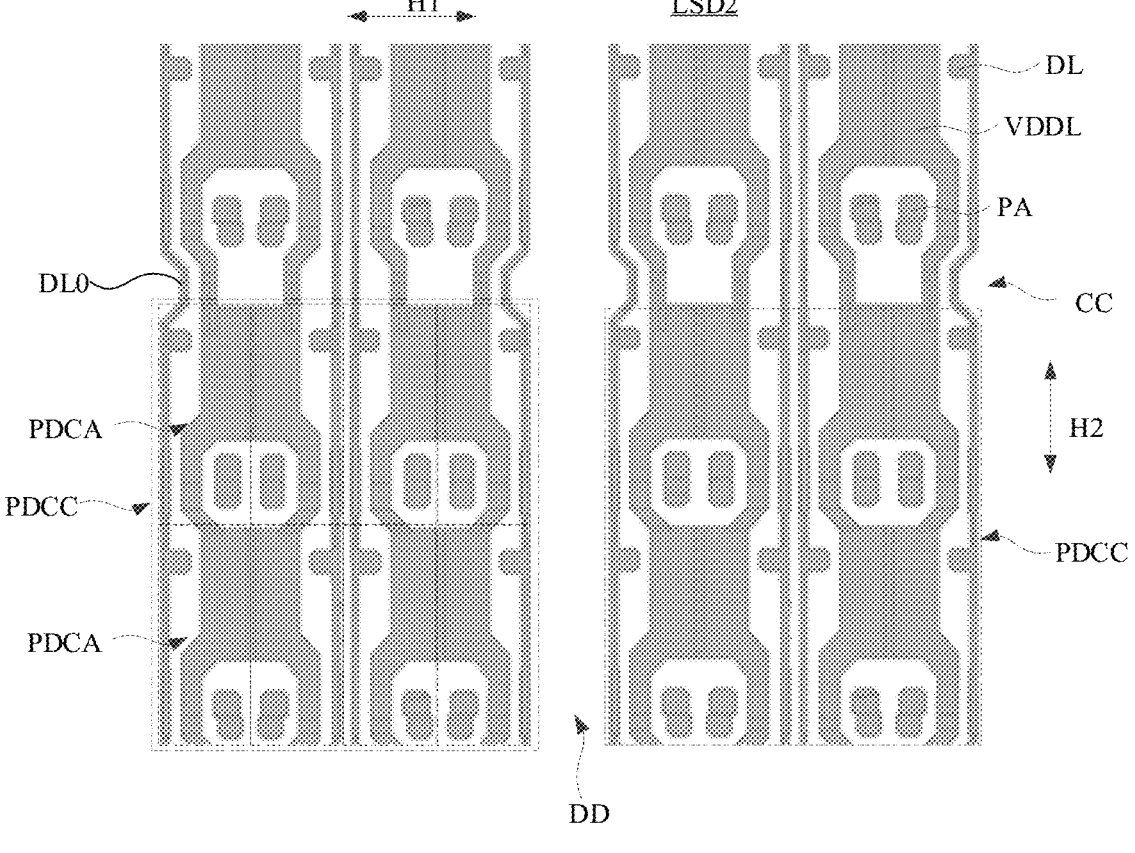
FIG. 39 is a schematic diagram of a local structure of a second source-drain metal layer in a display area in an implementation of the present disclosure.

The sixth conductive structure ML6 is provided with a third upper via hole area HB3 and a fifteenth lower via hole area HA15. The third upper via hole area HB3 overlaps with the third lower via hole area HA3 and is connected to the third lower via hole area HA3 through a via hole. Referring to FIG. 38 and FIG. 39, the second source-drain metal layer LSD2 is provided with an interconnect electrode PA, and the interconnect electrode PA is used for electrical connection with the pixel electrode of the sub-pixel. The interconnect electrode PA is provided with a fifteenth upper via hole area HB15 overlapping with the fifteenth lower via hole area HA15. The fifteenth lower via hole area HA15 is connected to the fifteenth upper via hole area HB15 through a via hole. In this way, the interconnect electrode PA is electrically connected to the drain T6D of the second light-emitting control transistor T6 through the sixth conductive structure ML6, so that the sub-pixel is electrically connected to the drain T6D of the second light-emitting control transistor T6.

Referring to FIG. 36, the first conductive structure ML1 and the fourth conductive structure ML4 are located on one side of the second initialization line Vinit2L2, and the second conductive structure ML2, the third conductive structure ML3, the fifth conductive structure ML5 and the sixth conductive structure ML6 are located on the other side of the second initialization line Vinit2L2.

Referring to FIG. 36, the first conductive structure ML1 to the sixth conductive structure ML6 of the driving circuit are located in a driving circuit area PDCA corresponding to the driving circuit. In some implementations, the rectangular area where the first conductive structure ML1 to the sixth conductive structure ML6 of the driving circuit are distributed may be used to define the driving circuit area PDCA corresponding to the driving circuit. In this way, T1 to T6 of the driving circuit are located in the driving circuit area PDCA corresponding driving circuit area, and T7 of the driving circuit is located in the driving circuit area PDCA corresponding to a driving circuit in a next row.

Figure 41:
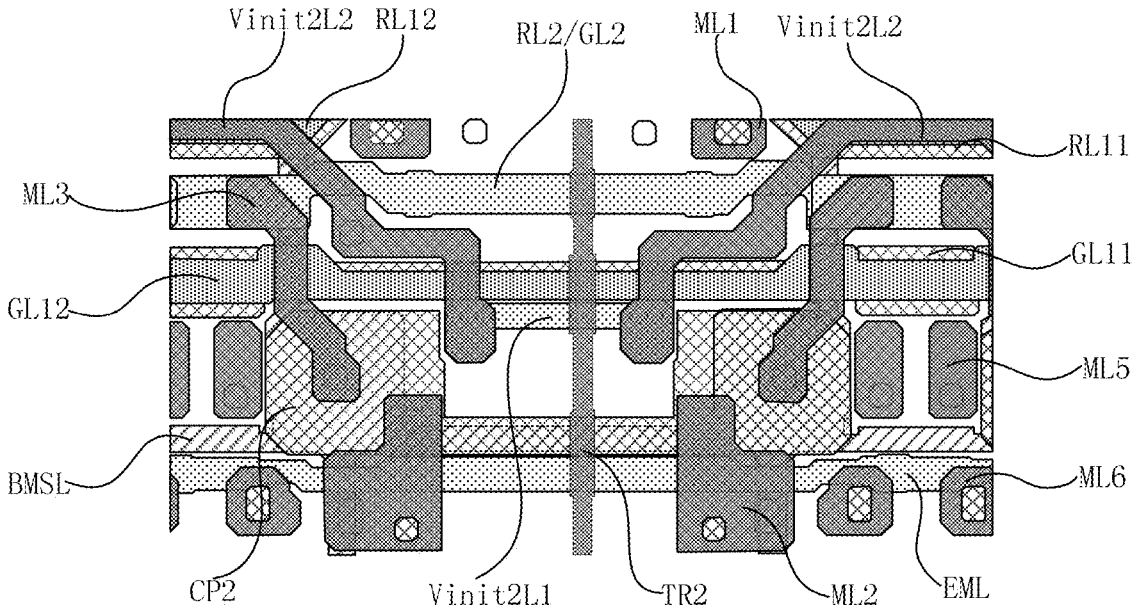
FIG. 41 is a structural layout of another area of the display panel in an implementation of the present disclosure.

Further referring to FIG. 37 and FIG. 41, it can be seen that the electrode initialization voltage line mentioned above include alternately connected first initialization line Vinit2L1 and second initialization line Vinit2L2. The first initialization line Vinit2L1 is arranged in the gate layer. The second initialization line Vinit2L2 is arranged in the first source-drain metal layer LSD1. The first initialization line Vinit2L1 and the second initialization line Vinit2L2 are connected through a via hole. A part of the second interconnect sections TR2 are arranged in the first source-drain metal layer LSD1, and the second interconnect sections TR2 overlap the first initialization line Vinit2L1 but do not overlap the second initialization line Vinit2L2.

In this way, the electrode initialization voltage line can avoid the second interconnect sections TR2 located in the first source-drain metal layer LSD1 through the first initialization line Vinit2L1. Further, the first initialization line Vinit2L1 spans the gap between the driving circuit islands PDCC along the first direction. Of course, in another implementation of the present disclosure, the electrode initialization voltage line may be arranged in the first source-drain metal layer LSD1; the second interconnect sections TR2 may be arranged in a conductive film layer above the first source-drain metal layer LSD1 (away from the base substrate BP), for example, arranged in the second source-drain metal layer LSD2.

Figure 42:
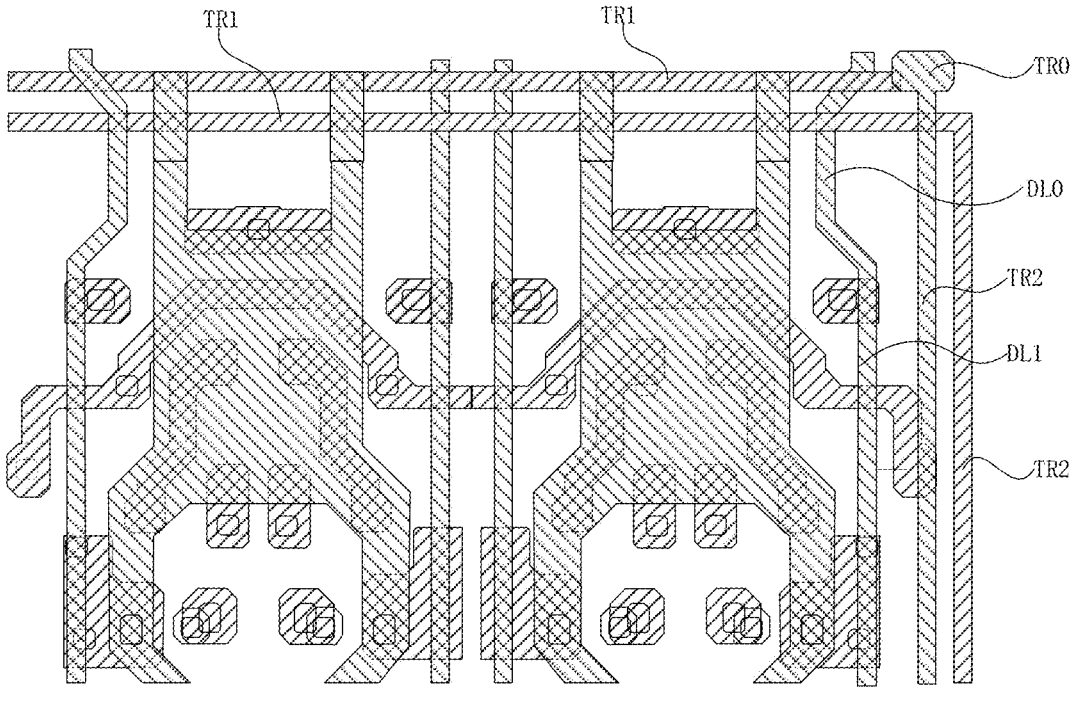
FIG. 42 is a structural layout of another area of the display panel in an implementation of the present disclosure.

It can be seen from FIG. 39 and FIG. 42 that all the first interconnect sections TR1 are arranged in the same layer as the first source-drain metal layer LSD1 or the gate layer, and at least part of the second interconnect sections TR2 are arranged in the same layer as the second source-drain metal layer LSD2. The second interconnect sections TR2 located in the second source-drain metal layer LSD2 are connected to the first interconnect sections TR1 through interconnectors. A part of a first data line DL1 adjacent to an interconnector is bent away from the interconnector to form an avoidance section DL0 which overlaps with a first interconnect section TR1.

Other implementations of the present disclosure will be readily apparent to those skilled in the art from consideration of the specification and practice of the invention disclosed herein. The present disclosure is intended to cover any modification, use or adaptation of the present disclosure, and such modifications, uses or adaptations follow the general principles of the present disclosure and include common knowledge or conventional technical means in the technical field not disclosed in implementations of the present disclosure. The specification and embodiments are to be considered exemplary only, with the true scope and spirit of the disclosure indicated by the appended claims.

What is claimed is:

1. A display panel, comprising a display area and a peripheral area at least partially surrounding the display area, wherein along a first direction, the display area of the display panel comprises a first display area and second display areas on both sides of the first display area;

wherein the display panel comprises:

a base substrate;

a driving circuit layer comprising a first source-drain metal layer and a second source-drain metal layer, wherein the first source-drain metal layer is arranged on a side of the base substrate, and the second source-drain metal layer is arranged on a side of the first source-drain metal layer away from the base substrate;

a pixel layer comprising a plurality of pixel groups, wherein the pixel groups comprise first sub-pixels, second sub-pixels and third sub-pixels with different colors;

a plurality of pads located in the peripheral area;

a plurality of data lines respectively electrically connected to a plurality of the first sub-pixels, a plurality of the second sub-pixels and a plurality of the third sub-pixels, wherein the plurality of data lines are located in the display area and extend along a second direction, the plurality of data lines comprise a plurality of first data lines located in the first display area and a plurality of second data lines located in the second display areas, and the plurality of first data line are electrically connected to the plurality of pads; and a plurality of interconnect lines located in the display area and electrically connected to the plurality of second data lines and the plurality of pads, wherein the plurality of interconnect lines comprises a plurality of first interconnect lines and a plurality of second interconnect lines, the first interconnect lines are connected to second data lines corresponding to the first sub-pixels and the third sub-pixels, and the second interconnect lines are connected to second data lines corresponding to the second sub-pixels;

wherein each of the plurality of interconnect lines comprises a first interconnect section extending along the first direction and a second interconnect section extending along a second direction and the first direction and the second direction intersect;

wherein at least one second interconnect section is arranged between two adjacent first data lines, second interconnect sections of all the first interconnect lines are arranged in a same layer as the first source-drain metal layer or the second source-drain metal layer, and at least a part of second interconnect sections of the second interconnect lines are arranged in a same layer as the first source-drain layer or the second source-drain layer;

wherein the driving circuit layer further comprises driving circuit islands distributed in an array, and each of the plurality of interconnect lines is arranged in a gap between the driving circuit islands.

2. The display panel according to claim 1, wherein the second interconnect sections of all the first interconnect lines are arranged in the same layer as the first source-drain metal layer, and the second interconnect sections of all the second interconnect lines are arranged in the same layer as the first source-drain metal layer.

3. The display panel according to claim 1, wherein the second interconnect sections of all the first interconnect lines are arranged in the same layer as the second source-drain metal layer, and the second interconnect sections of all the second interconnect lines are arranged in the same layer as the second source-drain metal layer.

4. The display panel according to claim 1, wherein the second interconnect sections of all the first interconnect lines are arranged in the same layer as the second source-drain metal layer, and the second interconnect sections of all the second interconnect lines are arranged in the same layer as the first source-drain metal layer.

5. The display panel according to claim 1, wherein the second interconnect sections of all the first interconnect lines are arranged in the same layer as the second source-drain metal layer, a part of second interconnect sections of the second interconnect lines are arranged in the same layer as the first source-drain metal layer, and another part of second interconnect sections of the second interconnect lines are arranged in the same layer as the second source-drain metal layer.

6. The display panel according to claim 5, wherein the second interconnect sections of the second interconnect lines are alternately distributed in the first source-drain metal layer and the second source-drain metal layer.

7. The display panel according to claim 5, wherein second interconnect sections of two second interconnect lines arranged symmetrically with respect to a central axis extending along the second direction are arranged in a same layer.

8. The display panel according to claim 1, wherein a plurality of adjacent first data lines are arranged as a plurality of first data line groups, a plurality of adjacent interconnect lines are arranged as a plurality of interconnect line groups, second interconnect sections of a plurality of adjacent interconnect lines form second interconnect section groups, and in at least part of the first display area, the first data line groups and the second interconnect section groups are alternately arranged one by one.

9. The display panel according to claim 8, wherein each of the second interconnect section groups comprises a second interconnect section of at least one first interconnect line and a second interconnect section of at least one second interconnect line, and the second interconnect section of the first interconnect line and the second interconnect section of the second interconnect line are arranged alternately.

10. The display panel according to claim 8, wherein each of the second interconnect section groups comprises a second interconnect section of at least one first interconnect line and second interconnect sections of at least two second interconnect lines, second interconnect section of all of the at least one first interconnect line is arranged in the same layer as the second source-drain metal layer, and a second interconnect section of at least one second interconnect line is arranged in the same layer as the first source-drain metal layer, a second interconnect section of at least one second interconnect line is arranged in the same layer as the second source-drain metal layer, the first sub-pixels are red sub-pixel pixels, the second sub-pixels are green sub-pixels, and the third sub-pixels are blue sub-pixels.

11. The display panel according to claim 1, wherein:
the display area is arranged symmetrically with respect to a central axis extending along the second direction,
in two adjacent second data lines, a second interconnect section corresponding to one of the two adjacent second data lines which is away from the central axis is arranged as farther away from the central axis as compared with a second interconnect section corresponding to the other one of the two adjacent second data lines which is close to the central axis.

12. The display panel according to claim 1, wherein the display area is arranged symmetrically with respect to a central axis extending along the second direction,
in two adjacent second data lines, a first interconnect section corresponding to one of the two adjacent second data lines which is away from the central axis is arranged as closer to a corresponding pad as compared with a first interconnect section corresponding to the other one of the two adjacent second data lines which is close to the central axis.

13. The display panel according to claim 1, wherein the plurality of first data lines located in the first display area are arranged in the first source-drain metal layer or the second source-drain metal layer.

14. The display panel according to claim 1, wherein the driving circuit layer further comprises a transistor layer, the transistor layer is arranged between the base substrate and the first source-drain metal layer, the transistor layer is provided with driving circuits, and the driving circuits comprise thin film transistors, and the interconnect lines do not overlap with the thin film transistors.

15. The display panel according to claim 14, wherein any one of the driving circuit islands comprises one or more driving circuit areas corresponding to the driving circuits one to one, at least part of thin film transistors of a driving circuit are arranged in a corresponding driving circuit area.

16. The display panel according to claim 15, wherein:
the second interconnect sections are arranged as a plurality of second interconnect section groups;
in any one of the second interconnect section groups, the second interconnect sections are arranged adjacently in sequence and are located between two adjacent driving circuit island columns; and any two adjacent second interconnect section groups are isolated by a driving circuit island column.

17. The display panel according to claim 1, wherein:
the transistor layer has a gate layer,
the driving circuit layer further comprises an electrode initialization voltage line extending along the first direction,
the electrode initialization voltage lines comprises a first initialization line and a second initialization line alternately connected, the first initialization line is arranged in the gate layer, and the second initialization line is arranged in the first source-drain metal layer,
a part of the second interconnect sections are arranged in the first source-drain metal layer, and second interconnect sections located in the first source-drain metal layer overlap with the first initialization line.

18. The display panel according to claim 17, wherein all of the first interconnect sections are arranged in the same layer as the first source-drain metal layer or the gate layer, at least part of the second interconnect sections are arranged in the same layer as the second source-drain metal layer, the second interconnect sections located in the second source-drain metal layer are connected to corresponding first interconnect sections through interconnectors, and a portion of one of the first data lines adjacent to a corresponding interconnector is bent away from the interconnector to form an avoidance section, and the avoidance section overlaps a corresponding first interconnect section.

19. A display device, comprising: a display panel;
wherein the display panel comprises a display area and a peripheral area at least partially surrounding the display area, and along a first direction, the display area of the display panel comprises a first display area and second display areas on both sides of the first display area;
wherein the display panel comprises:
a base substrate;
a driving circuit layer comprising a first source-drain metal layer and a second source-drain metal layer, wherein the first source-drain metal layer is arranged on a side of the base substrate, and the second source-drain metal layer is arranged on a side of the first source-drain metal layer away from the base substrate;
a pixel layer comprising a plurality of pixel groups, wherein the pixel groups comprise first sub-pixels, second sub-pixels and third sub-pixels with different colors;
a plurality of pads located in the peripheral area,
a plurality of data lines respectively electrically connected to a plurality of the first sub-pixels, a plurality of the second sub-pixels and a plurality of the third sub-pixels, wherein the plurality of data lines are located in the display area and extend along a second direction, the plurality of data lines comprise a plurality of first data limes located in the first display area and a plurality of second data lines located in the second display areas, and the plurality of first data line are electrically connected to the plurality of pads; and
a plurality of interconnect lines located in the display area and electrically connected to the plurality of second data lines and the plurality of pads, wherein the plurality of interconnect lines comprises a plurality of first interconnect lines and a plurality of second interconnect lines, the first interconnect lines are connected to second data lines corresponding to the first sub-pixels and the third sub-pixels, and the second interconnect lines are connected to second data lines corresponding to the second sub-pixels;
wherein each of the plurality of interconnect lines comprises a first interconnect section extending along the first direction and a second interconnect section extending along a second direction and the first direction and the second direction intersect;
wherein at least one second interconnect section is arranged between two adjacent first data lines, second interconnect sections of all the first interconnect lines are arranged in a same layer as the first source-drain metal layer or the second source-drain metal layer, and at least a part of second interconnect sections of the second interconnect lines are arranged in a same layer as the first source-drain layer or the second source-drain layer;

wherein the driving circuit layer further comprises driving circuit islands distributed in an array, and each of the plurality of interconnect lines is arranged in a gap between the driving circuit islands.

\* \* \* \* \*